United States Patent
Shimizu

(10) Patent No.: US 7,327,007 B2
(45) Date of Patent: Feb. 5, 2008

(54) SEMICONDUCTOR DEVICE WITH HIGH BREAKDOWN VOLTAGE

(75) Inventor: Kazuhiro Shimizu, Tokyo (JP)

(73) Assignee: Mitsubishi Denki Kabushiki Kaisha, Chiyoda-Ku, Tokyo (JP)

(*) Notice: Subject to any disclaimer, the term of this patent is extended or adjusted under 35 U.S.C. 154(b) by 0 days.

(21) Appl. No.: 11/002,803

(22) Filed: Dec. 3, 2004

(65) Prior Publication Data
US 2005/0194656 A1    Sep. 8, 2005

(30) Foreign Application Priority Data
Mar. 3, 2004  (JP) .............................. 2004-058883

(51) Int. Cl.
H01L 23/58     (2006.01)
H01L 29/00     (2006.01)

(52) U.S. Cl. ................ 257/487; 257/488; 257/491; 257/492; 257/493; 257/500; 257/E29.008; 257/329.009

(58) Field of Classification Search ................ 257/488, 257/491, 492, 493, 338, 339, 369, 372, 378, 257/487, 500
See application file for complete search history.

(56) References Cited

U.S. PATENT DOCUMENTS

| | | | |
|---|---|---|---|
| 4,292,642 A | | 9/1981 | Appels et al. |
| 5,153,697 A | * | 10/1992 | Mosher et al. ............... 257/296 |
| 5,455,436 A | | 10/1995 | Cheng |
| 5,455,439 A | | 10/1995 | Terashima et al. |
| 5,894,156 A | | 4/1999 | Terashima et al. |
| 6,124,628 A | | 9/2000 | Fujihira et al. |
| 6,194,761 B1 | | 2/2001 | Chiozzi et al. |
| 6,198,139 B1 | * | 3/2001 | Ishida ......................... 257/372 |
| 6,376,891 B1 | * | 4/2002 | Nagatani et al. ............ 257/492 |
| 2002/0017683 A1 | * | 2/2002 | Jeon ............................ 257/339 |

FOREIGN PATENT DOCUMENTS

| | | |
|---|---|---|
| JP | 2-248078 | 10/1990 |
| JP | 5-190693 | 7/1993 |
| JP | 9-55498 | 2/1997 |
| JP | 9-283716 | 10/1997 |
| JP | 10-4143 | 1/1998 |
| JP | 2002-324848 A | 11/2002 |

OTHER PUBLICATIONS

Korean Office Action, dated Aug. 17, 2006, with English-language translation.
German Office Action dated Jun. 28, 2007 (with English Translation).

* cited by examiner

*Primary Examiner*—Evan Pert
(74) *Attorney, Agent, or Firm*—Buchanan Ingersoll & Rooney PC

(57) ABSTRACT

A technique is provided which allows easy achievement of a semiconductor device with desired breakdown voltage. In a high-potential island region defined by a p impurity region, an n+ impurity region is formed in an n− semiconductor layer, and first field plates and second field plates are formed in multiple layers above the n− semiconductor layer between the n+ impurity region and the p impurity region. The second field plates in the upper layer are located above spaces between the first field plates in the lower layer, over which an interconnect line passes. One of the second field plates which is closest to the p impurity region has a cut portion under the interconnect line, and an electrode is spaced between the first field plates located under the cut portion.

18 Claims, 28 Drawing Sheets

F I G . 1 3
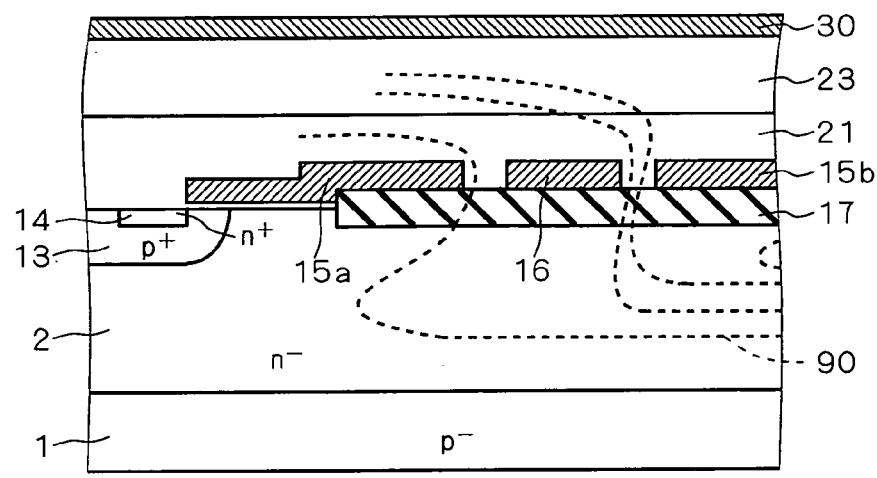
F I G . 1 4
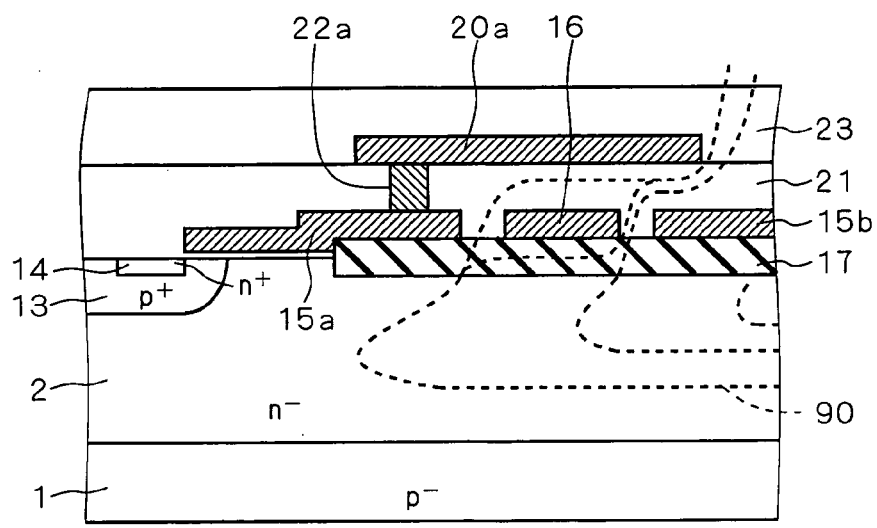

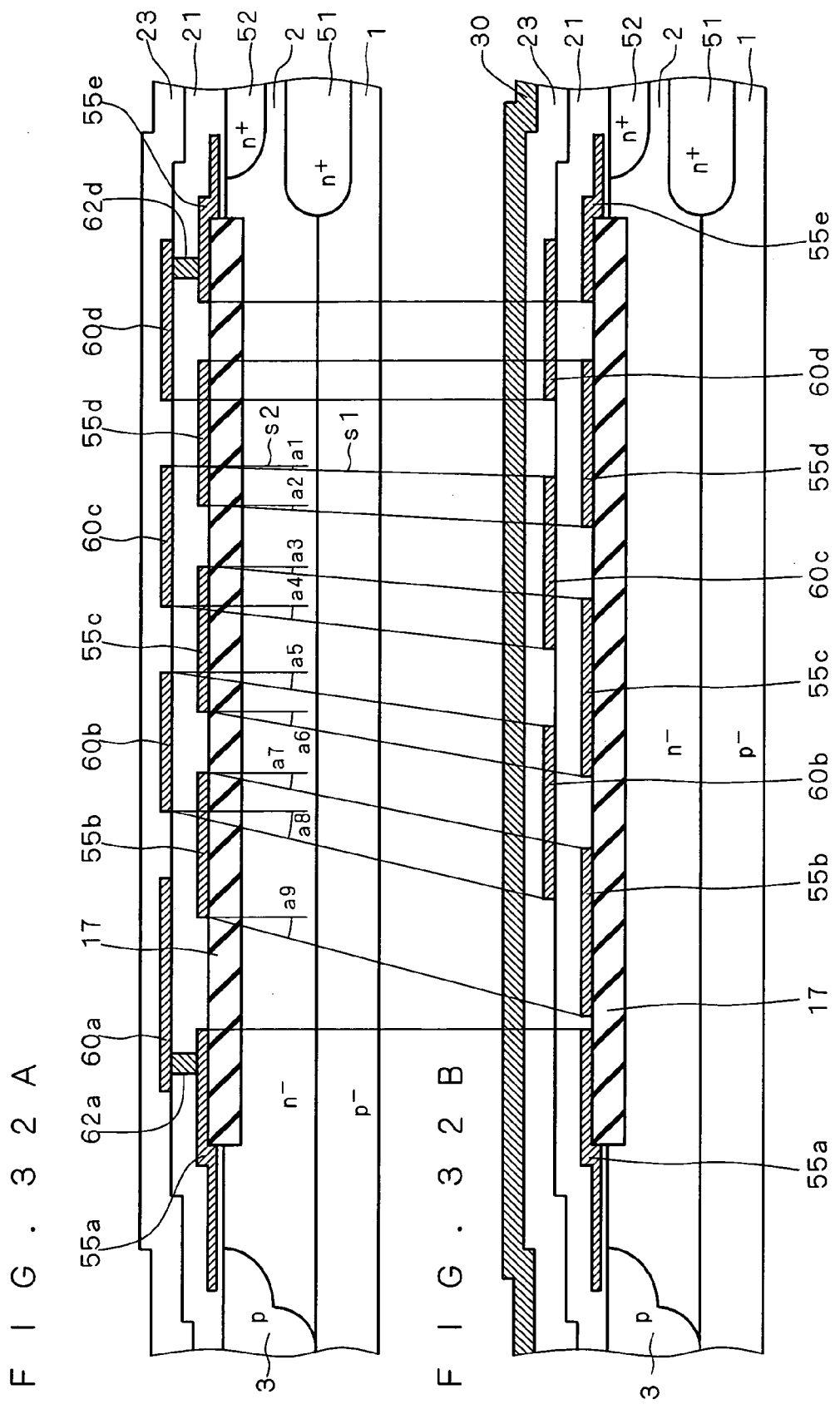

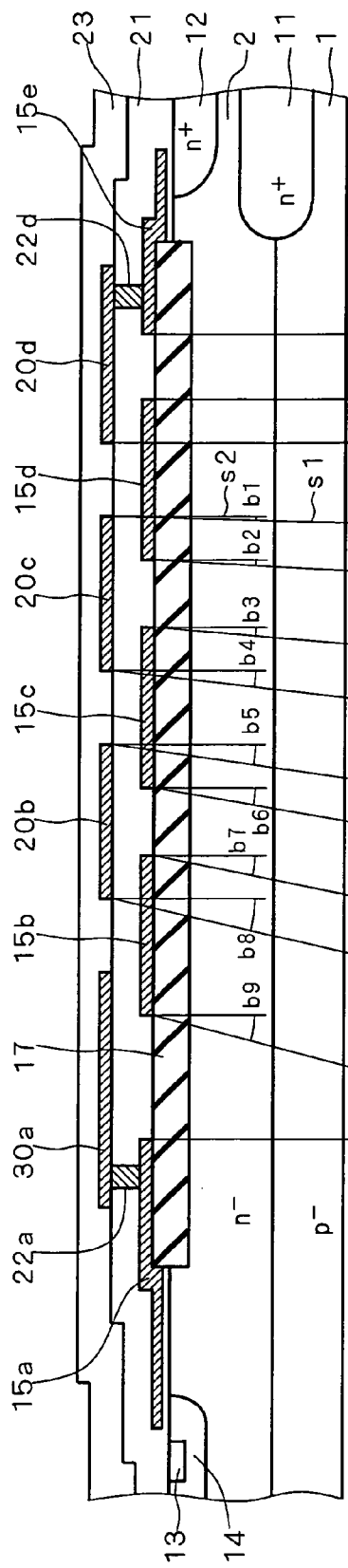
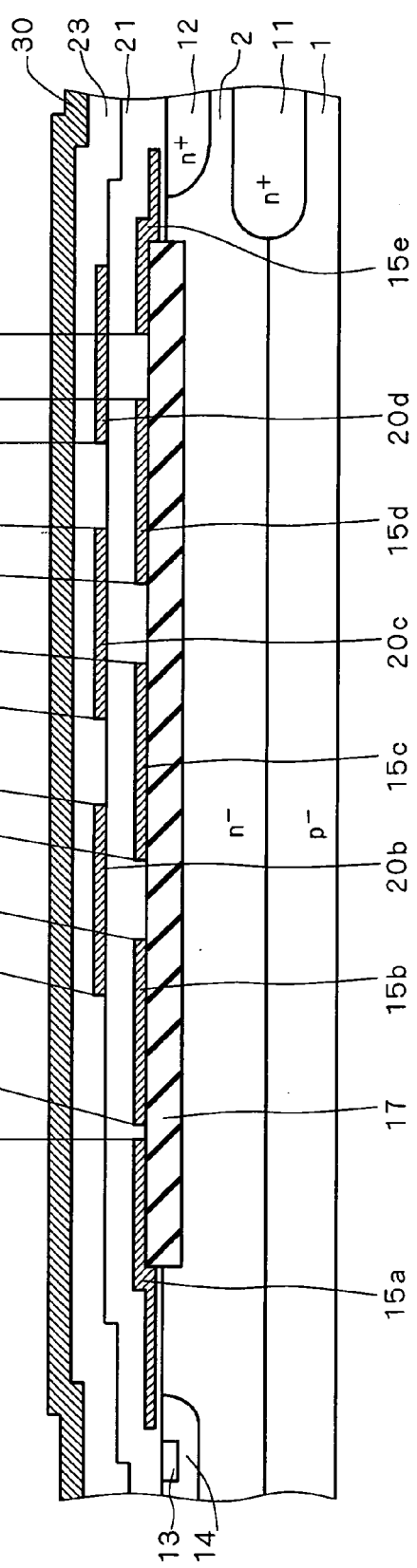
F I G. 3 3 A
F I G. 3 3 B

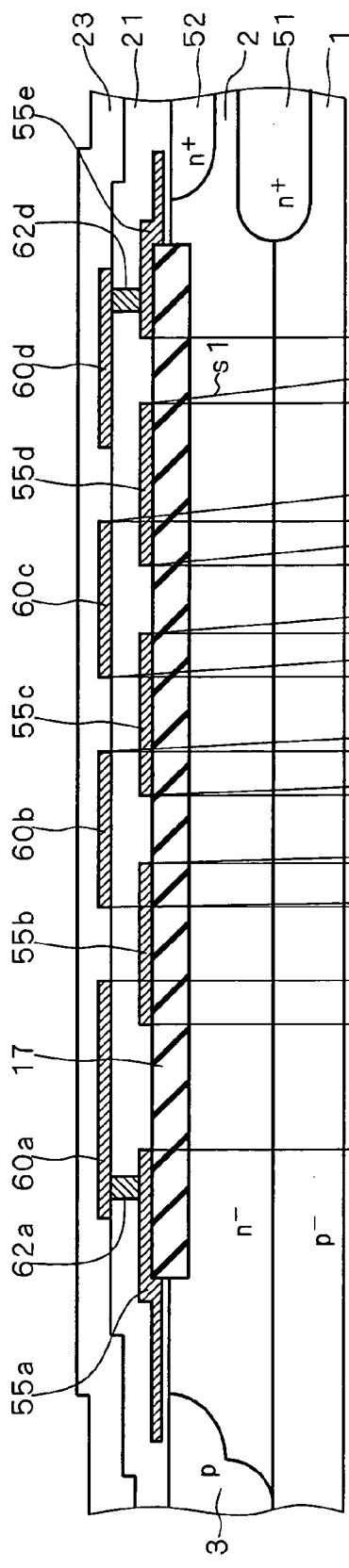
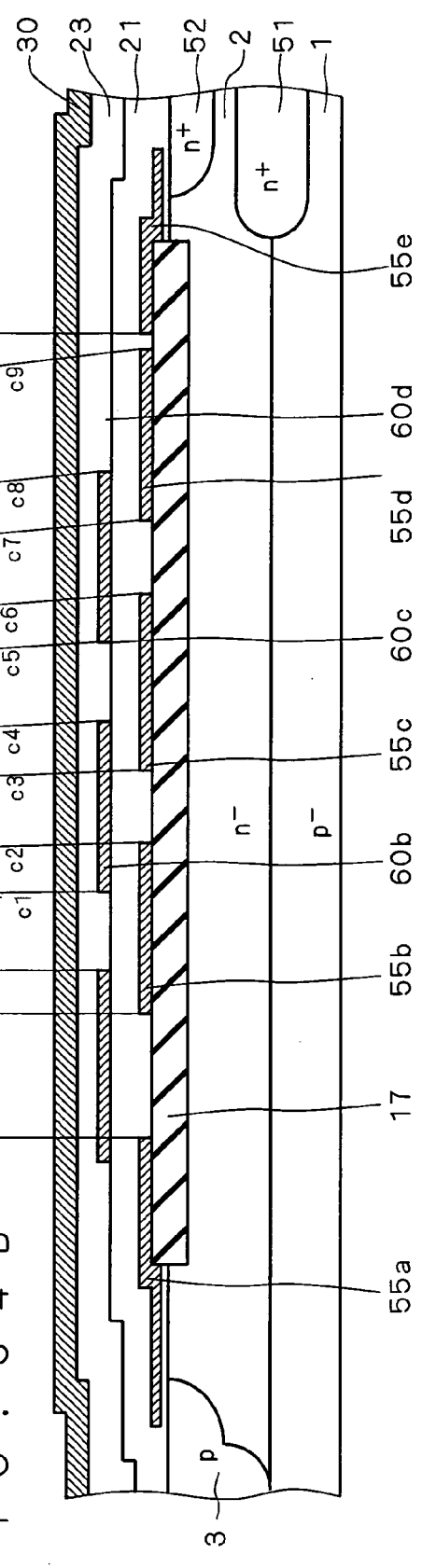
FIG. 34A
FIG. 34B

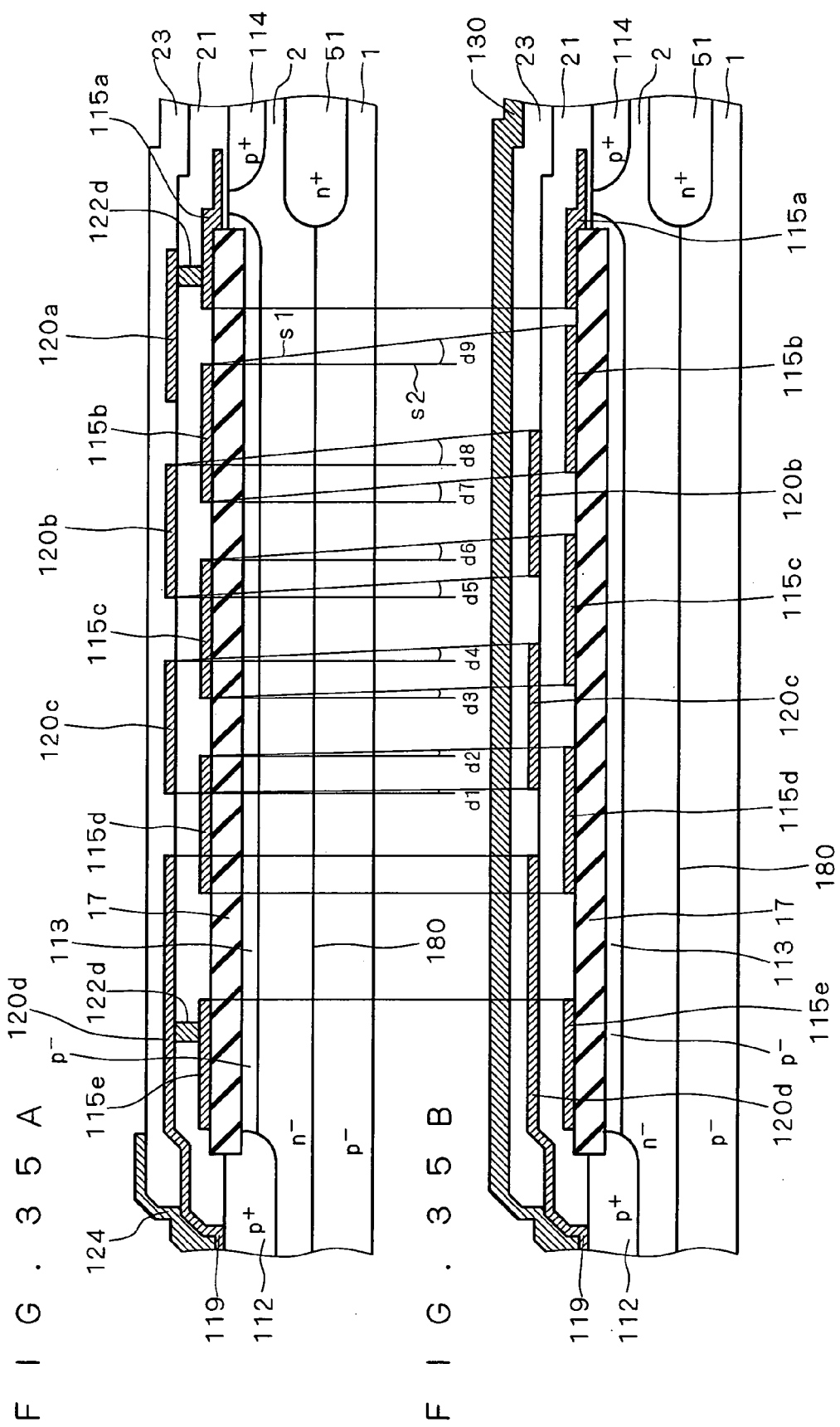

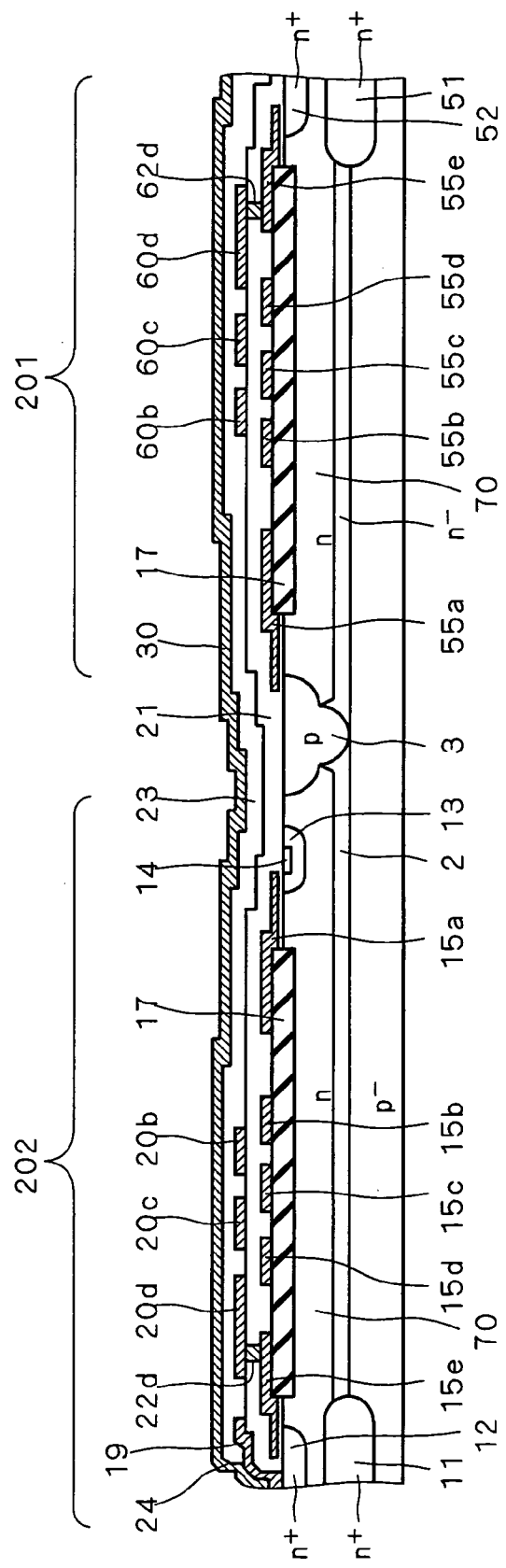

F I G . 4 1
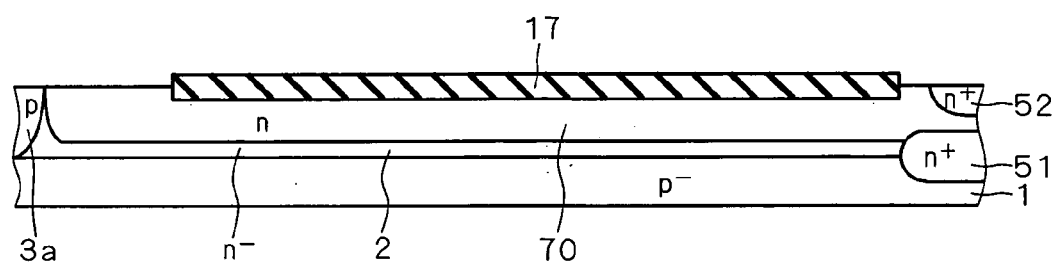
F I G . 4 2
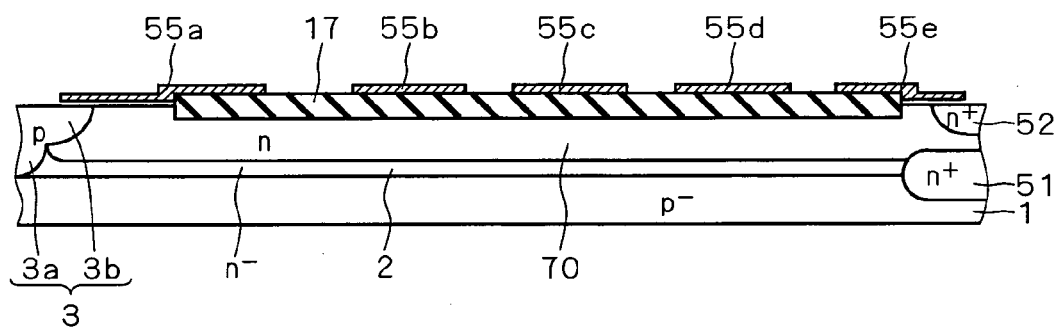

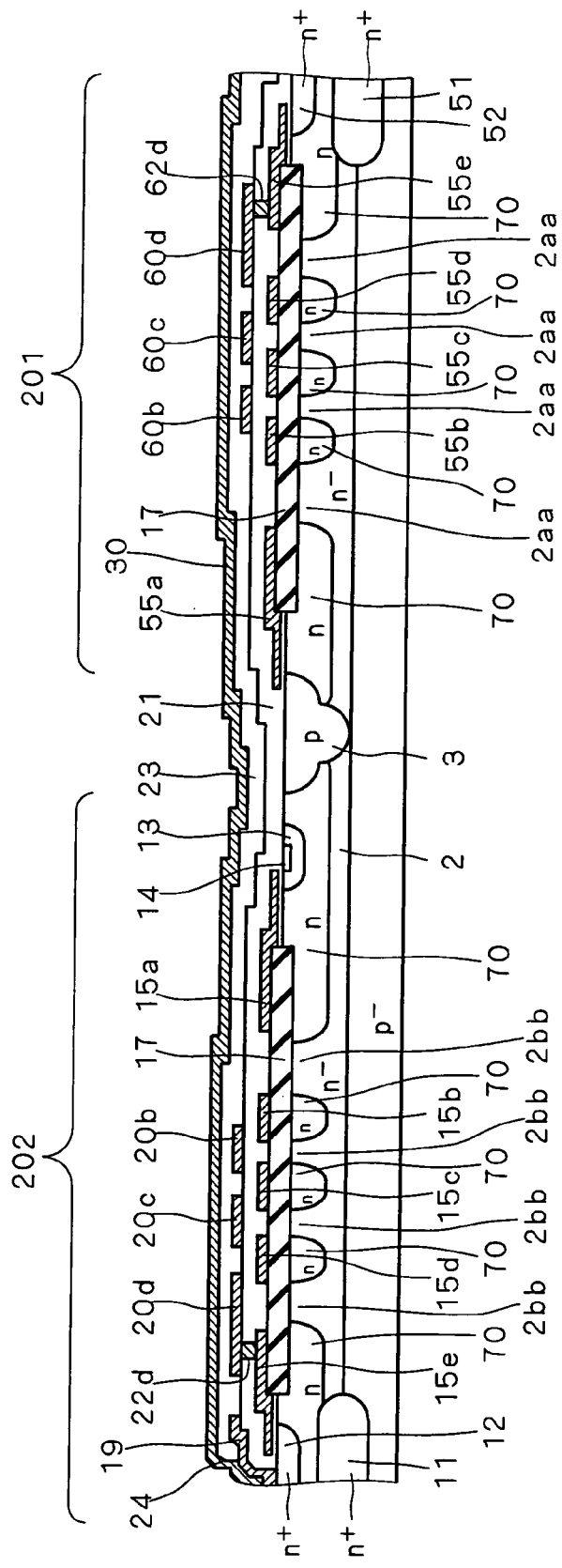

SEMICONDUCTOR DEVICE WITH HIGH BREAKDOWN VOLTAGE

BACKGROUND OF THE INVENTION

1. Field of the Invention

The present invention relates to a semiconductor device, and in particular to a high voltage IC (hereinafter referred to as an "HVIC").

2. Description of the Background Art

Conventionally, there are techniques proposed for implementing HVICs using the RESURF (reduced surface field) effect. For example in the technique described in Japanese Patent Application Laid-Open No. 9-283716 (1997), the RESURF effect is used to achieve high breakdown voltage of a level shifting circuit which converts signal levels from low potential to high potential.

More about the RESURF effect is described in, for example, U.S. Pat. No. 4,292,642, and some HVICs are disclosed in Japanese Patent Application Laid-Open Nos. 9-55498 (1997) and 2-248078 (1990). Further, Japanese Patent Application Laid-Open No. 5-190693 (1993) discloses a technique for forming, in multiple layers, field plates which are isolated from the surroundings so that the electric field at the surface of a semiconductor substrate can be stabilized by capacitive coupling between the field plates.

Since in the conventional HVICs, interconnect lines applied with a high potential of several hundred volts are located above a semiconductor substrate, there is a possibility of local electric field concentration occurring due to the influence of potentials of those interconnect lines, which can cause a decrease in breakdown voltage of a semiconductor device. Thus, it can be difficult to achieve a semiconductor device with desired breakdown voltage.

Further, an epitaxial layer, which is commonly used for improvement in breakdown voltage by using the RESURF effect, can easily vary in impurity concentration and thickness and thus has difficulty in satisfying the RESURF condition. From this also, it can be difficult to achieve a semiconductor device with desired breakdown voltage.

SUMMARY OF THE INVENTION

An object of the present invention is to provide a technique that allows easy achievement of a semiconductor device with desired breakdown voltage.

A first semiconductor device according to the present invention includes a semiconductor substrate of a first conductivity type, a semiconductor layer of a second conductivity type, a first impurity region of the first conductivity type, a semiconductor element, and a MOS transistor. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The semiconductor element is provided in the semiconductor layer outside the predetermined region. The MOS transistor is provided in the semiconductor layer within the predetermined region. The MOS transistor includes a second impurity region of the second conductivity type provided in the upper surface of the semiconductor layer within the predetermined region and having a higher impurity concentration than the semiconductor layer; and a drain electrode electrically connected to the second impurity region. The first semiconductor device according to the present invention further includes first through third insulation films, a plurality of first and second field plates, and an interconnect line. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the drain electrode and the semiconductor element. One of the plurality of first field plates which is closest to the first impurity region is a gate electrode of the MOS transistor. The plurality of second field plates respectively are provided above spaces between the plurality of first field plates. One of the plurality of second field plates which is closest to the gate electrode has a cut portion under the interconnect line. In one of the spaces between the plurality of first field plates which is located under the cut portion, an electrode is provided apart from the plurality of first field plates.

When a potential higher than that applied to the first impurity region is applied to the semiconductor layer within the predetermined region, a reverse voltage is applied to a pn junction formed by the first impurity region and that semiconductor layer, and the semiconductor layer in which the MOS transistor is provided is covered with a depletion layer. This results in improved breakdown voltage of the device.

Also, when a potential higher than that applied to the gate electrode is applied to the second impurity region and the interconnect line, capacitive coupling causes a potential difference between the second field plate which is closest to the gate electrode, and the interconnect line. Since in the present invention, the second field plate which is closest to the gate electrode has a cut portion under the interconnect line, it is possible to prevent dielectric breakdown of the third insulation film caused by the potential difference between that second field plate and the interconnect line.

Further in the present invention, an electrode is spaced between the first field plates under the cut portion of the second field plate which is closest to the gate electrode. Thus, even if the second field plate which is closest to the gate electrode has the cut portion, electric field concentration caused in the vicinity of the upper surface of the semiconductor layer by the potential of the interconnect line can be reduced because capacitive coupling of the electrode to the first field plates and the semiconductor layer allows the creation of equipotential surfaces between the electrode and the first field plates, and because of the electrostatic shielding effect of the electrode. As a result, a semiconductor device with desired breakdown voltage can easily be achieved.

A second semiconductor device according to the present invention includes a semiconductor substrate of a first conductivity type, a semiconductor layer of a second conductivity type, a first impurity region of the first conductivity type, first and second semiconductor elements, a second impurity region of the second conductivity type having a higher impurity concentration than the semiconductor layer, first through third insulation films, a plurality of first and second field plates, and an interconnect line. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The first semiconductor element is provided in the semiconductor layer within the predetermined region. The second impurity region is provided in the upper surface of the semiconductor layer between the first semiconductor element and the first impurity region, within the predetermined region. The second semiconductor element is provided in the semiconductor layer outside the predetermined region. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the first semiconductor element and the second semiconductor element. The plurality of second field plates respectively are provided above spaces between the plurality of first field plates. One of the plurality of second field plates which is closest to the first impurity region has a cut portion under the interconnect line. In one of the space between the plurality of first field plates which is located under the cut portion, an electrode is provided apart from the plurality of first field plates.

When a potential higher than that applied to the first impurity region is applied to the semiconductor layer within the predetermined region, a reverse voltage is applied to a pn junction formed by the first impurity region and that semiconductor layer, and a depletion layer is provided in the semiconductor layer. This results in the first semiconductor element being surrounded by the depletion layer, thereby improving the breakdown voltage of the device.

Also, when a potential higher than that applied to the first impurity region is applied to the second impurity region and the interconnect line, capacitive coupling causes a potential difference between the second field plate which is closest to the first impurity region and the interconnect line. Since in the present invention, the second field plate which is closest to the first impurity region has a cut portion under the interconnect line, it is possible to prevent dielectric breakdown of the third insulation film caused by the potential difference between that second field plate and the interconnect line.

Further in the present invention, an electrode is spaced between the first field plates under the cut portion of the second field plate which is closest to the first impurity region. Thus, even if the second field plate which is closest to the first impurity region has the cut portion, electric field concentration caused in the vicinity of the upper surface of the semiconductor layer by the potential of the interconnect line can be reduced because capacitive coupling of the electrode to the first field plates and the semiconductor layer allows the creation of equipotential surfaces between the electrode and the first field plates, and because of the electrostatic shielding effect of the electrode. As a result, a semiconductor device with desired breakdown voltage can easily be achieved.

A third semiconductor device according to the present invention includes a semiconductor substrate of a first conductivity type, a semiconductor layer of a second conductivity type, a first impurity region of the second conductivity type having a higher impurity concentration than the semiconductor layer, a second impurity region of the first conductivity type, a semiconductor element, and a MOS transistor. The semiconductor layer is provided on the semiconductor substrate. The first impurity region is provided in an upper surface of the semiconductor layer to define a predetermined region in the semiconductor layer. The second impurity region is provided in the semiconductor layer, extending from the upper surface of said semiconductor layer to an interface with the semiconductor layer, within the predetermined region. The semiconductor element is provided in the semiconductor layer outside the predetermined region. The MOS transistor is provided in the semiconductor layer within the predetermined region. The MOS transistor includes a third impurity region of the first conductivity type provided in the upper surface of the semiconductor layer between the first impurity region and the second impurity region, within the predetermined region; and a drain electrode electrically connected to the third impurity region. The third semiconductor device according to the present invention further includes first through third insulation films, a plurality of first and second field plates, and an interconnect line. The first insulation film is provided on the semiconductor layer between the first impurity region and the third impurity region. The plurality of first field plates are spaced from one another on the first insulation film along a direction from the first impurity region to the third impurity region. The second insulation film is provided on the first insulation film to cover the plurality of first field plates. The plurality of second field plates are spaced from one another on the second insulation film along a direction from the first impurity region to the third impurity region. The third insulation film is provided on the second insulation film to cover the plurality of second field plates. The interconnect line is provided on the third insulation film, passing over the plurality of first and second field plates, to provide electrical connection between the drain electrode and the semiconductor element. One of the plurality of first field plates which is closest to the first impurity region is a gate electrode of the MOS transistor. The plurality of second field plates respectively are provided above spaces between the plurality of first field plates. One of the plurality of second field plates which is closest to the gate electrode has a cut portion under the interconnect line. In one of the spaces between the plurality of first field plates which is located under the cut portion, an electrode is provided apart from the plurality of first field plates.

When a potential higher than that applied to the second impurity region is applied to the semiconductor layer within the predetermined region, a reverse voltage is applied to a pn junction formed by the second impurity region and that semiconductor layer, and the semiconductor layer in which the MOS transistor is provided is covered with a depletion layer. This results in improved breakdown voltage of the device.

Also, when a potential higher than that applied to the third impurity region and the interconnect line is applied to the gate electrode, capacitive coupling causes a potential difference between the second field plate which is closest to the gate electrode and the interconnect line. Since in the present invention, the second field plate which is closest to the gate electrode has a cut portion under the interconnect line, it is possible to prevent dielectric breakdown of the third insulation film caused by the potential difference between that second field plate and the interconnect line.

Further in the present invention, an electrode is spaced between the first field plates located under the cut portion of the second field plate which is closest to the gate electrode. Thus, even if the second field plate which is closest to the gate electrode has the cut portion, electric field concentration caused in the vicinity of the upper surface of the semiconductor layer by the potential of the interconnect line can be reduced because capacitive coupling of the electrode to the first field plates and to the semiconductor layer allows the creation of equipotential surfaces between the electrode and the first field plates, and because of the electrostatic shielding effect of the electrode. As a result, a semiconductor device with desired breakdown voltage can easily be achieved.

A fourth semiconductor device according to the present invention includes a semiconductor substrate of a first conductivity type, a semiconductor layer of a second conductivity type, a first impurity region of the first conductivity type, first and second semiconductor elements, a second impurity region of the second conductivity type having a higher impurity concentration than the semiconductor layer, first through third insulation films, a plurality of first and second field plates, and an interconnect line. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The first semiconductor element is provided in the semiconductor layer within the predetermined region. The second impurity region is provided in the upper surface of the semiconductor layer between the first semiconductor element and the first impurity region, within the predetermined region. The second semiconductor element is provided in the semiconductor layer outside the predetermined region. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the first semiconductor element and the second semiconductor element. The plurality of second field plates respectively are provided above spaces between the plurality of first field plates. One of the plurality of second field plates which is closest to the second impurity region has a cut portion under the interconnect line. In one of the spaces between the plurality of first field plates which is located under the cut portion, an electrode is provided apart from the plurality of first field plates.

When a potential higher than that applied to the first impurity region is applied to the semiconductor layer within the predetermined region, a reverse voltage is applied to a pn junction formed by the first impurity region and that semiconductor layer, and a depletion layer is provided in the semiconductor layer. This results in the first semiconductor element being surrounded by the depletion layer, thereby improving the breakdown voltage of the device.

Also, when a potential higher than that applied to the first impurity region and the interconnect line is applied to the second impurity region, capacitive coupling causes a potential difference between the second field plate which is closest to the second impurity region and the interconnect line. Since in the present invention, the second field plate which is closest to the second impurity region has a cut portion under the interconnect line, it is possible to prevent dielectric breakdown of the third insulation film caused by the potential difference between that second field plate and the interconnect line.

Further in the present invention, an electrode is spaced between the first field plates located under the cut portion of the second field plate which is closest to the second impurity region. Thus, even if the second field plate which is closest to the second impurity region has the cut portion, electric field concentration caused in the vicinity of the upper surface of the semiconductor layer by the potential of the interconnect line can be reduced because capacitive coupling of the electrode to the first field plates and the semiconductor layer allows the creation of equipotential surfaces between the electrode and the first field plates, and because of the electrostatic shielding effect of the electrode. As a result, a semiconductor device with desired breakdown voltage can easily be achieved.

A fifth semiconductor device according to the present invention includes a semiconductor substrate of a first conductivity type, a semiconductor layer of a second conductivity type, a first impurity region of the first conductivity type, a semiconductor element, and a MOS transistor. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The semiconductor element is provided in the semiconductor layer outside the predetermined region. The MOS transistor is provided in the semiconductor layer within the predetermined region. The MOS transistor includes a second impurity region of the second conductivity type provided in the upper surface of the semiconductor layer within the predetermined region and having a higher impurity concentration than the semiconductor layer; and a drain electrode electrically connected to the second impurity region. The fifth semiconductor device according to the present invention further includes first through third insulation films, a plurality of first and second field plates, and an interconnect line. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the drain electrode and the semiconductor element. One of the plurality of first field plates which is closest to the first impurity region is a gate electrode of the MOS transistor. The plurality of second field plates respectively are provided above spaces between the plurality of first field plates. One of the plurality of second field plates which is closest to the gate electrode has a cut portion under the interconnect line. Out of the plurality of first and second field plates, except the gate electrode and one second field plate which is closest to the gate electrode, at least one first field plate which is located adjacent to the gate electrode has a portion under the interconnect line, at least one edge of which portion on the side of the gate electrode is shifted closer to the gate electrode than that edge of the other portion.

When a potential higher than that applied to the first impurity region is applied to the semiconductor layer within the predetermined region, a reverse voltage is applied to a pn junction formed by the first impurity region and that semiconductor layer, and the semiconductor layer in which the MOS transistor is provided is covered with a depletion layer. This results in improved breakdown voltage of the device.

Also, when a potential higher than that applied to the gate electrode is applied to the second impurity region and the interconnect line, capacitive coupling causes a potential difference between the second field plate which is closest to the gate electrode and the interconnect line. Since in the present invention, the second field plate which is closest to the gate electrode has a cut portion under the interconnect line, it is possible to prevent dielectric breakdown of the third insulation film caused by the potential difference between that second field plate and the interconnect line.

Further in the present invention, at least the first field plate which is located adjacent to the gate electrode has a portion under the interconnect line, the edge of which portion on the side of the gate electrode is shifted closer to the gate electrode than that edge of the other portion. Thus, under the interconnect line, there is a smaller space between the gate electrode and its adjacent first field plate. Consequently, when a potential higher than that applied to the gate electrode is applied to the second impurity region and the interconnect line, the upper surface of the semiconductor layer under the space between the gate electrode and its adjacent first field plate becomes liable to be influenced by a relatively low potential of the first field plate which is located adjacent to the gate electrode. This reduces the influence of a relatively high potential of the interconnect line and facilitates the extension of a depletion layer in the semiconductor layer. Accordingly, it becomes possible to reduce electric field concentration caused by the provision of the cut portion of the second field plate which is closest to the gate electrode and, as a result, to easily achieve a semiconductor device with desired breakdown voltage.

A sixth semiconductor device according to the present invention includes a semiconductor substrate of a first conductivity type, a semiconductor layer of a second conductivity type, a first impurity region of the first conductivity type, first and second semiconductor elements, a second impurity region of the second conductivity type having a higher impurity concentration than the semiconductor layer, first through third insulation films, a plurality of first and second field plates, and an interconnect line. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The first semiconductor element is provided in the semiconductor layer within the predetermined region. The second impurity region is provided in the upper surface of the semiconductor layer between the first semiconductor element and the first impurity region, within the predetermined region. The second semiconductor element is provided in the semiconductor layer outside the predetermined region. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the first semiconductor element and the second semiconductor element. The plurality of second field plates respectively are provided above spaces between the plurality of first field plates. One of the plurality of second field plates which is closest to the first impurity region has a cut portion under the interconnect line. Out of the plurality of first and second field plates, except one first field plate and one second field plate which are respectively closest to the first impurity region, at least one first field plate which is second-closest to the first impurity region has a portion under the interconnect line, at least one edge of which portion on the side of the first impurity region is shifted closer to the first impurity region than that edge of the other portion.

When a potential higher than that applied to the first impurity region is applied to the semiconductor layer within the predetermined region, a reverse voltage is applied to a pn junction formed by the first impurity region and that semiconductor layer, and a depletion layer is provided in the semiconductor layer. This results in the first semiconductor element being surrounded by the depletion layer, thereby improving the breakdown voltage of the device.

Also, when a potential higher than that applied to the first impurity region is applied to the second impurity region and the interconnect line, capacitive coupling causes a potential difference between the second field plate which is closest to the first impurity region and the interconnect line. Since in the present invention, the second field plate which is closest to the first impurity region has a cut portion under the interconnect line, it is possible to prevent dielectric breakdown of the third insulation film caused by the potential difference between that second field plate and the interconnect line.

Further in the present invention, at least the first field plate which is second-closest to the first impurity region has a portion under the interconnect line, at least the edge of which portion on the side of the first impurity region is shifted closer to the first impurity region than that edge of the other portion. Thus, under the interconnect line, there is a smaller space between the first field plate which is closest to the first impurity region and the first field plate which is second-closest to the first impurity region. Consequently, when a potential higher than that applied to the first impurity region is applied to the second impurity region and the interconnect line, the upper surface of the semiconductor layer under the space between the first field plate which is closest to the first impurity region and the first field plate which is second-closest to the first impurity region becomes liable to be influenced by a relatively low potential of the first field plate which is second-closest to the first impurity region. This reduces the influence of a relatively high potential of the interconnect line and facilitates the extension of a depletion layer in the semiconductor layer. Accordingly, it becomes possible to reduce electric field concentration caused by the provision of the cut portion of the second field plate which is closest to the first impurity region and, as a result, to easily achieve a semiconductor device with desired breakdown voltage.

A seventh semiconductor device according to the present invention includes a semiconductor substrate of a first conductivity type, a semiconductor layer of a second conductivity type, a first impurity region of the second conductivity type having a higher impurity concentration than the semiconductor layer, a second impurity region of the first conductivity type, a semiconductor element, and a MOS transistor. The semiconductor layer is provided on the semiconductor substrate. The first impurity region is provided in an upper surface of the semiconductor layer to define a predetermined region in the semiconductor layer. The second impurity region is provided in the semiconductor layer, extending from the upper surface of the semiconductor layer to an interface with the semiconductor substrate, within the predetermined region. The semiconductor element is provided in the semiconductor layer outside the predetermined region. The MOS transistor is provided in the semiconductor layer within the predetermined region. The MOS transistor includes a third impurity region of the first conductivity type provided in the upper surface of the semiconductor layer between the first impurity region and the second impurity region, within the predetermined region; and a drain electrode electrically connected to the third impurity region. The seventh semiconductor device according to the present invention further includes first through third insulation films, a plurality of first and second field plates, and an interconnect line. The first insulation film is provided on the semiconductor layer between the first impurity region and the third impurity region. The plurality of first field plates are spaced from one another on the first insulation film along a direction from the first impurity region to the third impurity region. The second insulation film is provided on the first insulation film to cover the plurality of first field plates. The plurality of second field plates are spaced from one another on the second insulation film along a direction from the first impurity region to the third impurity region. The third insulation film is provided on the second insulation film to cover the plurality of second field plates. The interconnect line is provided on the third insulation film to pass over the plurality of first and second field plates to provide electrical connection between the drain electrode and the semiconductor element. One of the plurality of first field plates which is closest to the first impurity region is a gate electrode of the MOS transistor. The plurality of second field plates respectively are provided above spaces between the plurality of first field plates, and one of the plurality of second field plates which is closest to the gate electrode has a cut portion under the interconnect line. Out of the plurality of first and second field plates, except the gate electrode and one second field plate which is closest to the gate electrode, at least one first field plate which is located adjacent to the gate electrode has a portion under the interconnect line, at least one edge of which portion on the side of the gate electrode is shifted closer to the gate electrode than that edge of the other portion.

When a potential higher than that applied to the second impurity region is applied to the semiconductor layer within the predetermined region, a reverse voltage is applied to a pn junction formed by the second impurity region and that semiconductor layer, and the semiconductor layer in which the MOS transistor is provided is covered with a depletion layer. This results in improved breakdown voltage of the device.

Also, when a potential higher than that applied to the third impurity region and the interconnect line is applied to the gate electrode, capacitive coupling causes a potential difference between the second field plate which is closest to the gate electrode and the interconnect line. Since in the present invention, the second field plate which is closest to the gate electrode has a cut portion under the interconnect line, it is possible to prevent dielectric breakdown of the third insulation film caused by the potential difference between that second field plate and the interconnect line.

Further in the present invention, at least the first field plate which is located adjacent to the gate electrode has a portion under the interconnect line, at least the edge of which portion on the side of the gate electrode is shifted closer to the gate electrode than that edge of the other portion. Thus, under the interconnect line, there is a smaller space between the gate electrode and its adjacent first field plate. Consequently, when a potential higher than that applied to the third impurity region and the interconnect line is applied to the gate electrode, the upper surface of the semiconductor layer under the space between the gate electrode and its adjacent first field plate becomes liable to be influenced by a relatively high potential of the first field plate which is located adjacent to the gate electrode. This reduces the influence of a relatively low potential of the interconnect line and controls the extension of a depletion layer in the semiconductor layer. Accordingly, it becomes possible to reduce electric field concentration caused by the provision of the cut portion of the second field plate which is closest to the gate electrode and, as a result, to easily achieve a semiconductor device with desired breakdown voltage.

An eighth semiconductor device according to the present invention includes a semiconductor substrate of a first conductivity type, a semiconductor layer of a second conductivity type, a first impurity region of the first conductivity type, first and second semiconductor elements, a second impurity region of the second conductivity type having a higher impurity concentration than the semiconductor layer, first through third insulation films, a plurality of first and second field plates, and an interconnect line. The semiconductor layer is provided on the semiconductor substrate. The first impurity region is provided in the semiconductor layer, extending from an upper surface of the semiconductor layer to an interface with the semiconductor substrate, to define a predetermined region in the semiconductor layer. The first semiconductor element is provided in the semiconductor layer within the predetermined region. The second impurity region is provided in the upper surface of the semiconductor layer between the first semiconductor element and the first impurity region, within the predetermined region. The second semiconductor element is provided in the semiconductor layer outside the predetermined region. The first insulation film is provided on the semiconductor layer between the first impurity region and the second impurity region. The plurality of first field plates are spaced from one another on the first insulation film along a direction from the first impurity region to the second impurity region. The second insulation film is provided on the first insulation film to cover the plurality of first field plates. The plurality of second field plates are spaced from one another on the second insulation film along a direction from the first impurity region to the second impurity region. The third insulation film is provided on the second insulation film to cover the plurality of second field plates. The interconnect line is provided on the third insulation film, passing over the plurality of first and second field plates, to provide electrical connection between the first semiconductor element and the second semiconductor element. The plurality of second field plates respectively are provided above spaces between the plurality of first field plates. One of the plurality of second field plates which is closest to the second impurity region has a cut portion under the interconnect line. Out of the plurality of first and second field plates, except one first field plate and one second field plate which are respectively closest to the second impurity region, at least one first field plate which is second-closest to the second impurity region has a portion under the interconnect line, at least one edge of which portion on the side of the second impurity region is shifted closer to the second impurity region than that edge of the other portion.

When a potential higher than that applied to the first impurity region is applied to the semiconductor layer within the predetermined region, a reverse voltage is applied to a pn junction formed by the first impurity region and that semiconductor layer, and a depletion layer is provided in the semiconductor layer. This results in the first semiconductor element being surrounded by the depletion layer, thereby improving the breakdown voltage of the device.

Also, when a potential higher than that applied to the first impurity region and the interconnect line is applied to the second impurity region, capacitive coupling causes a potential difference between the second field plate which is closest to the second impurity region and the interconnect line. Since in the present invention, the second field plate which is closest to the second impurity region has a cut portion under the interconnect line, it is possible to prevent dielectric breakdown of the third insulation film caused by the potential difference between that second field plate and the interconnect line.

Further in the present invention, at least the first field plate which is second-closest to the second impurity region has a portion under the interconnect line, at least the edge of which portion on the side of the second impurity region is shifted closer to the second impurity region than that edge of the other portion. Thus, under the interconnect line, there is a smaller space between the first field plate which is closest to the second impurity region and the first field plate which is second-closest to the second impurity region. Consequently, when a potential higher than that applied to the first impurity region and the interconnect line is applied to the second impurity region, the upper surface of the semiconductor layer under the space between the first field plate which is closest to the second impurity region and the first field plate which is second-closest to the second impurity region becomes liable to be influenced by a relatively high potential of the first field plate which is second-closest to the second impurity region. This reduces the influence of a relatively low potential of the interconnect line and controls the extension of a depletion layer in the semiconductor layer. Accordingly, it becomes possible to reduce electric field concentration due to the provision of the cut portion of the second field plate which is closest to the second impurity region and, as a result, to easily achieve a semiconductor device with desired breakdown voltage.

A ninth semiconductor device according to the present invention includes a semiconductor substrate of a first conductivity type, a epitaxial layer of a second conductivity type, a first impurity region of the first conductivity type, and a MOS transistor. The epitaxial layer is provided on the semiconductor substrate. The first impurity region is provided in the epitaxial layer, extending from an upper surface of the epitaxial layer to an interface with the semiconductor substrate, to define a predetermined region in the epitaxial layer. The MOS transistor is provided in the epitaxial layer within the predetermined region. The MOS transistor includes a second impurity region of the second conductivity type provided in the upper surface of the epitaxial layer within the predetermined region and having a higher impurity concentration than the epitaxial layer; and a drain electrode electrically connected to the second impurity region. The ninth semiconductor device according to the present invention further includes a diffusion region of the second conductivity type having a higher impurity concentration than the epitaxial layer. The diffusion region is provided in the upper surface of the epitaxial layer at least between the first impurity region and the second impurity region.

A tenth semiconductor device according to the present invention a semiconductor substrate of a first conductivity type, an epitaxial layer of a second conductivity type, a first impurity region of the first conductivity type, a first semiconductor element, a second impurity region of the second conductivity type having a higher impurity concentration than the epitaxial layer, and a diffusion region of the second conductivity type having a higher impurity concentration than the epitaxial layer. The epitaxial layer is provided on the semiconductor substrate. The first impurity region is provided in the epitaxial layer, extending from an upper surface of the epitaxial layer to an interface with the semiconductor substrate, to define a predetermined region in the epitaxial layer. The first semiconductor element is provided in the epitaxial layer within the predetermined region. The second impurity region is provided in the upper surface of the semiconductor layer between the first semiconductor element and the first impurity region, within the predetermined region. The diffusion region of the second conductivity type is provided in the upper surface of the epitaxial layer at least between the first impurity region and the second impurity region.

In the upper surface of the epitaxial layer in the predetermined region, a diffusion region having a higher impurity concentration than the epitaxial layer is provided. The diffusion region generally allows more precise control of impurity concentration and thickness than the epitaxial layer; therefore, the product of the impurity concentration ($cm^{-3}$) and the thickness (cm) of the diffusion region is easier to satisfy the RESURF condition ($\approx 1.0 \times 10^{12}$ $cm^{-2}$). This allows reliable formation of a depletion layer in the predetermined region and, as a result, allows easy achievement of a semiconductor device with desired breakdown voltage.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 13 to 15 are cross-sectional views illustrating the configuration of the semiconductor device according to the second preferred embodiment of the present invention;

FIGS. 32A, 32B, 33A, 33B, 34A, 34B, 35A, and 35B are cross-sectional views illustrating a configuration of a semiconductor device according to a fifth preferred embodiment of the present invention;

FIG. 36 is a cross-sectional view illustrating a configuration of a semiconductor device according to a sixth preferred embodiment of the present invention;

FIGS. 37 to 42 are cross-sectional views illustrating a sequence of process steps in a method of manufacturing a semiconductor device according to the sixth preferred embodiment of the present invention;

FIG. 46 is a cross-sectional view illustrating a configuration of a semiconductor device according to a tenth preferred embodiment of the present invention.

DESCRIPTION OF THE PREFERRED EMBODIMENTS

First Preferred Embodiment

Figure 1:
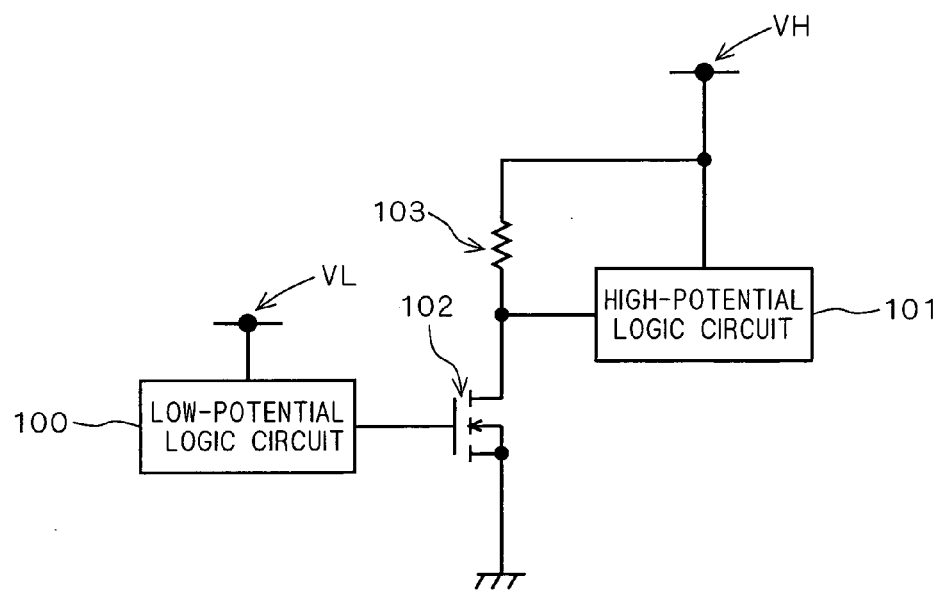
FIG. 1 is a block diagram illustrating a configuration of a semiconductor device according to a first preferred embodiment of the present invention.

FIG. 1 is a block diagram illustrating a configuration of a semiconductor device according to a first preferred embodiment of the present invention. The semiconductor device according to the first preferred embodiment is an HVIC that achieves high breakdown voltage using the RESURF effect, and as shown in FIG. 1, includes a low-potential logic circuit 100, a high-potential logic circuit 101, an n-channel MOS transistor 102, and a resistance 103.

The low-potential logic circuit 100 is a logic circuit which operates with a relatively low potential VL of several ten volts as the positive power supply, and is applied with a ground potential as the negative power supply. The high-potential logic circuit 101 is a logic circuit which operates with a relatively high potential VH of several hundred volts as the positive power supply, and is also applied with several hundred volts as the negative power supply; thus, the high-potential logic circuit 101 will have a potential difference of several ten volts between the positive and negative power supplies.

The MOS transistor 102 and the resistance 103 level-shift a low-potential signal outputted from the low-potential logic circuit 100 to high potential and input that level-shifted signal to the high-potential logic circuit 101. The MOS transistor 102 is connected at its gate to the low-potential logic circuit 100 and is applied with a ground potential at its source. The MOS transistor 102 is also connected at its drain to one end of the resistance 103 and to the high-potential logic circuit 101. The other end of the resistance 103 is applied with the potential VH.

In the semiconductor device with the aforementioned configuration according to the first preferred embodiment, when the MOS transistor 102 is in the OFF state, a high-level signal of the potential VH is inputted to the high-potential logic circuit 101. Then, upon output of a high-level pulse signal from the low-potential logic circuit 100, the MOS transistor 102 is turned on, and current flows through the resistance 103. It causes a voltage drop in the resistance 103, which then decreases the drain potential of the MOS transistor 102 and changes the level of an input signal of the high-potential logic circuit 101. Thereby, the pulse signal outputted from the low-potential logic circuit 100 is converted into a pulse signal of the opposite polarity of high potential and inputted to the high-potential logic circuit 101. Accordingly, the high-potential logic circuit 101 is capable of operating on the basis of a signal outputted from the low-potential logic circuit 100.

Figure 2:
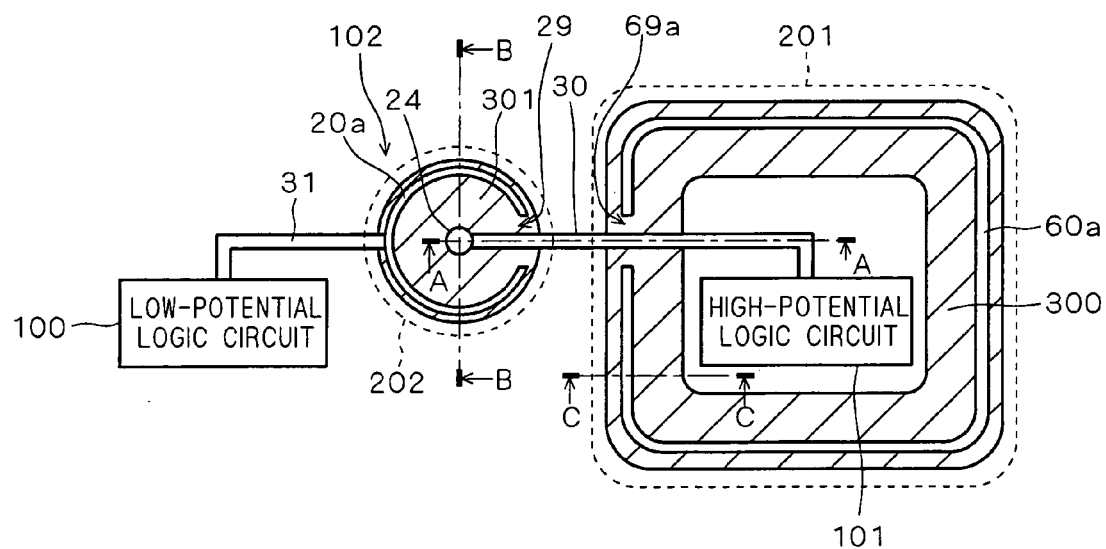
FIG. 2 is a plan view illustrating the configuration of the semiconductor device according to the first preferred embodiment of the present invention.
Figure 3:
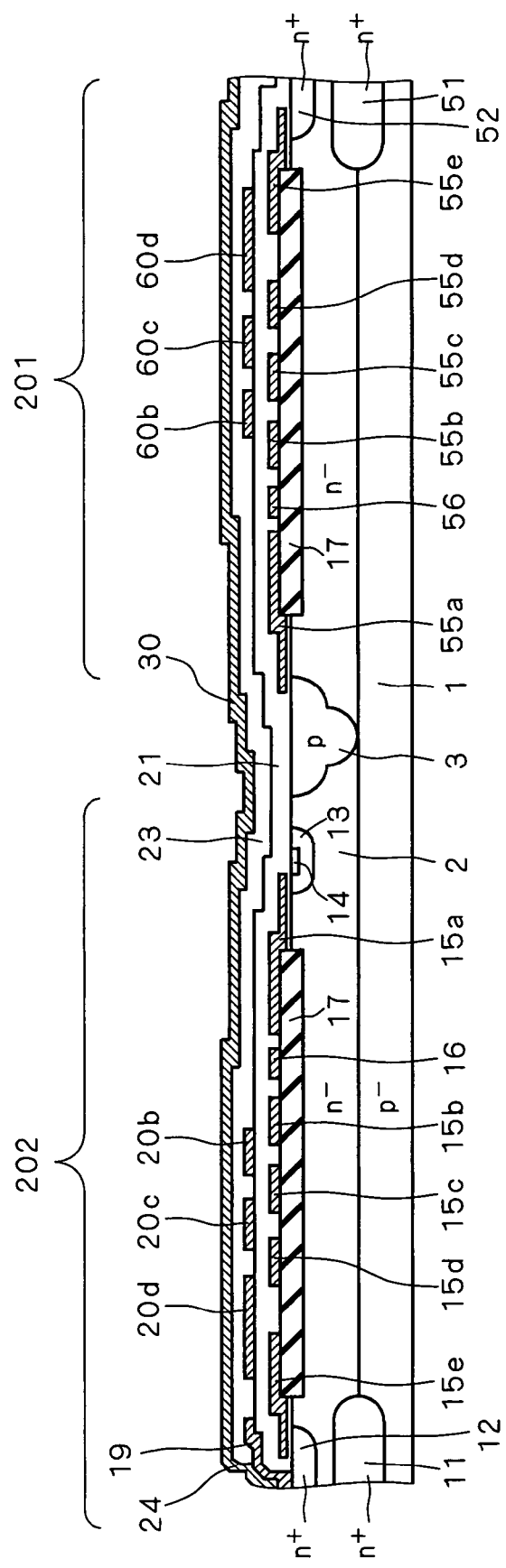
FIGS. 3 to 5 are cross-sectional views illustrating the configuration of the semiconductor device according to the first preferred embodiment of the present invention.
Figure 4:
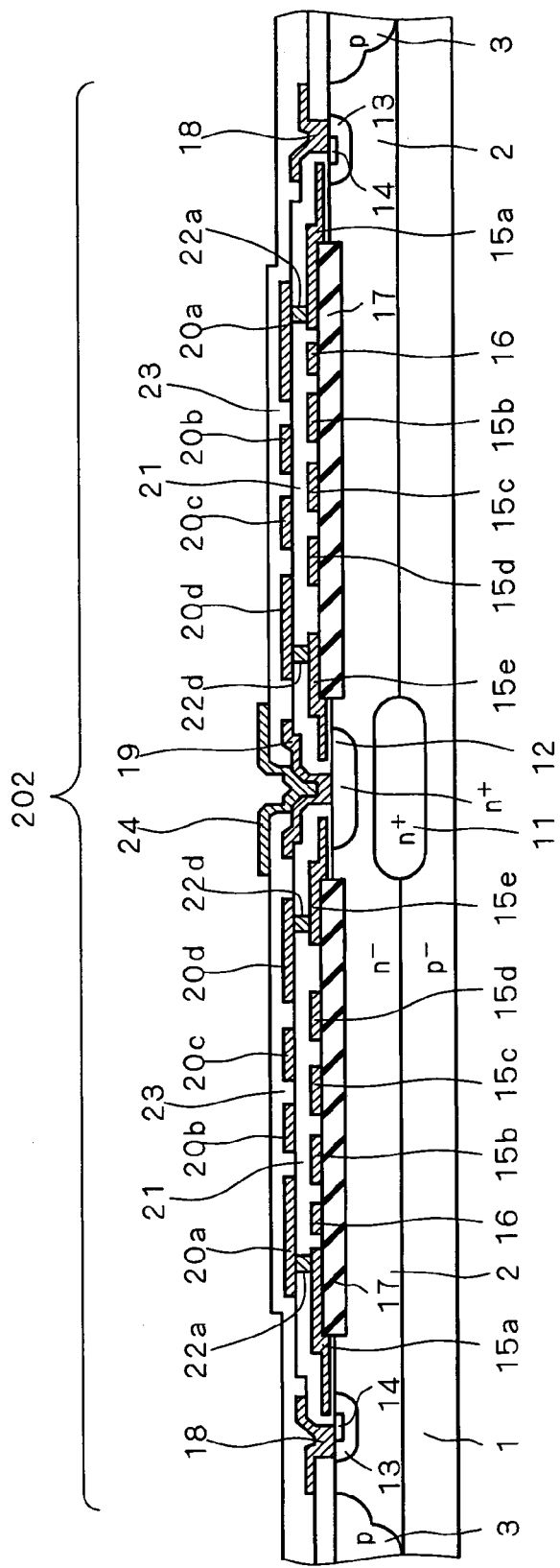
Figure 5:
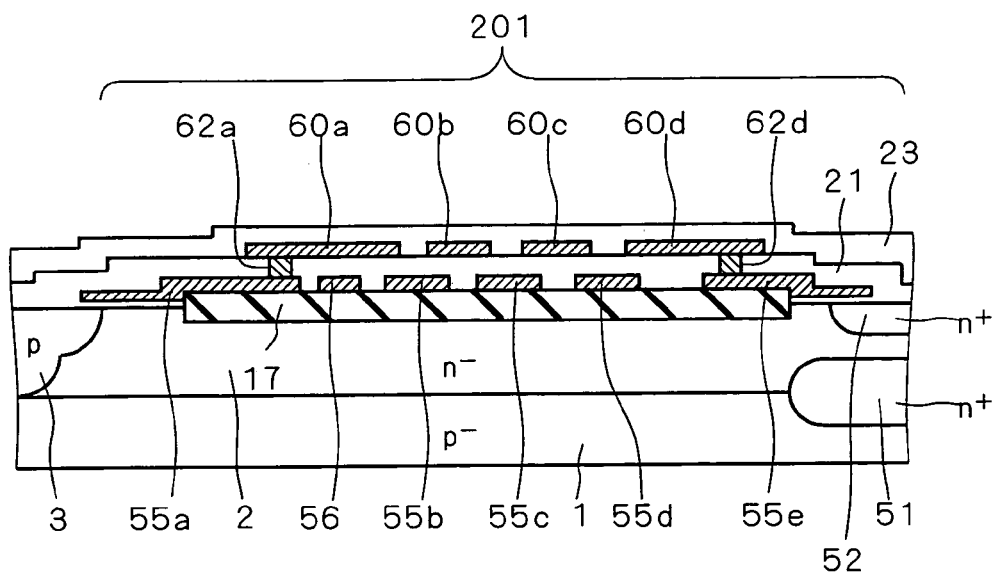

Next, a configuration of the semiconductor device according to the first preferred embodiment is described. FIG. 2 is a plan view illustrating schematically the configuration of the semiconductor device according to the first preferred embodiment; and FIGS. 3 through 5 are cross-sectional views taken respectively along arrowed lines A-A, B-B, and C-C of FIG. 2. In FIG. 2, in order to avoid complexity of drawing, an insulation film 23 in FIGS. 3 to 5 is not shown, and only two of field plates, namely 20a and 60a, formed on an insulation film 21 are shown.

In the following description, the symbols "p", "p$^+$","p$^-$", "n", "n$^+$", and "n$^-$" represent the conductivity type of impurities and the impurity concentration in a semiconductor. More specifically, "p" and "n" in the symbols refer to the p-type impurity and the n-type impurity, respectively. Also, the superscript signs in the symbols refer to the impurity concentration, which is higher in the following order: symbols with the minus sign, symbols with no sign, and symbols with the plus sign.

As shown in FIGS. 2 to 5, in the semiconductor device according to the first preferred embodiment, an $n^-$ semiconductor layer 2 which is an n-type epitaxial layer is formed on a $p^-$ semiconductor substrate 1. In the $n^-$ semiconductor layer 2, a p impurity region 3 is formed, extending from the upper surface of the $n^-$ semiconductor layer 2 to an interface with the $p^-$ semiconductor substrate 1. The p impurity region 3 is formed to surround part of the $n^-$ semiconductor layer 2, thereby to define in the $n^-$ semiconductor layer 2 a high-potential island region 201 where the high-potential logic circuit 101 and the resistance 103 are located. The p impurity region 3 is formed to also surround another part of the $n^-$ semiconductor layer 2 to define in the $n^-$ semiconductor layer 2 an nMOS region 202 where the MOS transistor 102 is located. The high-potential island region 201 and the nMOS region 202 are adjacent to each other with the p impurity region 3 in between.

In the $n^-$ semiconductor layer 2 within the high-potential island region 201, an $n^+$ buried impurity region 51 is selectively formed at the interface with the $p^-$ semiconductor substrate 1, except at the peripheral edge of the $n^-$ semiconductor layer 2. In the $n^-$ semiconductor layer 2 above the $n^+$ buried impurity region 51, the high-potential logic circuit 101 is formed. Also above the $n^+$ buried impurity region 51, a $p^+$ impurity region serving as the resistance 103, although not shown, is formed in the upper surface of the $n^-$ semiconductor layer 2. The high-potential logic circuit 101 includes a p-channel MOS transistor, an n-channel MOS transistor, or a semiconductor element such as a diode.

In the upper surface of the $n^-$ semiconductor layer 2 within the high-potential island region 201, except where the high-potential logic circuit 101 is formed, an $n^+$ impurity region 52 is formed above the $n^+$ buried impurity region 51 to surround the high-potential logic circuit 101. Thus, the $n^+$ impurity region 52 is formed in the $n^-$ semiconductor layer 2 between the p impurity region 3 and the high-potential logic circuit 101. On the upper surface of the $n^-$ semiconductor layer 2 between the $n^+$ impurity region 52 and the p impurity region 3, an isolation insulating film 17 is formed on which first field plates 55a, 55b, 55c, 55d, and 55e are formed. The first field plates 55a-55e are spaced from one another in order along a direction from the p impurity region 3 to the $n^+$ impurity region 52, to surround the high-potential logic circuit 101 when viewed in plan.

The first field plate 55a also extends from the isolation insulating film 17 toward the p impurity region 3 to cover an edge of the p impurity region 3 without contact. Also, the first field plate 55e extends from the isolation insulating film 17 toward the $n^+$ impurity region 52 to cover an edge of the $n^+$ impurity region 52 without contact. An electrode 56 which is isolated from the surroundings is located in a space between the first field plate 55a which is closest to the p impurity region 3, and its adjacent first field plate 55b, out of the first field plates 55a-55e. The electrode 56 is spaced between the first field plates 55a and 55b on the isolation insulating film 17 to surround the high-potential logic circuit 101 when viewed in plan.

The first field plate 55a is capacitively coupled to the upper surface of the p impurity region 3, and the first field plate 55e is capacitively coupled to the upper surface of the $n^+$ impurity region 52. The electrode 56 serves as a field plate. The first field plates 55a-55e and the electrode 56 are capacitively coupled to one another as well as to the upper surface of the $n^-$ semiconductor layer 2, thereby performing the function of reducing electric field caused at the upper surface of the $n^-$ semiconductor layer 2 by the potential difference between the p impurity region 3 and the $n^+$ impurity region 52. As will be described below, the p impurity region 3 and the $n^+$ impurity region 52 are applied with a ground potential and the potential VH, respectively.

In the upper surface of the $n^-$ semiconductor layer 2 within approximately a central portion of the nMOS region 202, an $n^+$ impurity region 12 which is electrically connected to a drain electrode 24 of the MOS transistor 102 is provided apart from the p impurity region 3. Under the $n^+$ impurity region 12, an $n^+$ buried impurity region 11 is formed at the interface between the $n^-$ semiconductor layer 2 and the $p^-$ semiconductor substrate 1.

In the upper surface of the $n^-$ semiconductor layer 2 between the p impurity region 3 and the $n^+$ impurity region 12, a $p^+$ impurity region 13 is formed to surround the $n^+$ impurity region 12. In the upper surface of the $p^+$ impurity region 13, a source region 14 of the MOS transistor 102 is formed to also surround the $n^+$ impurity region 12. The source region 14 is an $n^+$ impurity region.

On the upper surface of the $n^-$ semiconductor layer 2 between the $p^+$ impurity region 13 and the $n^+$ impurity region 12, the isolation insulating film 17 is formed on which a gate electrode 15a of the MOS transistor 102 and first field plates 15b, 15c, 15d, and 15e are formed. The gate electrode 15a and the first field plates 15b-15e are spaced from one another in order along a direction from the $p^+$ impurity region 13 to the $n^+$ impurity region 12 to surround a central portion of the $n^+$ impurity region 12 when viewed in plan.

Since the $p^+$ impurity region 13 is provided in the $n^-$ semiconductor layer 2 between the p impurity region 3 and the $n^+$ impurity region 12, it can be said that the isolation insulating film 17 is provided partly on the upper surface of the $n^-$ semiconductor layer 2 between the p impurity region 3 and the $n^+$ impurity region 12. It can also be said that the gate electrode 15a and the first field plates 15b-15e on that isolation insulating film 17 are spaced from one another in order along a direction from the p impurity region 3 to the $n^+$ impurity region 12.

The gate electrode 15a also extends from the isolation insulating film 17 toward the $p^+$ impurity region 13 to cover, without contact, an edge of the $p^+$ impurity region 13 which is sandwiched between the source region 14 and the $n^-$ semiconductor layer 2. Also, the first field plate 15e extends from the isolation insulating film 17 toward the $n^+$ impurity region 12 to cover an edge of the $n^+$ impurity region 12 without contact. There exists a gate insulating film on the edge of the $p^+$ impurity region 13 which is covered with the gate electrode 15a and which is sandwiched between the source region 14 and the $n^-$ semiconductor layer 2; however, in the drawings, this gate insulating film is included in and shown as an insulation film 21 which will be described later.

An electrode 16 which is isolated from the surroundings is located in a space between the gate electrode 15a which is closest to the $p^+$ impurity region 13, or in other words, closest to the p impurity region 3, and its adjacent first field plate 15b, out of the gate electrode 15a and the first field plates 15b-15e. The electrode 16 is spaced between the gate electrode 15a and the first field plate 15b on the isolation insulating film 17 to surround the $n^+$ impurity region 12 when viewed in plan.

The first field plate 15e is capacitively coupled to the upper surface of the n⁺ impurity region 12. The gate electrode 15a and the electrode 16 serve as field plates. The gate electrode 15a, the first field plates 15b-15e, and the electrode 16 are capacitively coupled to one another as well as to the upper surface of the n⁻ semiconductor layer 2, thereby performing the function of reducing electric field caused at the upper surface of the n⁻ semiconductor layer 2 by the potential difference between the source region 14 and the n⁺ impurity region 12 which is electrically connected to the drain electrode 24. Serving also as a field plate, the gate electrode 15a is hereinafter referred to also as the "first field plate 15a".

In the n⁻ semiconductor layer 2 outside the high-potential island region 201 and the nMOS region 202, the low-potential logic circuit 100 is formed. The n⁻ semiconductor layer 2 where the low-potential logic circuit 100 is formed, and the n⁻ semiconductor layer 2 where the high-potential island region 201 and the nMOS region 202 are formed, are divided by the p impurity region 3.

On the n⁻ semiconductor layer 2 and the isolation insulating film 17, the insulation film 21 is formed to cover the first field plates 15a-15e and 55a-55e and the electrodes 16 and 56. Then, an electrode 19 and a source electrode 18 of the MOS transistor 102 are provided in and through the insulation film 21. The source electrode 18 is in contact with the p⁺ impurity region 13 and the source region 14, and the electrode 19 is in contact with the n⁺ impurity region 12.

On the insulation film 21, second field plates 20a, 20b, 20c, 20d, 60a, 60b, 60c, and 60d are formed. The second field plates 60a-60d are provided above the first field plates 55a-55e and spaced from one another in order along a direction from the p impurity region 3 to the n⁺ impurity region 52. The second field plates 60a-60d respectively are located above spaces between the first field plates 55a-55e. That is, any one of the second field plates 60a-60d is located above a space between any adjacent pair of the first field plates 55a-55. When viewed in plan, each of the second field plates 60a-60d is formed to overlap the edges of adjacent two of the first field plates located thereunder.

Of the second field plates 60a-60d, the second field plates 60b-60d completely surround the high-potential logic circuit 101 when viewed in plan. The remaining second field plate 60a has a cut portion 69a under an interconnect line 30 which will be described later, and thus almost surrounds the high-potential logic circuit 101, except the cut portion 69a, when viewed in plan.

The second field plates 20a-20d are provided above the first field plates 15a-15e and spaced from one another in order along a direction from the p⁺ impurity region 13 to the n⁺ impurity region 12, or in other words, along a direction from the p impurity region 3 to the n⁺ impurity region 12. The second field plates 20a-20d respectively are located above spaces between the first field plates 15a-15e. That is, any one of the second field plates 20a-20d is located above a space between any adjacent pair of the first field plates 15a-15e. When viewed in plan, each of the second field plates 20a-20d is formed to overlap the edges of adjacent two of the first field plates located thereunder.

Of the second field plates 20a-20d, the second field plates 20b-20d completely surround the n⁺ impurity region 12 when viewed in plan. The remaining second field plate 20a has a cut portion 29 under the interconnect line 30, which will be described later, and thus almost surrounds the n⁺ impurity region 12, except the cut portion 29, when viewed in plan.

The gate electrode 15a and the second field plate 20a are electrically connected to each other by a contact plug 22a which is provided in and through the insulation film 21; and the first field plate 15e and the second field plate 20d are electrically connected to each other by a contact plug 22d which is provided in and through the insulation film 21. The first field plate 55a and the second field plate 60a are electrically connected to each other by a contact plug 62a which is provided in and through the insulation film 21; and the first field plate 55e and the second field plate 60d are electrically connected to each other by a contact plug 62d which is provided in and through the insulation film 21.

The contact plugs 22a and 22d extend along the second field plates 20a and 20d, respectively, and do not extend under the interconnect line 30. Thus, like the second field plate 20a, the contact plugs 22a and 22d almost surround the n⁺ impurity region 12. Also, the contact plugs 62a and 62d extend along the second field plates 60a and 60d, respectively, and do not extend under the interconnect line 30. Thus, like the second field plate 60a, the contact plugs 62a and 62d almost surround the high-potential logic circuit 101.

The first field plates 15b-15d and 55b-55d and the second field plates 20b, 20c, 60b, and 60c are floating electrodes which are isolated from the surroundings. The first field plate 15e and the second field plate 20d are also floating electrodes, because they are isolated from the surroundings, except that they are connected to each other. Similarly, the first field plate 55a and the second field plate 60a, and the first field plate 55e and the second field plate 60d, each pair are also floating electrodes, because they are isolated from the surroundings, except that they are connected to each other.

On the insulation film 21, an insulation film 23 is formed to cover the source electrode 18, the electrode 19, and the second field plates 20a-20d and 60a-60d. Then, the drain electrode 24 of the MOS transistor 102 is provided in and through the insulation film 23 so as to be in contact with the electrode 19. In this way, electrical connection is established between the n⁺ impurity region 12 and the drain electrode 24 of the MOS transistor 102.

On the insulation film 23, the interconnect line 30 is formed which provides electrical connection between the drain electrode 24 and the high-potential logic circuit 101, whereby the drain of the MOS transistor 102 and the high-potential logic circuit 101 are connected to each other as shown in FIG. 1. The interconnect line 30 starting from the drain electrode 24 extends to the high-potential logic circuit 101, passing over the first field plates 15a-15e and the second field plates 20b-20d, over the p impurity region 3 located at the boundary between the nMOS region 202 and the high-potential island region 201, and over the first field plates 55a-55e and the second field plates 60b-60d.

Of the second field plates 20a-20d, the second field plate 20a which is closest to the gate electrode 15a has the cut portion 29 under the interconnect line 30 as shown in FIG. 2. Since the electrode 16 is formed to surround the n⁺ impurity region 12, the electrode 16 in the first preferred embodiment is located in one of the spaces between the first field plates 15a-15e which is located under the cut portion 29, that is, in a space between the gate electrode 15a and the first field plate 15b located under the interconnect line 30.

Of the second field plates 60a-60d, the second field plate 60a which is closest to the p impurity region 3 has the cut portion 69a under the interconnect line 30 as shown in FIG. 2. Since the electrode 56 is formed to surround the high-potential logic circuit 101, the electrode 56 in the first preferred embodiment is located in one of the spaces between the first field plates 55a-55e which is located under the cut portion 69a, i.e., in a space between the first field plates 55a and 55b located under the interconnect line 30.

On the insulation film 23, an interconnect line 31 is also provided which provides electrical connection between the low-potential logic circuit 100 and the second field plate 20a which is electrically connected to the gate electrode 15a. The interconnect line 31 and the second field plate 20a are electrically connected to each other by a contact plug which is not shown but provided through the insulation film 23. Thereby, a signal from the low-potential logic circuit 100 is inputted to the gate electrode 15a of the MOS transistor 102. On the insulation film 23, there is also provided an interconnect line which is not shown but provides electrical connection between the interconnect line 30 and a p$^+$ impurity region (not shown) formed in the n$^-$ semiconductor layer 2 within the high-potential island region 201 and serving as the resistance 103. That interconnect line is connected to an electrode (not shown) which is provided in contact with the p$^+$ impurity region formed through the insulation films 21 and 23 and serving as the resistance 103.

The gate electrode 15a, the first field plates 15b-15e and 55a-55e, and the electrodes 16 and 56 are formed of, for example, polysilicon, and the second field plates 20a-20d and 60a-60d and the interconnect lines 30 and 31 are formed of, for example, aluminum.

In the semiconductor device with the aforementioned configuration according to the first preferred embodiment, when the potential VH is applied to the edge of the p$^+$ impurity region serving as the resistance 103, the interconnect line 30 is applied with the potential VH as high as several hundred volts through that p$^+$ impurity region. Then, when a ground potential is applied to the source electrode 18 and when a high-level signal of several ten volts is outputted from the low-potential logic circuit 100, that high-level signal is given to the gate electrode 15a through the interconnect line 31, the second field plate 20a, and the contact plug 22a. Thereby, the MOS transistor 102 is turned on, and current flows through the p$^+$ impurity region serving as the resistance 103, which causes a voltage drop in that p$^+$ impurity region. This results in potential changes in both the interconnect line 30 and the drain electrode 24, and causes a signal of low potential outputted from the low-potential logic circuit 100 to be level-shifted to high potential and inputted to the high-potential logic circuit 101.

In the on-state MOS transistor 102, current flows from the drain electrode 24 through the electrode 19, the n$^+$ impurity region 12, the n$^-$ semiconductor layer 2, the p$^+$ impurity region 13, and the source region 14 in sequence to the source electrode 18. Further, in the MOS transistor 102, since the n$^-$ semiconductor layer 2 between the p$^+$ impurity region 13 and the n$^+$ impurity region 12 serves as a resistance, the potential of the drain electrode 24 will decrease by only several ten volts from the potential VH.

Further in the semiconductor device according to the first preferred embodiment, the ground potential is applied to the p impurity region 3 and the p$^-$ semiconductor substrate 1, and the potential VH is applied to the n$^-$ semiconductor layer 2, the n$^+$ buried impurity region 51, and the n$^+$ impurity region 52 which are all within the high-potential island region 201. Thereby, a reverse voltage as high as several hundred volts is applied to a pn junction formed by the n$^-$ semiconductor layer 2 within the high-potential island region 201 and its surrounding p impurity region 3, and a depletion layer is formed by the RESURF effect at the peripheral edge of the n$^-$ semiconductor layer 2 within the high-potential island region 201. More specifically, the depletion layer is formed, extending to the upper surface of the n$^-$ semiconductor layer 2 between the p impurity region 3 and the n$^+$ impurity region 52. Consequently, the high-potential logic circuit 101 is surrounded by the depletion layer, thereby achieving high breakdown voltage.

Furthermore, since, as above described, the drain electrode 24 is applied with the potential VH, the potential VH is also applied to the n$^+$ impurity region 12 and consequently to the n$^-$ semiconductor layer 2 within the nMOS region 202. Thereby, a reverse voltage as high as several hundred volts is applied to a pn junction formed by the n$^-$ semiconductor layer 2 within the nMOS region 202 and its surrounding p impurity region 3, and a depletion layer is formed by the RESURF effect in the n$^-$ semiconductor layer between the p impurity region 3 and the n$^+$ impurity region 12, extending to the upper surface of the n$^-$ semiconductor layer. Consequently, the depletion layer is formed almost throughout the n$^-$ semiconductor layer 2 within the nMOS region 202, which achieves the MOS transistor 102 with high breakdown voltage. In FIG. 2, diagonally-shaded RESURF isolation regions 300 and 301 represent the outlines of areas where the depletion layer is formed in the high-potential island region 201 and in the nMOS region 202, respectively.

In the semiconductor device according to the first preferred embodiment, as above described, a high potential is applied to the interconnect line 30. Thus, if the first field plates 55a-55e and the second field plates 60a-60d were not provided unlike in the first preferred embodiment, the potential of the interconnect line 30 would control the extension of the depletion layer in the n$^-$ semiconductor layer 2 between the p impurity region 3 and the n$^+$ impurity region 52, thereby raising the possibility of electric field concentration occurring at the upper surface of the n$^-$ semiconductor layer 2 in the vicinity of the p impurity region 3.

However, in the first preferred embodiment, the capacitive coupling between the second field plates 60a-60d and the first field plates 55a-55e located thereunder can reduce electric field concentration caused at the upper surface of the n$^-$ semiconductor layer 2 by the potential of the interconnect line 30. That is, the capacitive coupling between each of the second field plates 60a-60d and adjacent two of the first field plates 55a-55e located thereunder can reduce the electric field concentration at the upper surface of the n$^-$ semiconductor layer 2 within the high-potential island region 201.

Similarly, in the first preferred embodiment, the capacitive coupling between the second field plates 20a-20d and the first field plates 15a-15e located thereunder can reduce electric field concentration caused at the upper surface of the n$^-$ semiconductor layer 2 within the nMOS region 202 by the potential of the interconnect line 30.

Further in the first preferred embodiment, since the p impurity region 3 and the n$^+$ impurity region 52 are applied with the ground potential and the potential VH, respectively, the first field plate 55a which is closest to the p impurity region 3 and the second field plate 60a which is electrically connected to the first field plate 55a have potentials which are close in value to the ground potential due to the influence of the potential of the p impurity region 3. Also, the first field plate 55e which is closest to the n$^+$ impurity region 52 and the second field plate 60d which is electrically connected to the first field plate 55e have potentials which are close in value to the potential VH due to the influence of the potential of the n$^+$ impurity region 52. Accordingly, the potentials of the first field plates 55a-55e and the second field plates 60a-60d vary from low potential around the ground potential to higher potential of several hundred volts as those field plates are farther from the p impurity region 3 and closer to the n⁺ impurity region 52, because of the capacitive coupling between the field plates.

Further in the first preferred embodiment, since the n⁺ impurity region 12 is applied with the potential VH, the first field plate 15e which is closest to the n⁺ impurity region 12 and the second field plate 20d which is electrically connected to the first field plate 15e have potentials which are close in value to the potential VH due to the influence of the potential of the n⁺ impurity region 12. Also, since the gate electrode 15a is applied with a low potential of several ten volts, the second field plate 20a which is electrically connected to the gate electrode 15a also has a low potential of several ten volts. Accordingly, the potentials of the first field plates 15a-15e and the second field plates 20a-20d vary from low potential of several ten volts to higher potential of several hundred volts as those field plates are farther from the p impurity region 3 and closer to the n⁺ impurity region 12, because of the capacitive coupling between the field plates.

Even if, unlike in the first preferred embodiment, the second field plate 20a were not electrically connected to the gate electrode 15a, the second field plate 20a would have a low potential because of its capacitive coupling with the gate electrode 15a. Similarly, even if the second field plate 20d were not electrically connected to the first field plate 15e, the second field plate 20d would have a high potential. Also, even if the second field plate 60a were not electrically connected to the first field plate 55a, the potential thereof would be low; and even if the second field plate 60d were not electrically connected to the first field plate 55e, the potential thereof would be high.

In this way, in the first preferred embodiment, the low potentials of the second field plates 20a and 60a cause a large potential difference between the interconnect line 30 which is applied with a high potential of several hundred volts, and the second field plates 20a and 60a. Thus, if, unlike in the first preferred embodiment, the second field plates 20a and 60a were not provided with the cut portions 29 and 69a, respectively, there could occur dielectric breakdown of the insulation film 23 sandwiched between the interconnect line 30 and the second field plates 20a and 60a. In the first preferred embodiment, the provision of the cut portions 29 and 69a produces areas where the second field plates 20a and 60a are not formed under the interconnect line 30, thereby preventing dielectric breakdown of the insulation film 23 from occurring due to the potential difference between the interconnect line 30 and the second field plates 20a and 60a.

Further, in the semiconductor device according to the first preferred embodiment, as above described, the electrode 16 is spaced between the first field plates 15a and 15b which are located under the cut portion 29 of the second field plate 20a provided for prevention of dielectric breakdown of the insulation film 23. This, as compared to the case without the electrode 16, reduces electric field concentration caused in the vicinity of the upper surface of the n⁻ semiconductor layer 2 by the potential of the interconnect line 30 applied with a high potential, thereby increasing the breakdown voltage of the semiconductor device according to the first preferred embodiment.

Similarly, since the electrode 56 is spaced between the first field plates 55a and 55b which are located under the cut portion 69a of the second field plate 60a, it is possible, as compared to the case without the electrode 56, to reduce electric field concentration caused in the vicinity of the upper surface of the n⁻ semiconductor layer 2 by the potential of the interconnect line 30, and thereby to increase the breakdown voltage of the semiconductor device according to the first preferred embodiment. This will be described below in detail.

Figure 6:
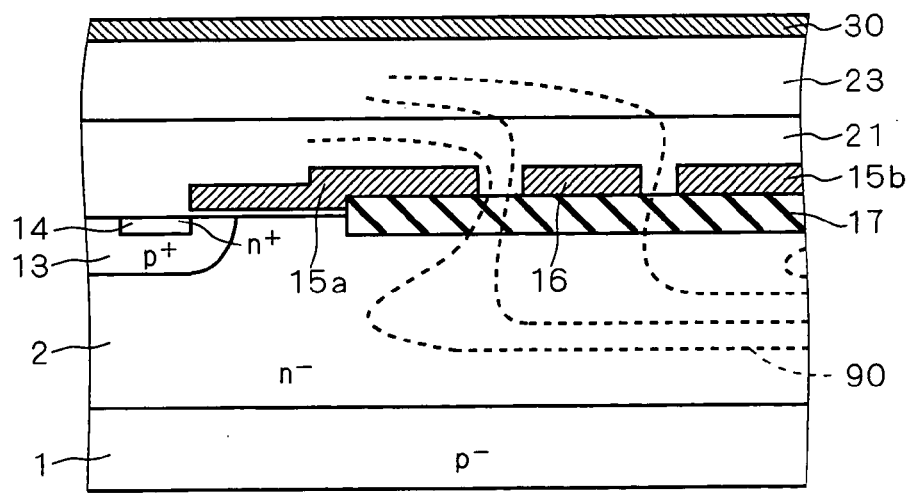
FIGS. 6 and 7 are diagrams illustrating potential distribution in the semiconductor device according to the first preferred embodiment.
Figure 7:
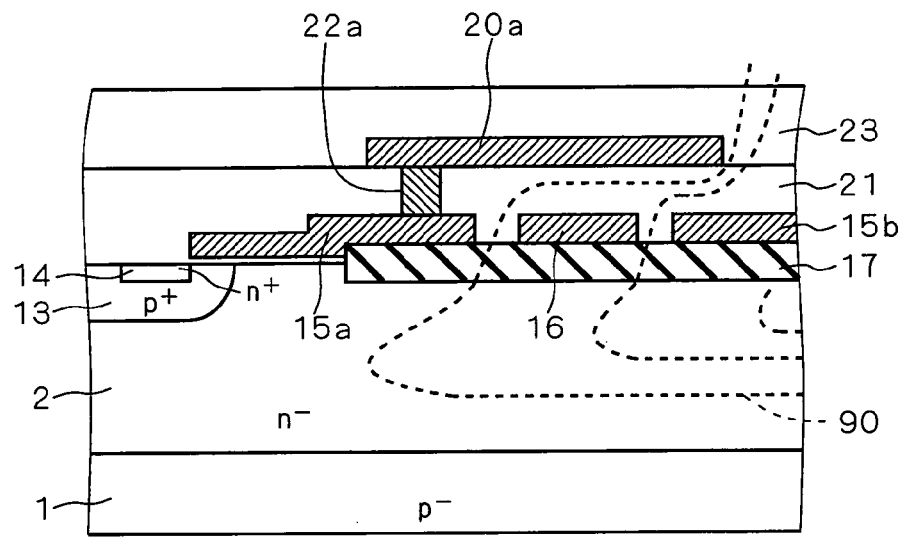
Figure 8:
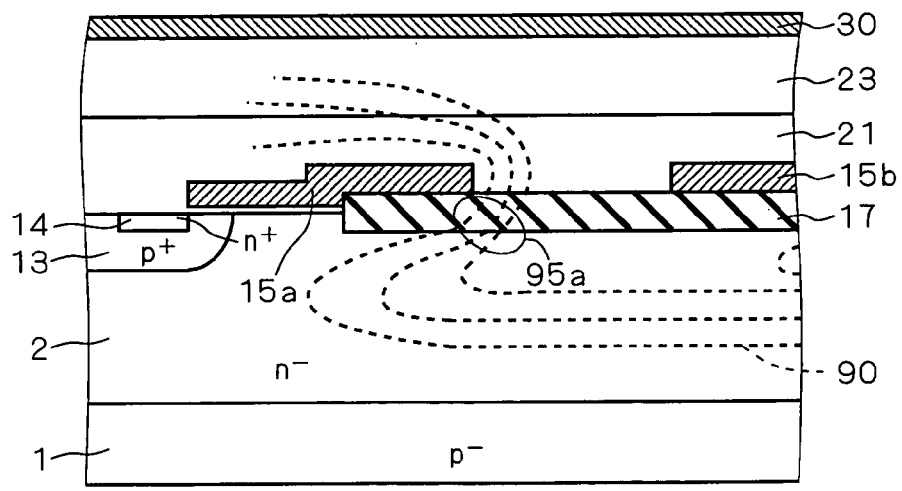
FIGS. 8 through 10 are diagrams illustrating potential distribution in a conventional semiconductor device.
Figure 9:
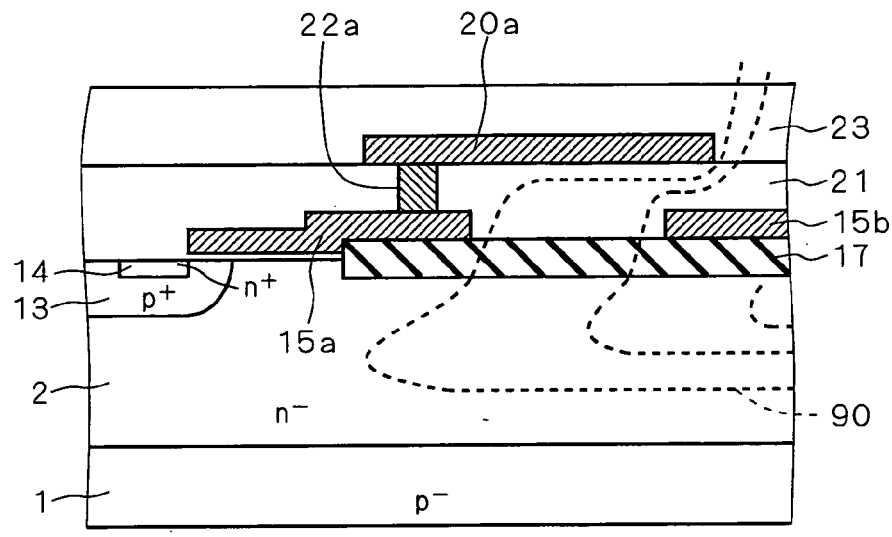

FIGS. 6 and 7 are diagrams illustrating the potential distribution in the semiconductor device according to the first preferred embodiment; and FIGS. 8 and 9 are diagrams illustrating the potential distribution in the semiconductor device without the electrode 16 according to the first preferred embodiment. FIGS. 6 and 8 show the potential distribution in the area where the second field plate 20a is cut off; and FIGS. 7 and 9 show the potential distribution in the area where the second field plate 20a is not cut off.

In the case without the electrode 16 as shown in FIG. 8, because the second field plate 20a is cut off under the interconnect line 30, the potential distribution in the vicinity of the upper surface of the n⁻ semiconductor layer 2 between the gate electrode 15a and the first field plate 15b is influenced by the potential of the interconnect line 30, and equipotential lines 90 get close near the edge of the gate electrode 15a on the side of the first field plate 15b. Accordingly, as shown in FIG. 8, an electric-field concentration area 95a is formed in the vicinity of the upper surface of the n⁻ semiconductor layer 2 near the edge of the gate electrode 15a on the side of the first field plate 15b. This decreases the breakdown voltage of the semiconductor device.

On the other hand, in the case with the electrode 16 as shown in FIG. 6, the electrostatic shielding effect of the electrode 16 can reduce the influence that the potential of the interconnect line 30 has on the potential distribution in the vicinity of the upper surface of the n⁻ semiconductor layer 2, and thereby can facilitate the extension of a depletion layer in the vicinity of the upper surface of the n⁻ semiconductor layer 2. Further, the capacitive coupling of the electrode 16 to the gate electrode 15a, the first field plate 15b, and the upper surface of the n⁻ semiconductor layer 2 allows creation of equipotential surfaces between the gate electrode 15a and the electrode 16 and between the electrode 16 and the first field plate 15b. Accordingly, the equipotential lines 90 become sparse between the gate electrode 15a and the first field plate 15b. This can reduce electric field concentration in the vicinity of the upper surface of the n⁻ semiconductor layer 2 between the gate electrode 15a and the first field plate 15b and can prevent a decrease in breakdown voltage of the semiconductor device caused by the provision of the cut portion 29 of the second field plate 20a. Consequently, a semiconductor device with desired breakdown voltage can easily be achieved.

Since, as above described, the electrode 16 is capacitively coupled to the gate electrode 15a, the first field plate 15b, and the upper surface of the n⁻ semiconductor layer 2, the potential of the electrode 16 is biased to an intermediate potential between the potentials of the gate electrode 15a and the first field plate 15b. Thus, as can be seen from comparison of FIGS. 7 and 9, in the area where the second field plate 20a is not cut off, the potential distribution is not distorted even with the provision of the electrode 16, and thus no electric field concentration will occur.

Also in the n⁻ semiconductor layer 2 within the high-potential island region 201, the provision of the electrode 56 can, for a similar reason, reduce electric field concentration than in the case without the electrode 56, thereby preventing a decrease in breakdown voltage of the semiconductor device.

Figure 10:
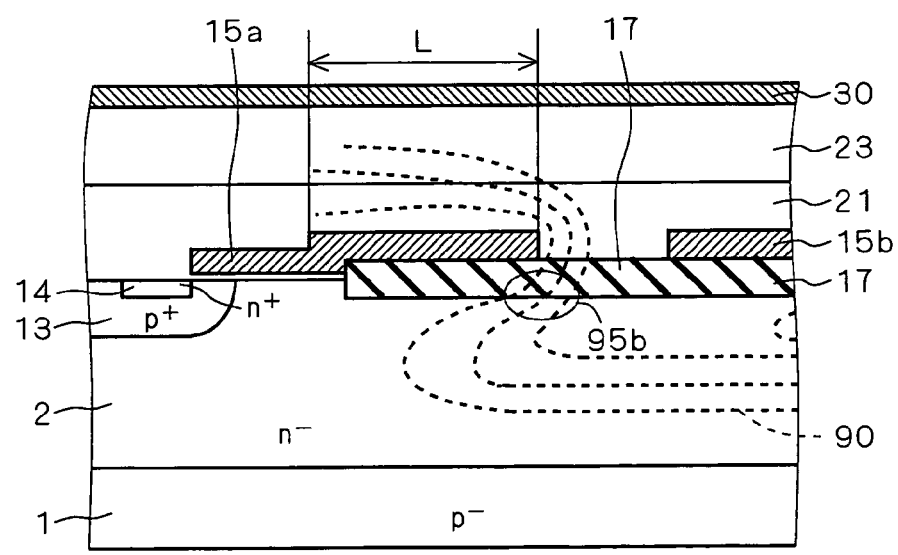

Further, if, as shown in FIG. 10, the edge of the gate electrode 15a on the side of the first field plate 15b were extended toward the first field plate 15b without formation of the electrode 16, it would seem possible to reduce electric field concentration caused by the potential of the interconnect line 30 by using the electrostatic shielding effect of the extended portion of the gate electrode 15a. However, even in this case, as shown in FIG. 10, the equipotential lines 90 get close near the edge of the gate electrode 15a on the side of the first field plate 15b, and an electric-field concentration area 95b is formed in the vicinity of the upper surface of the n⁻ semiconductor layer 2. In the first preferred embodiment, unlike in the aforementioned case, since the electrode 16 is spaced between the gate electrode 15a and the first field plate 15b, it is possible to, as above described, create equipotential surfaces between the gate electrode 15a and the electrode 16 and between the electrode 16 and the first field plate 15b, and thereby to reduce electric field concentration.

Figure 11:
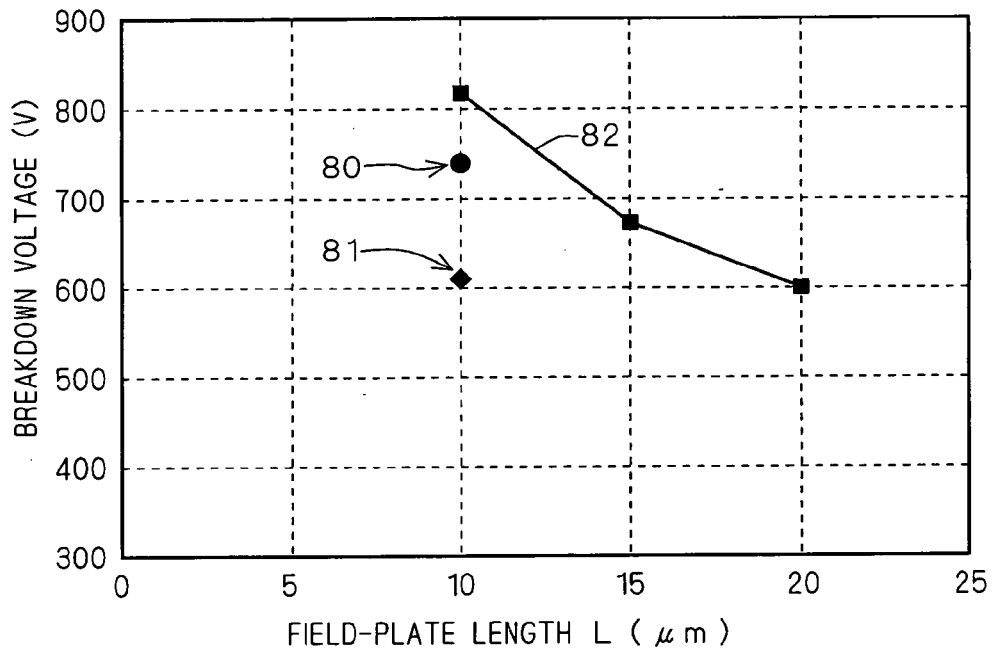
FIG. 11 is a graph showing measured values of the breakdown voltage of the semiconductor device according to the first preferred embodiment of the present invention.

FIG. 11 is a graph showing measured values of the breakdown voltage of the semiconductor device in three cases: where the electrode 16 is formed; where the electrode 16 is not formed; and where the edge of the gate electrode 15a is extended. In the graph, the closed circle refers to the case with the electrode 16, i.e., indicates the breakdown voltage of the semiconductor device according to the first preferred embodiment; and the closed diamond indicates the breakdown voltage in the case without the electrode 16. The closed squares in the graph indicate the breakdown voltage in the case where the edge of the gate electrode 15a on the side of the first field plate 15b is extended toward the first field plate 15b. The field-plate length L on the horizontal axis refers to the length L in FIG. 10. The result of the breakdown voltage in the case where the edge of the gate electrode 15a on the side of the first field plate 15b is extended, indicated by the closed squares, gives values when the interconnect line 30 is not formed.

As shown in FIG. 11, it can be seen from the measured values that the provision of the electrode 16 increases the breakdown voltage. It can also be seen that the breakdown voltage decreases as the edge of the gate electrode 15a on the side of the first field plate 15b gets closer to the first field plate 15b.

Second Preferred Embodiment

Figure 12:
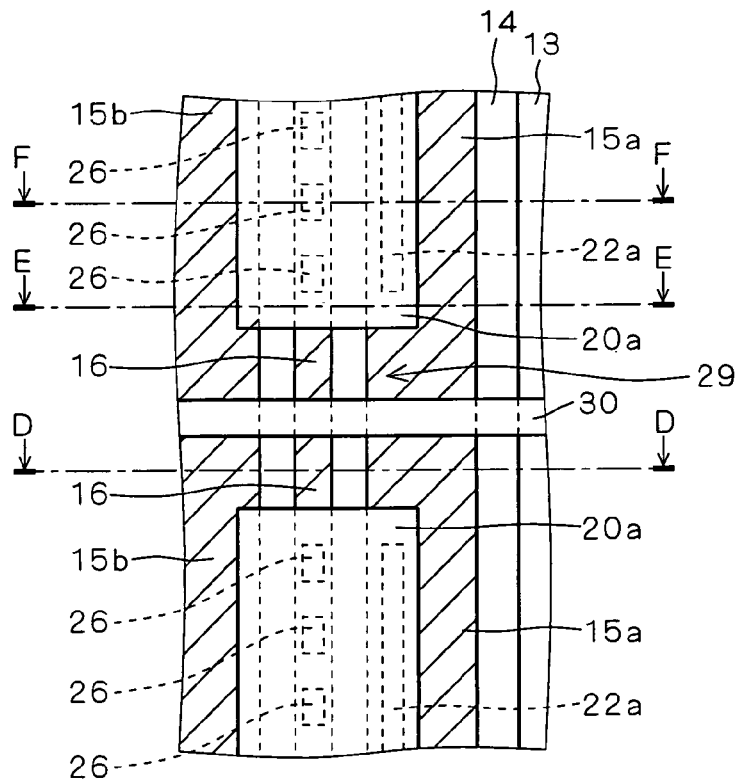
FIG. 12 is a plan view illustrating a configuration of a semiconductor device according to a second preferred embodiment of the present invention.
Figure 15:
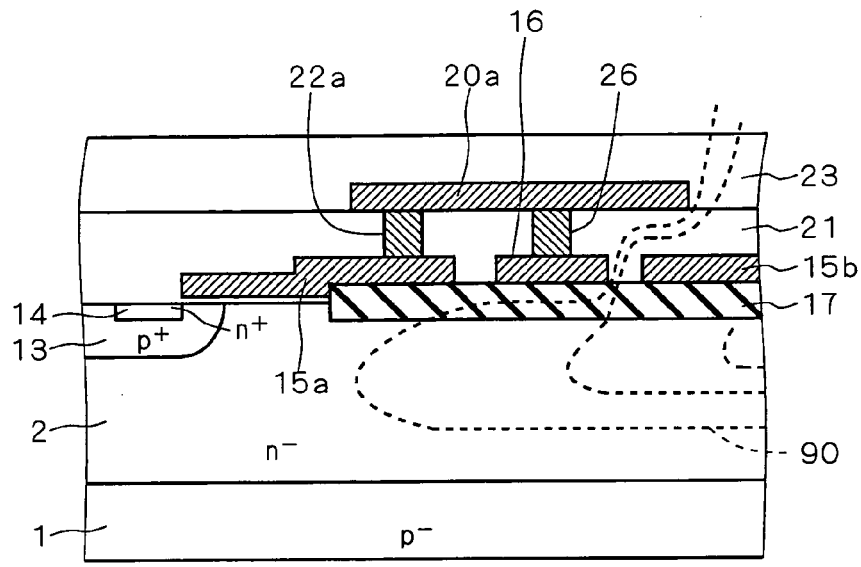

FIG. 12 is a plan view showing schematically a configuration of a semiconductor device according to a second preferred embodiment of the present invention; and FIGS. 13 through 15 are cross-sectional views taken respectively along arrowed lines D-D, E-E, and F-F of FIG. 12. The configuration of the semiconductor device according to the second preferred embodiment is such that, in the semiconductor device according to the aforementioned first preferred embodiment, the electrode 16 is electrically connected to the gate electrode 15a of the MOS transistor 102.

In FIG. 12, the area around the cut portion 29 of the second field plate 20a is shown in enlarged scale, and to avoid complexity of drawing, the insulation films 21 and 23 in FIGS. 13 to 15 are not shown. Further, components which are not visible in plan view are shown by broken lines in FIG. 12.

As shown in FIGS. 12 to 15, the electrode 16 is electrically connected to the second field plate 20a by a plurality of contact plugs 26 which are provided in and through the insulation film 21. The second field plate 20a is electrically connected to the gate electrode 15a by the contact plug 22a. Accordingly, electrical connection is established between the electrode 16 and the gate electrode 15a.

The plurality of contact plugs 26 are spaced from one another along the second field plate 20a. There is no contact plug 26 formed under the interconnect line 30. Thus, the contact plugs 26, like the second field plate 20a, are arranged to almost surround the n⁺ impurity region 12. The other part of the structure is identical to that of the first preferred embodiment and thus not described here.

As described, in the semiconductor device according to the second preferred embodiment, the electrode 16 is electrically connected to the gate electrode 15a. Because the gate electrode 15a is usually applied with the ground potential or a low potential of several ten volts, the potential of the electrode 16 is stabilized.

In the aforementioned first preferred embodiment, the electrode 16 is a floating electrode which is isolated from the surroundings. Thus, the potential thereof is not stable, and there is a possibility of electric field concentration occurring in the vicinity of the upper surface of the n⁻ semiconductor layer 2, depending on the operating conditions of the semiconductor device.

On the other hand, in the semiconductor device according to the second preferred embodiment, the stable potential of the electrode 16 can reduce the occurrence of electric field concentration due to the operating conditions of the semiconductor device.

As indicated by the equipotential lines 90 in FIG. 13, because of the electrical connection between the electrode 16 and the gate electrode 15a, the potential distribution in the area where the second field plate 20a is cut off is different from that shown in the first preferred embodiment. However, because the electrode 16 is spaced between the gate electrode 15a and the first field plate 15b, equipotential surfaces can be created between the gate electrode 15a and the electrode 16 and between the electrode 16 and the first field plate 15b; and therefore, electric field concentration in the area where the second field plate 20a is cut off can be reduced more than in the conventional semiconductor device without the electrode 16.

Similarly, as indicated by the equipotential lines 90 in FIGS. 14 and 15, due to the electrical connection between the electrode 16 and the gate electrode 15a, the potential distribution in the area where the second field plate 20a is formed is different from that shown in the first preferred embodiment. However, because the contact plugs 26 which provide electrical connection between the second field plate 20a and the electrode 16 are spaced from one another, equipotential surfaces can be created between those contact plugs 26; and therefore, even with the electrical connection of the electrode 16 to the gate electrode 15a, no electric field concentration will occur in the area where the second field plate 20a is formed.

Third Preferred Embodiment

Figure 16:
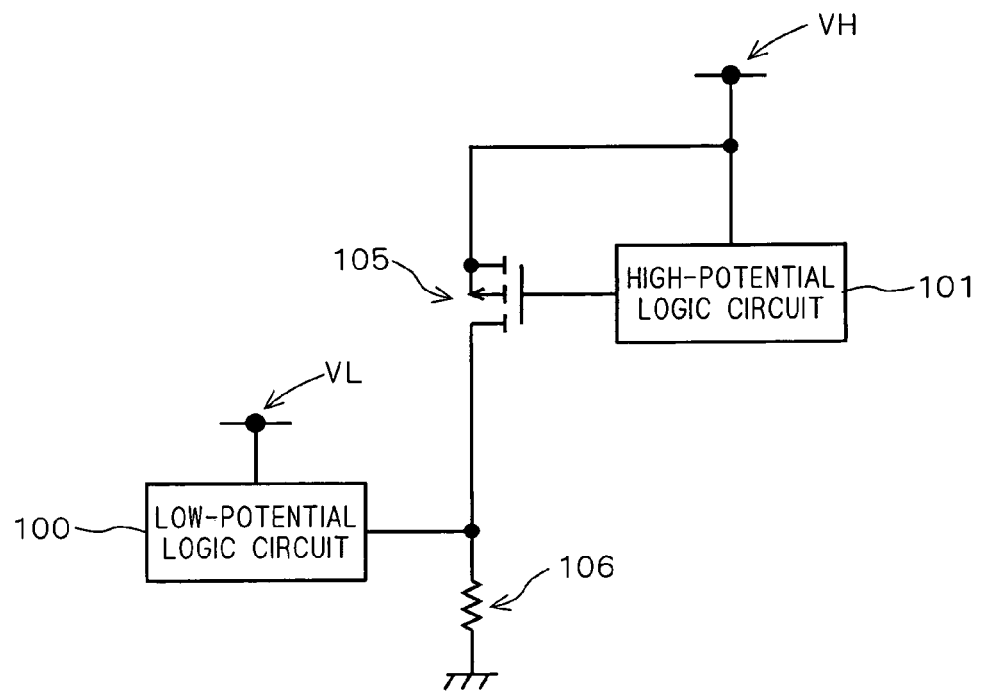
FIG. 16 is a block diagram illustrating a configuration of a semiconductor device according to a third preferred embodiment of the present invention.

FIG. 16 is a block diagram illustrating a configuration of a semiconductor device according to a third preferred embodiment of the present invention. While the semiconductor device of the aforementioned first preferred embodiment includes a level shifting circuit for shifting a low-potential signal to high potential, the semiconductor device according to the third preferred embodiment includes a level shifting circuit for shifting a high-potential signal to low potential.

The semiconductor device according to the third preferred embodiment, like the semiconductor device of the first preferred embodiment, is an HVIC that achieves high breakdown voltage by using the RESURF effect, and as shown in FIG. 16, includes the aforementioned low-potential and high-potential logic circuits 100 and 101, a p-channel MOS transistor 105, and a resistance 106.

The MOS transistor 105 and the resistance 106 level-shift a high-potential signal outputted from the high-potential logic circuit 101 to low potential and input that level-shifted signal to the low-potential logic circuit 100. The MOS transistor 105 is connected at its gate to the high-potential logic circuit 101 and is applied with the potential VH at its source. The MOS transistor 105 is also connected at its drain to the low-potential logic circuit 100 and one end of the resistance 106. The other end of the resistance 106 is applied with the ground potential.

In the semiconductor device with the aforementioned configuration according to the third preferred embodiment, when the high-potential logic circuit 101 outputs a high-level signal, the MOS transistor 105 is in the OFF state, and a low-level signal of the ground potential is inputted to the low-potential logic circuit 100. Then, upon output of a low-level pulse signal from the high-potential logic circuit 101, the MOS transistor 105 is turned on, and current flows through the resistance 106. It causes a potential difference across the resistance 106 and changes the level of an input signal of the low-potential logic circuit 100. Thereby, the high-potential pulse signal outputted from the high-potential logic circuit 101 is converted into a pulse signal of the opposite polarity of low potential and inputted to the low-potential logic circuit 100. Accordingly, the low-potential logic circuit 100 is capable of operating on the basis of a signal outputted from the high-potential logic circuit 101.

Figure 17:
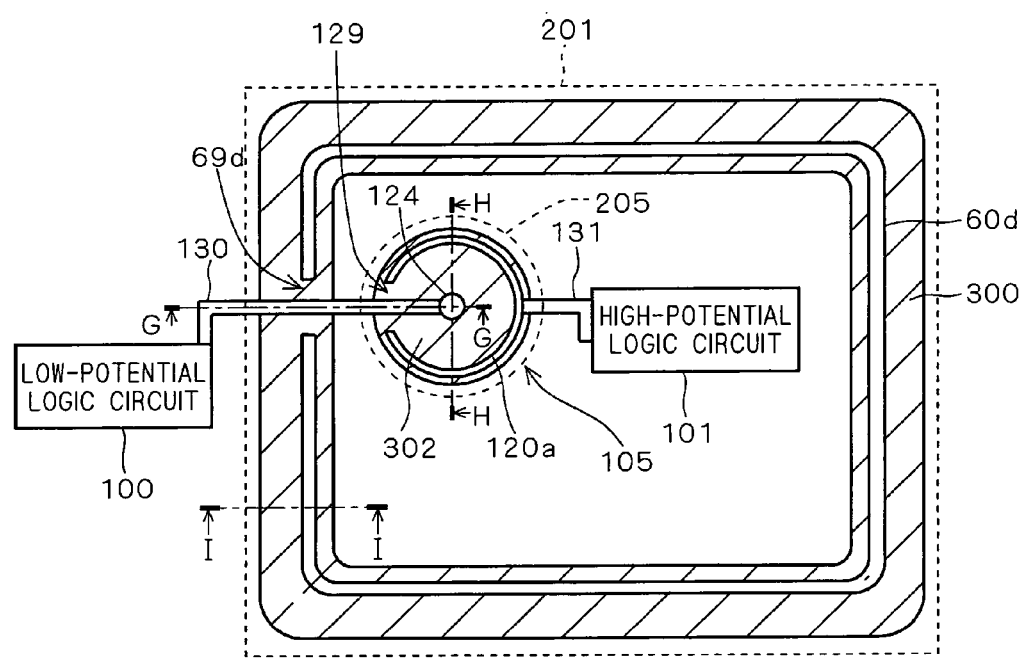
FIG. 17 is a plan view illustrating the configuration of the semiconductor device according to the third preferred embodiment of the present invention.
Figure 18:
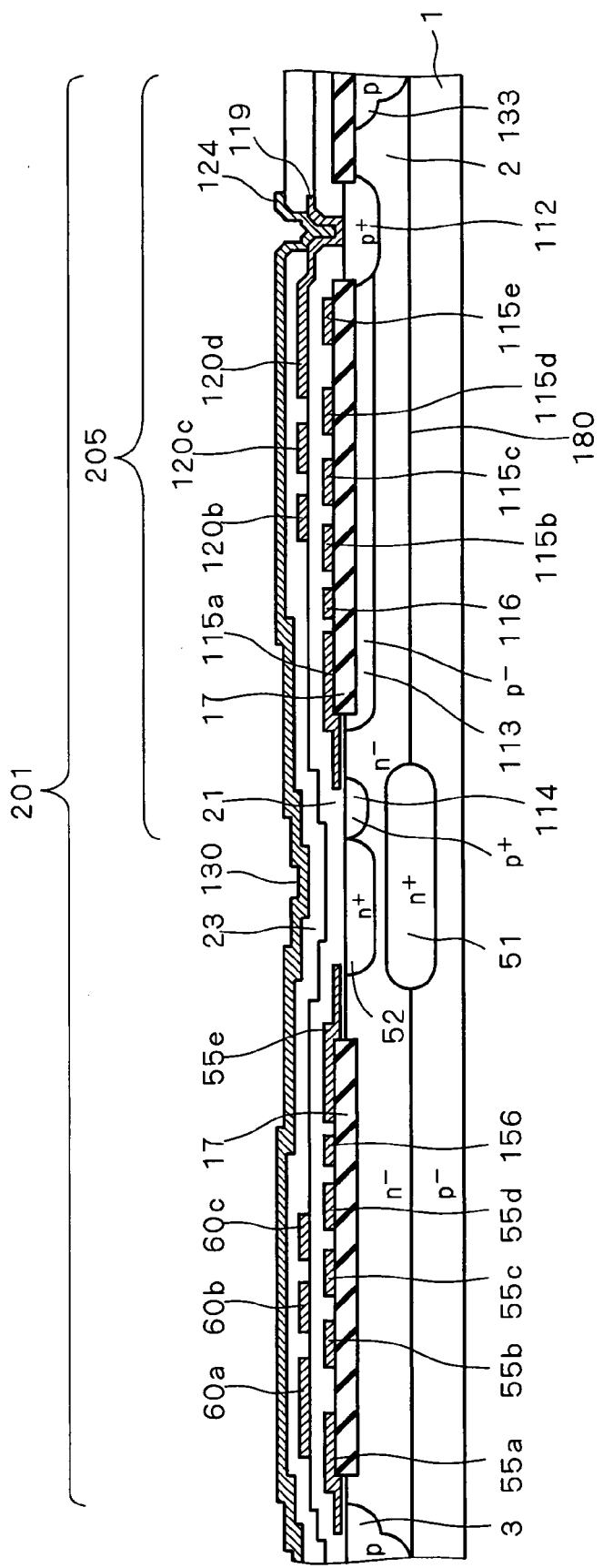
FIGS. 18 to 20 are cross-sectional views illustrating the configuration of the semiconductor device according to the third preferred embodiment of the present invention.
Figure 19:
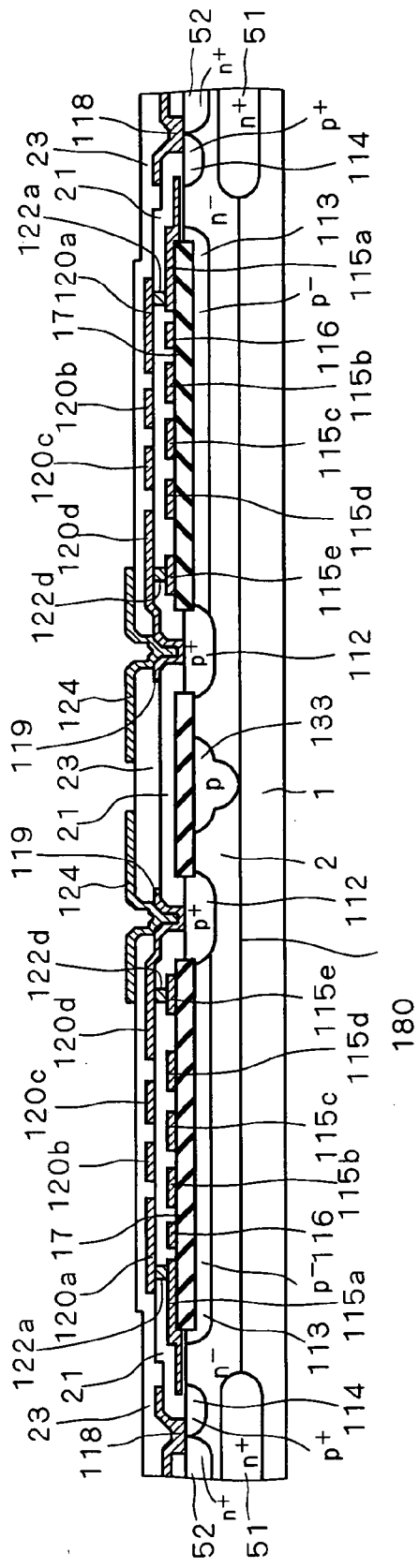
Figure 20:
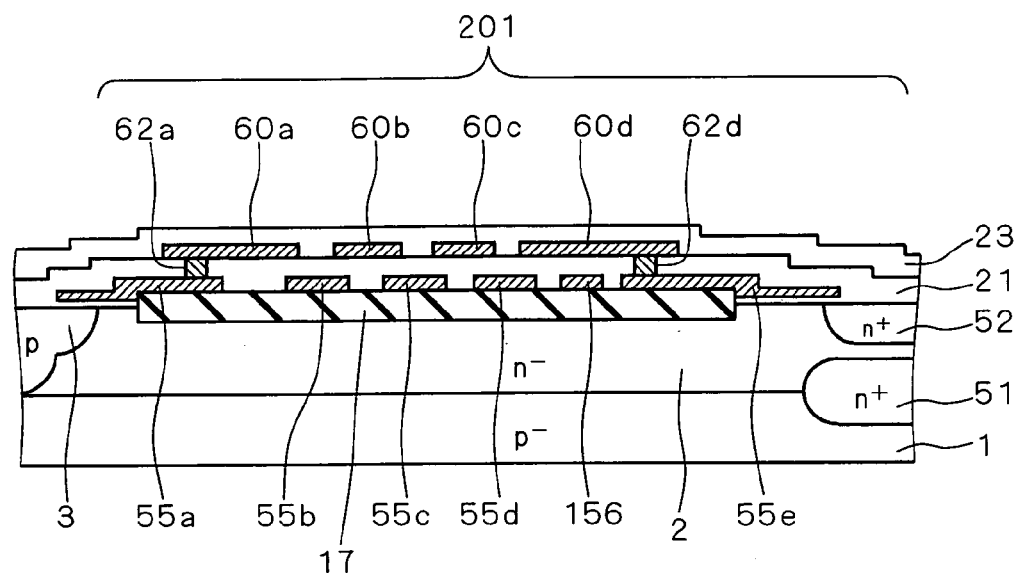

Next, the configuration of the semiconductor device according to the third preferred embodiment is described. FIG. 17 is a plan view illustrating schematically the configuration of the semiconductor device according to the third preferred embodiment; and FIGS. 18 through 20 are cross-sectional views taken respectively along arrowed lines G-G, H-H, and I-I of FIG. 17. In FIG. 17, in order to avoid complexity of drawing, the insulation film 23 in FIGS. 18 to 20 is not shown, and only two of field plates, namely 120$d$ and 60$d$, formed on the insulation film 21 are shown.

As shown in FIGS. 17 to 20, in the semiconductor device according to the third preferred embodiment, as in that of the first preferred embodiment, the n$^-$ semiconductor layer 2 is formed on the p$^-$ semiconductor substrate 1. In the n$^-$ semiconductor layer 2, the p impurity region 3 is formed, extending from the upper surface of the n$^-$ semiconductor layer 2 to the interface with the p$^-$ semiconductor substrate 1. The p impurity region 3, as in the first preferred embodiment, is formed to surround part of the n$^-$ semiconductor layer 2 to define in the n$^-$ semiconductor layer 2 the high-potential island region 201 where the high-potential logic circuit 101 is located.

At the interface between the n$^-$ semiconductor layer 2 and the p$^-$ semiconductor substrate 1 within the high-potential island region 201, the n$^+$ buried impurity region 51 is selectively formed. The n$^+$ buried impurity region 51 according to the third preferred embodiment is not formed at the interface between the peripheral edge of the n$^-$ semiconductor layer 2 and the p$^-$ semiconductor substrate 1 within the high-potential island region 201. And further as shown in FIG. 19, the n$^+$ buried impurity region 51 is formed to surround a portion 180 of the interface between the n$^-$ semiconductor layer 2 and the p$^-$ semiconductor substrate 1 within the high-potential island region 201. In the n$^-$ semiconductor layer 2 above the n$^+$ buried impurity region 51, the high-potential logic circuit 101 is formed.

In the upper surface of the n$^-$ semiconductor layer 2 within the high-potential island region 201, the n$^+$ impurity region 52 is formed. The n$^+$ impurity region 52 according to the third preferred embodiment is formed above the n$^+$ buried impurity region 51, avoiding where the high-potential logic circuit 101 is formed, to surround the high-potential logic circuit 101 when viewed in plan. Thus, the n$^+$ impurity region 52 is formed partly in the n$^-$ semiconductor layer 2 between the p impurity region 3 and the high-potential logic circuit 101.

Further, the n$^+$ impurity region 52 is formed to surround the portion 180 of the above interface surrounded by the n$^+$ buried impurity region 51, when viewed in plan. This defines a pMOS region 205 where the MOS transistor 105 is formed, in the n$^-$ semiconductor layer 2 within the high-potential island region 201.

As shown in FIGS. 18 and 20, on the upper surface of the n$^-$ semiconductor layer 2 between the n$^+$ impurity region 52 and the p impurity region 3, the isolation insulating film 17 is formed on which the first field plates 55$a$-55$e$ are formed. The first field plates 55$a$-55$e$ are identical in structure to those of the first preferred embodiment and thus not described here.

An electrode 156 which is isolated from the surroundings is located in a space between the first field plate 55$e$ which is closest to the n$^+$ impurity region 52, and its adjacent first field plate 55$d$, out of the first field plates 55$a$-55$e$. The electrode 156 is spaced between the first field plates 55$d$ and 55$e$ on the isolation insulating film 17 to surround the high-potential logic circuit 101 when viewed in plan.

The electrode 156 serves as a field plate. The first field plates 55$a$-55$e$ and the electrode 156 are capacitively coupled to one another as well as to the upper surface of the n$^-$ semiconductor layer 2, thereby performing the function of reducing electric field concentration at the upper surface of the n$^-$ semiconductor layer 2.

As shown in FIG. 19, a p impurity region 133 is formed in the n$^-$ semiconductor layer 2 within the pMOS region 205, extending from the upper surface of the n$^-$ semiconductor layer 2 to the central part of the portion 180 of the above interface surrounded by the n$^+$ buried impurity region 51. In the upper surface of the n$^-$ semiconductor layer 2 between the p impurity region 133 and the n$^+$ impurity region 52, a p$^+$ impurity region 112 which is electrically connected to a drain electrode 124 of the MOS transistor 105 is formed apart from the p impurity region 133. The p$^+$ impurity region 112 is formed to surround the p impurity region 133 when viewed in plan.

In the upper surface of the n$^-$ semiconductor layer 2 between the p$^+$ impurity region 112 and the n$^+$ impurity region 52, a p$^-$ impurity region 113 is formed in connection with the p$^+$ impurity region 112, to surround the p impurity region 133 when viewed in plan. In the upper surface of the n$^-$ semiconductor layer 2 above the n$^+$ buried impurity region 51 and between the p$^-$ impurity region 113 and the n$^+$ impurity region 52, a source region 114 of the MOS transistor 105 is spaced a predetermined distance from the p$^-$ impurity region 113. The source region 114 is connected to the n$^+$ impurity region 52 and surrounds the p impurity region 133 when viewed in plan. The source region 114 is a p$^+$ impurity region.

On the upper surface of the n$^-$ semiconductor layer 2 between the source region 114 and the p$^+$ impurity region 112 which is electrically connected to the drain electrode 124, the isolation insulating film 17 is formed. More specifically, the isolation insulating film 17 is formed on the upper surface of the p$^-$ impurity region 113 which is formed in the upper surface of the n$^-$ semiconductor layer 2. On the isolation insulating film 17, a gate electrode 115$a$ of the MOS transistor 105 and first field plates 115$b$, 115$c$, 115$d$, and 115$e$ are formed.

The gate electrode 115a and the first field plates 115b-115e are spaced from one another in order along a direction from the n⁺ impurity region 52 to the p⁺ impurity region 112, to surround the p impurity region 133 when viewed in plan.

The gate electrode 115a also extends from the isolation insulating film 17 toward the source region 114 to cover, without contact, the upper surface of the n⁻ semiconductor layer 2 which is sandwiched between the source region 114 and the p⁻ impurity region 113. There exists a gate insulating film on the upper surface of the n⁻ semiconductor layer 2 which is covered with the gate electrode 115a and which is sandwiched between the source region 114 and the p⁻ impurity region 113; however, in the drawings, this gate insulating film is included in and shown as the insulation film 21.

An electrode 116 which is isolated from the surroundings is located in a space between the gate electrode 115a which is closest to the n⁺ impurity region 52, and its adjacent first field plate 115b, out of the gate electrode 115a and the first field plates 115b-115e. The electrode 116 is spaced between the gate electrode 115a and the first field plate 115b on the isolation insulating film 17 to surround the p impurity region 133 when viewed in plan.

The gate electrode 115a and the electrode 116 serve as field plates. The gate electrode 115a, the first field plates 115b-115e, and the electrode 116 are capacitively coupled to one another as well as to the upper surface of the n⁻ semiconductor layer 2, thereby performing the function of reducing electric field concentration caused at the upper surface of the n⁻ semiconductor layer 2 by the potential difference between the source region 114 and the p⁺ impurity region 112 which is electrically connected to the drain electrode 124. Serving also as a field plate, the gate electrode 115a is hereinafter referred to also as the "first field plate 115a".

In the n⁻ semiconductor layer 2 outside the high-potential island region 201, the low-potential logic circuit 100 and a p⁺ impurity region (not shown) serving as the resistance 106 are formed. The n⁻ semiconductor layer 2 where the low-potential logic circuit 100 and the like are formed, and the n⁻ semiconductor layer 2 within the high-potential island region 201 are divided by the p impurity region 3.

On the n⁻ semiconductor layer 2 and the isolation insulating film 17, the insulation film 21 is formed to cover the first field plates 55a-55e and 115a-115e and the electrodes 116 and 156. Then, an electrode 119 and a source electrode 118 of the MOS transistor 105 are provided in and through the insulation film 21. The source electrode 118 is in contact with the n⁺ impurity region 52 and the source region 114, and the electrode 119 is in contact with the p⁺ impurity region 112. The source electrode 118 and the electrode 119 are formed to surround the p impurity region 133 when viewed in plan.

On the insulation film 21, the second field plates 60a-60d and second field plates 120a, 120b, 120c, and 120d are formed. The second field plates 60a-60d are formed above the first field plates 55a-55e and spaced from one another in order along a direction from the p impurity region 3 to the n⁺ impurity region 52. As in the first preferred embodiment, the second field plates 60a-60d respectively are located above spaces between the first field plates 55a-55e. When viewed in plan, each of the second field plates 60a-60d is formed to overlap the edges of adjacent two of the first field plates located thereunder.

Of the second field plates 60a-60d, the second field plates 60a-60c completely surround the high-potential logic circuit 101 when viewed in plan. The remaining second field plate 60d, as shown in FIG. 17, has a cut portion 69d under an interconnect line 130 and thus almost surrounds the high-potential logic circuit 101, except the cut portion 69d, when viewed in plan.

The second field plates 120a-120d are formed above the first field plates 115a-115e and spaced from one another in order along a direction from the n⁺ impurity region 52 to the p⁺ impurity region 112. The second field plates 120a-120d respectively are located above spaces between the first field plates 115a-115e. That is, any one of the second field plates 120a-120d is located above a space between any adjacent pair of the first field plates 115a-115e. When viewed in plan, each of the second field plates 120a-120d is formed to overlap the edges of adjacent two of the first field plates located thereunder.

Of the second field plates 120a-120d, the second field plates 120b-120d completely surround the p impurity region 133 when viewed in plan. The remaining second field plate 120a, as shown in FIG. 17, has a cut portion 129 under the interconnect line 130 and thus almost surrounds the p impurity region 133, except the cut portion 129, when viewed in plan. Further, the second field plate 120d is connected to the electrode 119.

The gate electrode 115a and the second field plate 120a are electrically connected to each other by a contact plug 122a which is provided in and through the insulation film 21; and the first field plate 115e and the second field plate 120d are electrically connected to each other by a contact plug 122d which is provided in and through the insulation film 21. The first field plate 55a and the second field plate 60a are electrically connected to each other by the contact plug 62a which is provided in and through the insulation film 21; and the first field plate 55e and the second field plate 60d are electrically connected to each other by the contact plug 62d which is provided in and through the insulation film 21.

The contact plugs 122a and 122d extend along the second field plates 120a and 120d, respectively, and do not extend under the interconnect line 130. Thus, the contact plugs 122a and 122d, like the second field plate 120a, almost surround the p impurity region 133. The contact plugs 62a and 62d, as in the first preferred embodiment, extend along the second field plates 60a and 60d, respectively, and do not extend under the interconnect line 130.

The first field plates 55b-55d and 115b-115d and the second field plates 60b, 60c, 120b, and 120c are floating electrodes which are isolated from the surroundings. The first field plate 115a and the second field plate 120a are also floating electrodes, because they are isolated from the surroundings, except that they are connected to each other. Also, as in the first preferred embodiment, the first field plate 55a and the second field plate 60a, and the first field plate 55e and the second field plate 60d, each pair are floating electrodes, because they are isolated from the surroundings, except that they are connected to each other.

On the insulation film 21, the insulation film 23 is formed to cover the source electrode 118, the electrode 119, and the second field plates 60a-60d and 120a-120d. Then, the drain electrode 124 of the MOS transistor 105 is provided in and through the insulation film 23 so as to be in contact with the electrode 119. In this way, electrical connection is established between the p⁺ impurity region 112 and the drain electrode 124 of the MOS transistor 105.

On the insulation film 23, the interconnect line 130 is formed which provides electrical connection between the drain electrode 124 and the low-potential logic circuit 100. Thereby, as shown in FIG. 16, connection is established between the drain of the MOS transistor 105 and the low-potential logic circuit 100. The interconnect line 130 starting from the drain electrode 124 extends to the low-potential logic circuit 100, passing over the first field plates 115a-115e and the second field plates 120b-120d, over the first field plates 55a-55e and the second field plates 60a-60c, and over the p impurity region 3 which defines the high-potential island region 201.

On the insulation film 23, an interconnect line 131 is also formed which provides electrical connection between the second field plate 120a and the high-potential logic circuit 101. The interconnect line 131 and the second field plate 120a are electrically connected to each other by a contact plug which is not shown but provided through the insulation film 23. Thereby, a signal from the high-potential logic circuit 101 is given to the gate electrode 115a of the MOS transistor 105 through the second field plate 120a. On the insulation film 23, there is also provided an interconnect line which is not shown but electrically connects the interconnect line 130 and the p$^+$ impurity region serving as the resistance 106. That interconnect line is connected to an electrode which is provided in contact with the p$^+$ impurity region formed through the insulation films 21 and 23 and serving as the resistance 106.

The gate electrode 115a, the first field plates 115b-115e, and the electrodes 116 and 156 are formed of, for example, polysilicon, and the second field plates 120a-120d and the interconnect lines 130 and 131 are formed of, for example, aluminum.

In the semiconductor device with the aforementioned configuration according to the third preferred embodiment, the potential VH is applied to the source electrode 118 of the MOS transistor 105, and the ground potential is applied to the edge of the p$^+$ impurity region serving as the resistance 106. Thus, when a high-level signal of several hundred volts is outputted from the high-potential logic circuit 101, the MOS transistor 105 is turned off, and no current flows through the p$^+$ impurity region serving as the resistance 106. Accordingly, the ground potential is applied to the interconnect line 130.

When a low-level pulse signal is outputted from the high-potential logic circuit 101, that signal is given to the gate electrode 115a through the interconnect line 131, the second field plate 120a, and the contact plug 122a. Thereby, the MOS transistor 105 is turned on, and current flows through the p$^+$ impurity region serving as the resistance 106, which increases the potential at the edge of the p$^+$ impurity region on the side of the low-potential logic circuit 100, to up to several ten volts. As a result, a high-potential signal outputted from the high-potential logic circuit 101 is level-shifted to low potential and inputted to the low-potential logic circuit 100.

In the on-state MOS transistor 105, current flows from the source electrode 118 through the source region 114, the n$^-$ semiconductor layer 2, the p$^-$ impurity region 113, the p$^+$ impurity region 112, and the electrode 119 in sequence to the drain electrode 124. Further in the MOS transistor 105, since the p$^-$ impurity region 113 serves as a resistance, the potential of the drain electrode 124 will increase to up to only several ten volts. Thus, the interconnect line 130 will have a low potential of up to several ten volts.

In the semiconductor device according to the third preferred embodiment, the ground potential is applied to the p impurity regions 3 and 133, the p$^-$ impurity region 113, and the p$^-$ semiconductor substrate 1, and the potential VH is applied to the n$^-$ semiconductor layer 2, the n$^+$ buried impurity region 51, and the n$^+$ impurity region 52 which are all within the high-potential island region 201. Thereby, as in the first preferred embodiment, a depletion layer is formed by the RESURF effect in the n$^-$ semiconductor layer 2 between the p impurity region 3 and the n$^+$ impurity region 52, extending to the upper surface of the n$^-$ semiconductor layer 2. Consequently, the high-potential logic circuit 101 is surrounded by the depletion layer, thereby achieving high breakdown voltage.

Further, since, as above described, the p impurity region 133 and the p$^-$ impurity region 113 are applied with the ground potential and the n$^-$ semiconductor layer 2 with the potential VH, a depletion layer is formed by the RESURF effect in the n$^-$ semiconductor layer 2 between the p impurity region 133 and the n$^+$ impurity region 52 and in the p$^-$ impurity region 113, extending to the upper surfaces of the n$^-$ semiconductor layer 2 and the p$^-$ impurity region 113. Thus, the depletion layer is formed almost throughout the n$^-$ semiconductor layer 2 within the pMOS region 205 where the MOS transistor 105 is formed. This results in the MOS transistor 105 with high breakdown voltage. In FIG. 17, diagonally-shaded RESURF isolation regions 300 and 302 represent the outlines of areas where the depletion layer is formed in the semiconductor device according to the present invention.

In the semiconductor device according to the third preferred embodiment, as above described, a low potential is applied to the interconnect line 130. Thus, if the first field plates 55a-55e and the second field plates 60a-60d were not provided unlike in the third preferred embodiment, the potential of the interconnect line 130 would facilitate the extension of the depletion layer in the n$^-$ semiconductor layer 2 between the p impurity region 3 and the n$^+$ impurity region 52, thereby raising the possibility of electric field concentration occurring at the upper surface of the n$^-$ semiconductor layer 2 in the vicinity of the n$^+$ impurity region 52.

However, in the third preferred embodiment, the capacitive coupling between the second field plates 60a-60d and the first field plates 55a-55e located thereunder can reduce electric field concentration caused in the vicinity of the upper surface of the n$^-$ semiconductor layer 2 by the potential of the interconnect line 130.

Similarly, in the third preferred embodiment, the capacitive coupling between the second field plates 120a-120d and the first field plates 115a-115e located thereunder can reduce electric field concentration caused in the vicinity of the upper surface of the n$^-$ semiconductor layer 2 by the potential of the interconnect line 130.

Further in the third preferred embodiment, since the p impurity region 3 and the n$^+$ impurity region 52 are applied with the ground potential and the potential VH, respectively, as described in the first preferred embodiment, the first field plate 55a and the second field plate 60a have potentials which are close in value to the ground potential, and the first field plate 55e and the second field plate 60d have potentials which are close in value to the potential VH. Accordingly, the potentials of the first field plates 55a-55e and the second field plates 60a-60d vary from low potential around the ground potential to higher potential of several hundred volts as those field plates are farther from the p impurity region 3 and closer to the n$^+$ impurity region 52, because of the capacitive coupling between the field plates.

Further in the third preferred embodiment, since the p$^+$ impurity region 112 is applied with a low potential of up to several ten volts, the first field plate 115e and the second field plate 120d which are electrically connected to the p$^+$ impurity region 112 have low potentials of up to several ten volts. Also, since the gate electrode 115a is applied with a high potential of several hundred volts, the second field plate 120a which is electrically connected to the gate electrode 115a has a high potential of several hundred volts. Accordingly, the potentials of the first field plates 115a-115e and the second field plates 120a-120d vary from high potential of several hundred volts to lower potential of several ten volts as those field plates are farther from the $n^+$ impurity region 52 and closer to the $p^+$ impurity region 112, because of the capacitive coupling between the field plates.

Even if, unlike in the third preferred embodiment, the second field plate 120a were not electrically connected to the gate electrode 115a, the second field plate 120a would have a high potential because of its capacitive coupling with the gate electrode 115a. Similarly, even if the second field plate 120d were not electrically connected to the electrode 119, the first field plate 115e which is located closest to the $p^+$ impurity region 112 would have a low potential due to the influence of the potential of the $p^+$ impurity region 112, and the second field plate 120d would also have a low potential because of its capacitive coupling with the first field plate 115e.

In this way, in the third preferred embodiment, the high potentials of the second field plates 60d and 120a cause a large potential difference between the interconnect line 130 which is applied with a low potential of up to several ten volts, and the second field plates 60d and 120a. Thus, if, unlike in the third preferred embodiment, the second field plates 60d and 120a were not provided with the cut portions 69d and 129, respectively, there could occur dielectric breakdown of the insulation film 23 sandwiched between the interconnect line 130 and the second field plates 60d and 120a. In the third preferred embodiment, the provision of the cut portions 69d and 129 produces areas where the second field plates 60d and 120a are not formed under the interconnect line 130, thereby preventing dielectric breakdown of the insulation film 23 from occurring due to the potential difference between the interconnect line 130 and the second field plates 60d and 120a.

Further in the semiconductor device according to the third preferred embodiment, the electrode 116 is spaced between the first field plates 115a and 115b which are located under the cut portion 129 of the second field plate 120a provided for prevention of dielectric breakdown of the insulation film 23. This, as compared to the case without the electrode 116, reduces electric field concentration caused in the vicinity of the upper surface of the $n^-$ semiconductor layer 2 by the potential of the interconnect line 130 applied with a low potential, thereby increasing the breakdown voltage of the semiconductor device according to the third preferred embodiment.

Similarly, since the electrode 156 is spaced between the first field plates 55d and 55e under the cut portion 69d of the second field plate 60d, it is possible, as compared to the case without the electrode 156, to reduce electric field concentration caused in the vicinity of the upper surface of the $n^-$ semiconductor layer 2 by the potential of the interconnect line 130, and thereby to increase the breakdown voltage of the semiconductor device according to the third preferred embodiment.

Figure 21:
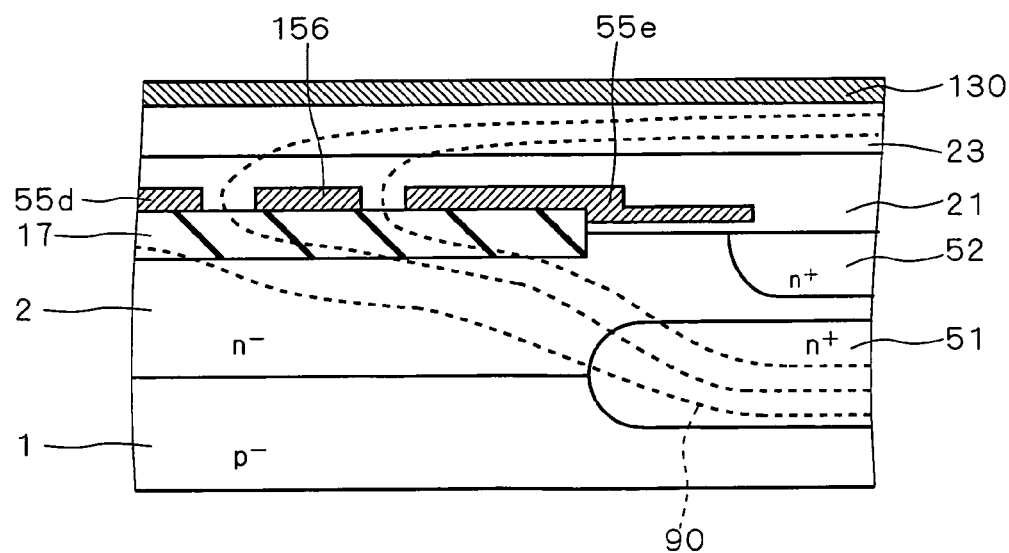
FIGS. 21 and 22 are diagrams illustrating potential distribution in the semiconductor device according to the third preferred embodiment of the present invention.
Figure 22:
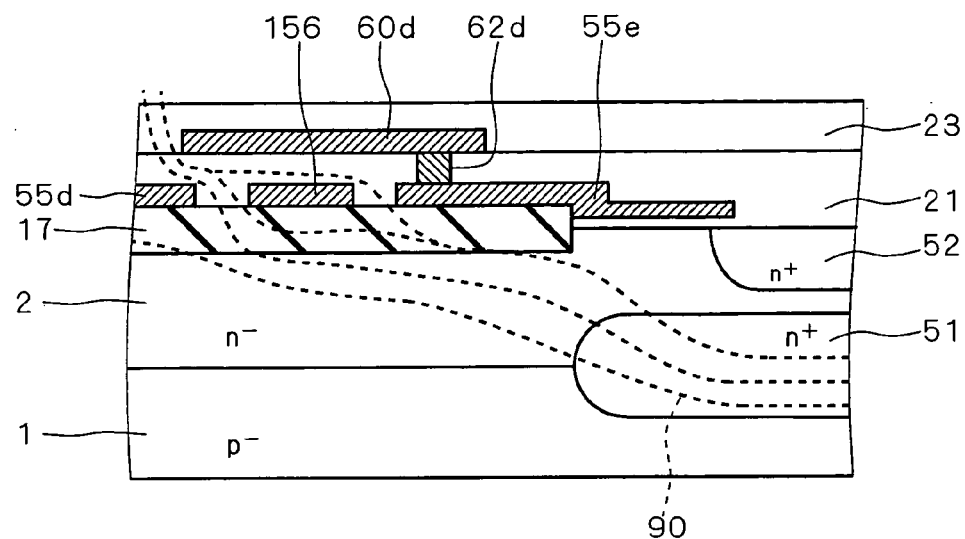
Figure 23:
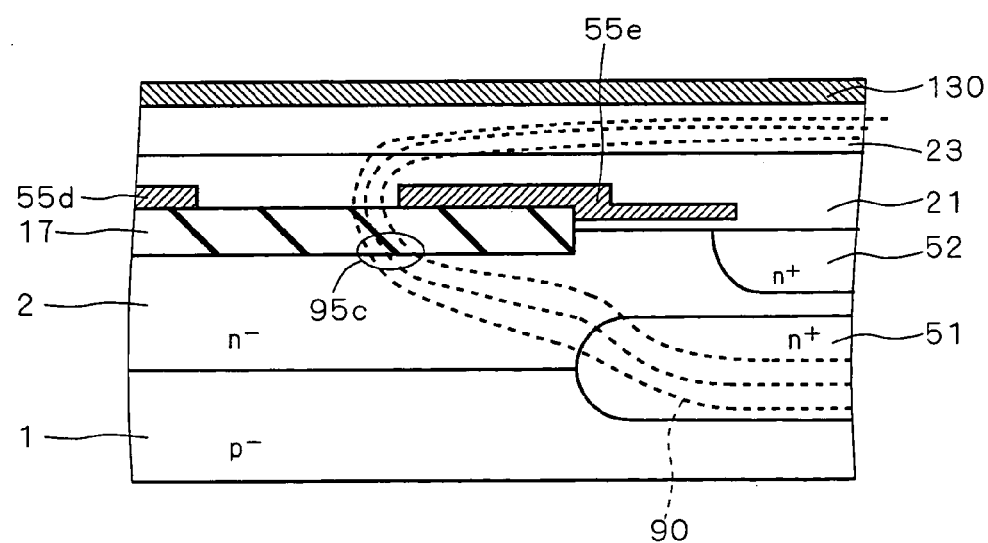
FIG. 23 is a diagram illustrating potential distribution in a conventional semiconductor device.

FIGS. 21 and 22 are diagrams illustrating the potential distribution in the semiconductor device according to the third preferred embodiment; and FIG. 23 is a diagram illustrating the potential distribution in the semiconductor device without the electrode 156 according to the third preferred embodiment. FIGS. 21 and 23 show the potential distribution in the area where the second field plate 60d is cut off; and FIG. 22 shows the potential distribution in the area where the second field plate 60d is not cut off.

In the case without the electrode 156 as shown in FIG. 23, because the second field plate 60d is cut off under the interconnect line 130, the potential distribution in the vicinity of the upper surface of the $n^-$ semiconductor layer 2 between the first field plates 55d and 55e is influenced by the potential of the interconnect line 130, and the equipotential lines 90 get close near the edge of the first field plate 55e on the side of the first field plate 55d. Accordingly, as shown in FIG. 23, an electric-field concentration area 95c is formed in the vicinity of the upper surface of the $n^-$ semiconductor layer 2 near the edge of the first field plate 55e on the side of the first field plate 55d. This decreases the breakdown voltage of the semiconductor device.

On the other hand, in the case with the electrode 156 as shown in FIG. 21, the electrostatic shielding effect of the electrode 156 can reduce the influence that the potential of the interconnect line 130 has on the potential distribution in the vicinity of the upper surface of the $n^-$ semiconductor layer 2, and thereby can control the extension of a depletion layer. Further, the capacitive coupling of the electrode 156 to the first field plates 55d and 55e and to the upper surface of the $n^-$ semiconductor layer 2 allows creation of equipotential surfaces between the first field plate 55d and the electrode 156 and between the electrode 156 and the first field plate 55e. Accordingly, the equipotential lines 90 become sparse between the first field plates 55d and 55e. This can reduce electric field concentration in the vicinity of the upper surface of the $n^-$ semiconductor layer 2 between the first field plates 55d and 55e and can prevent a decrease in breakdown voltage of the semiconductor device caused by the provision of the cut portion 69d of the second field plate 60d. Consequently, a semiconductor device with desired breakdown voltage can easily be achieved.

Since, as above described, the electrode 156 is capacitively coupled to the first field plates 55d and 55e and the upper surface of the $n^-$ semiconductor layer 2, the potential of the electrode 156 is biased to an intermediate potential between the potentials of the first field plates 55d and 55e. Thus, as shown in FIG. 22, in the area where the second field plate 60d is not cut off, the potential distribution is not distorted even with the provision of the electrode 156, and thus no electric field concentration will occur.

Also in the $n^-$ semiconductor layer 2 within the pMOS region 205, the provision of the electrode 116 can, for a similar reason, reduce electric field concentration than in the case without the electrode 116, thereby preventing a decrease in breakdown voltage of the semiconductor device.

Figure 24:
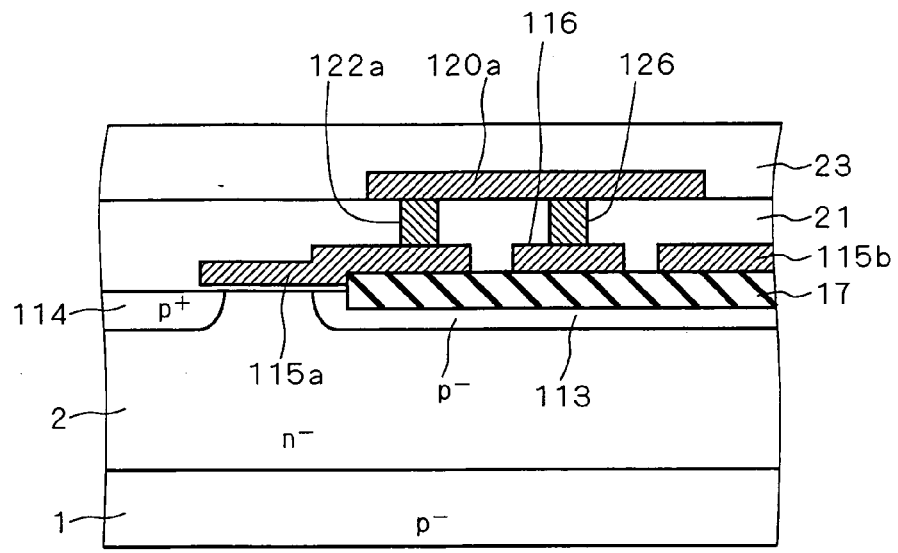
FIG. 24 is a cross-sectional view illustrating a configuration of another semiconductor device according to the third preferred embodiment of the present invention.

While in the third preferred embodiment, a floating electrode which is isolated from the surroundings is adopted as the electrode 116, the electrode 116 may electrically be connected to the gate electrode 115a as in the aforementioned second preferred embodiment. FIG. 24 is a cross-sectional view of the semiconductor device in this case according to the third preferred embodiment, showing in enlarged scale an area where the electrode 116 is located.

As shown in FIG. 24, the electrode 116 and the second field plate 120a are electrically connected to each other by a plurality of contact plugs 126 which are provided in and through the insulation film 21. Thereby, electrical connection is established between the electrode 116 and the gate electrode 115a. This stabilizes the potential of the electrode 116 and, as in the second preferred embodiment, reduces the occurrence of electric field concentration due to the operating conditions of the semiconductor device.

The plurality of contact plugs 126 are spaced from one another. Like the contact plugs 26 in the second preferred embodiment, the contact plugs 126 extend along the second field plate 120a and do not extend under the interconnect line 130.

Fourth Preferred Embodiment

Figure 25:
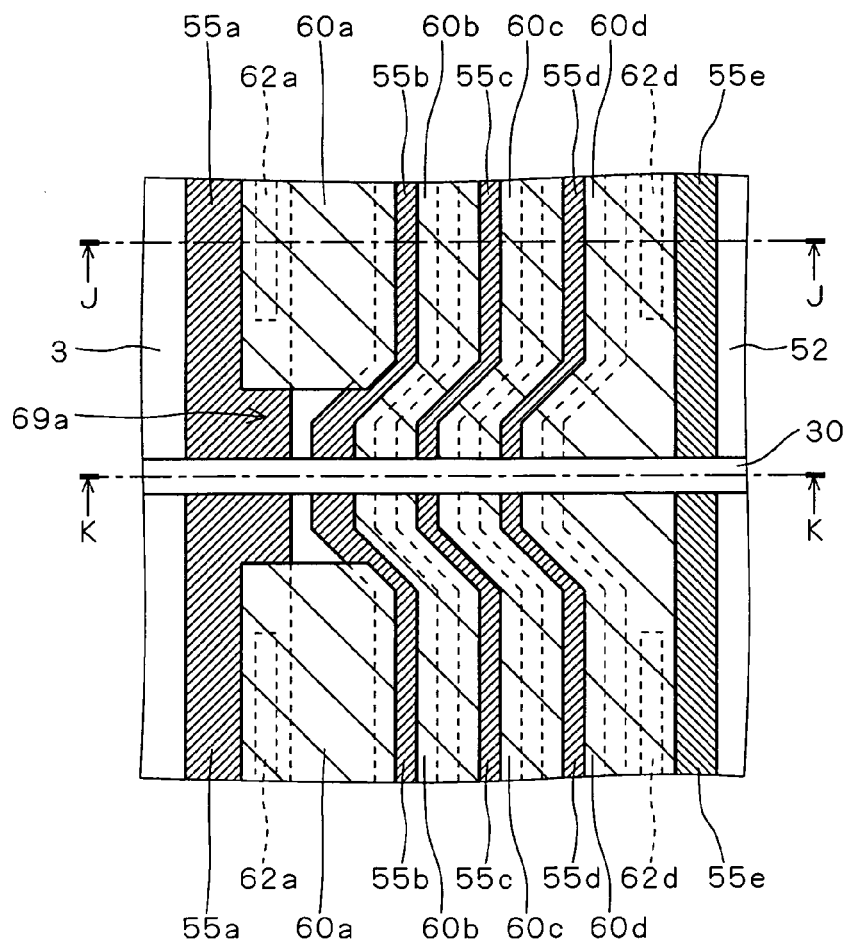
FIG. 25 is a plan view illustrating a configuration of a semiconductor device according to a fourth preferred embodiment of the present invention.
Figure 26A:
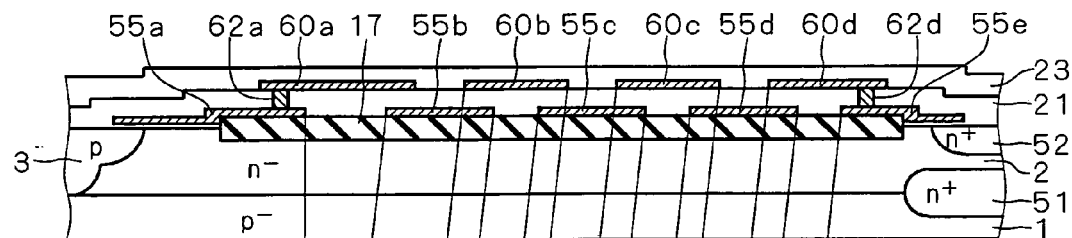
FIGS. 26A, 26B, 27A, and 27B are cross-sectional views illustrating the configuration of the semiconductor device according to the fourth preferred embodiment of the present invention.
Figure 26B:
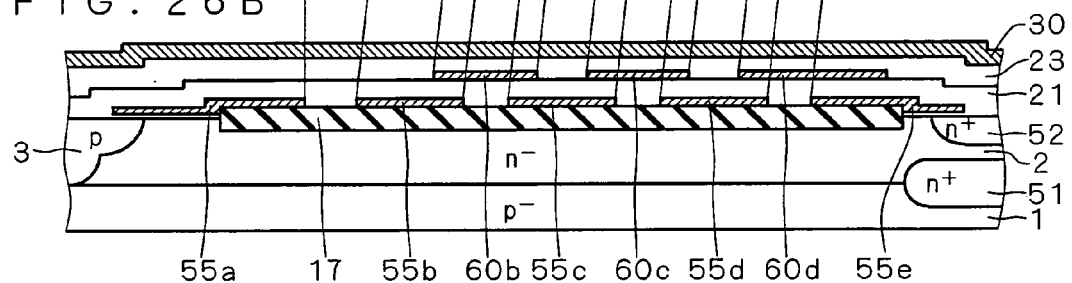

FIG. 25 is a plan view illustrating a configuration of a semiconductor device according to a fourth preferred embodiment of the present invention. FIGS. 26A and 26B are cross-sectional views taken respectively along arrowed lines J-J and K-K of FIG. 25. FIG. 26A shows a cross section in the area where the interconnect line 30 is not formed; and FIG. 26B shows a cross-section in the area where the interconnect line 30 is formed. The configuration of the semiconductor device according to the fourth preferred embodiment is such that, in the semiconductor device according to the first preferred embodiment, the electrodes 16 and 56 are not formed, and the shapes of the first and second field plates 15b-15e, 55b-55e, 20b-20d, and 60b-60d are modified, thereby to achieve high breakdown voltage.

In FIG. 25, the area around the cut portion 69a of the second field plate 60a is shown in enlarged scale, and to avoid complexity of drawing, the insulation films 21 and 23 in FIGS. 26A and 26B are not shown.

As shown in FIGS. 25, 26A, and 26B, the first field plates 55b-55d according to the fourth preferred embodiment each have under the interconnect line 30 a portion which is shifted closer to the p impurity region 3 than the other portion, while keeping approximately a constant plate width. Thus, both edges of the portions of the first field plates 55b-55d which are located under the interconnect line 30 are shifted closer to the p impurity region 3 than those edges of the other portions. In other words, a distance between each edge of the portions of the first field plates 55b-55d which are located under the interconnect line 30 and one edge of the first field plate 55a on the side of the first field plate 55b is set shorter than a distance between that edge of the other portions of the first field plates 55b-55d and that edge of the first field plate 55a.

Also, the first field plate 55e according to the fourth preferred embodiment have a portion under the interconnect line 30, the edge of which portion on the side of the p impurity region 3 is shifted closer to the p impurity region 3 than that edge of the other portion. In other words, a distance between one edge of the portion of the first field plate 55e which is located under the interconnect line 30, on the side of the p impurity region 3 and one edge of the first field plate 55a on the side of the first field plate 55b is set shorter than a distance between that edge of the other portion of the first field plate 55e and that edge of the first field plate 55a.

Further, the second field plates 60b and 60c according to the fourth preferred embodiment each have under the interconnect line 30 a portion which is shifted closer to the p impurity region 3 than the other portion, while keeping approximately a constant plate width. Thus, both edges of the portions of the second field plates 60b and 60c which are located under the interconnect line 30 are shifted closer to the p impurity region 3 than those edges of the other portions. In other words, a distance between each edge of the portions of the second field plates 60b and 60c which are located under the interconnect line 30 and one edge of the first field plate 55a on the side of the first field plate 55b is set shorter than a distance between that edge of the other portions of the second field plates 60b and 60c and that edge of the first field plate 55a.

Also, the second field plate 60d according to the fourth preferred embodiment has a portion under the interconnect line 30, the edge of which portion on the side of the p impurity region 3 is shifted closer to the p impurity region 3 than that edge of the other portion. In other words, a distance between one edge of the portion of the second field plate 60d which is located under the interconnect line 30, on the side of the p impurity region 3 and one edge of the first field plate 55a on the side of the first field plate 55b is set shorter than a distance between that edge of the other portion of the second field plate 60d and that edge of the first field plate 55a.

Further, as shown in FIG. 27, the first field plates 15b-15d according to the fourth preferred embodiment each have under the interconnect line 30 a portion which is shifted closer to the gate electrode 15a than the other portion, while keeping approximately a constant plate width. Thus, both edges of the portions of the first field plates 15b-15d which are located under the interconnect line 30 are shifted closer to the gate electrode 15a than those edges of the other portions. Also, the first field plate 15e according to the fourth preferred embodiment has a portion under the interconnect line 30, the edge of which portion on the side of the gate electrode 15a is shifted closer to the gate electrode 15a than that edge of the other portion.

Further, the second field plates 20b and 20c according to the fourth preferred embodiment each have under the interconnect line 30 a portion which is shifted closer to the gate electrode 15a than the other portion, while keeping approximately a constant plate width. Thus, both edges of the portions of the second field plates 20b and 20c which are located under the interconnect line 30 are shifted closer to the gate electrode 15a than those edges of the other portions. Also, the second field plate 20d according to the fourth preferred embodiment has a portion under the interconnect line 30, the edge of which portion on the side of the gate electrode 15a is shifted closer to the gate electrode 15a than that edge of the other portion. The other part of the structure is identical to that of the first preferred embodiment and thus not described here.

Figure 27A:
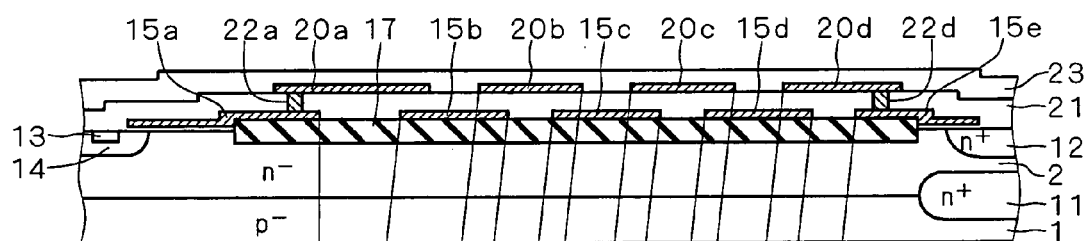
Figure 27B:
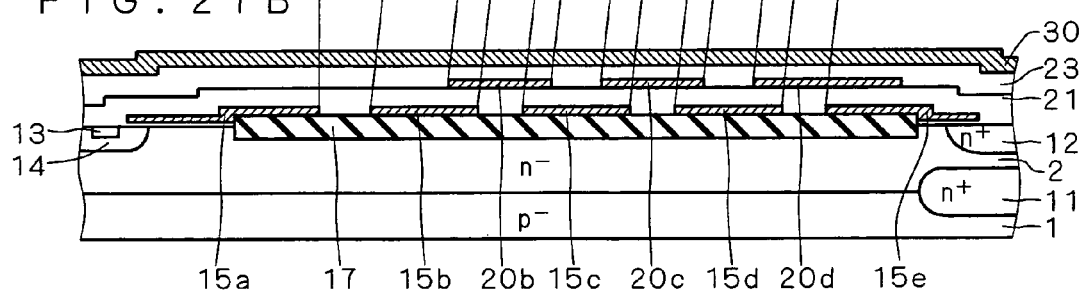

FIG. 27A shows approximately the left half of the structure in cross section at the location corresponding to the arrowed line B-B of FIG. 2. FIG. 27B shows the cross-sectional structure of the nMOS region 202 at the location corresponding to but viewed from the opposite direction from the arrowed line A-A of FIG. 2.

In the fourth preferred embodiment, a difference between a distance between one edge of the gate electrode 15a on the side of the $n^+$ impurity region 12 and each edge of each of the first and second field plates 15b-15d, 20b, and 20c in the area under the interconnect line 30, and that distance in the other area, is all the same. The difference between those distances is equal to a difference between a distance between one edge of the gate electrode 15a on the side of the $n^+$ impurity region 12 and one edge of the first and second field plates 15e and 20d on the side of the gate electrode 15a, in the area under the interconnect line 30, and that distance in the other area.

Also, a difference between a distance between one edge of the first field plate 55a on the side of the $n^+$ impurity region 52 and each edge of each of the first and second field plates 55b-55d, 60b, and 60c in the area under the interconnect line 30, and that distance in the other area, is all the same. The difference between those distances is equal to a difference between a distance between one edge of the first field plate 55a on the side of the $n^+$ impurity region 52 and one edge of each of the first and second field plates 55e and 60d on the side of the p impurity region 3, in the area under the interconnect line 30, and that distance in the other area.

In this way, in the fourth preferred embodiment, the edges of the portions of the first and second field plates 15b-15e, 55b-55e, 20b-20d, and 60b-60d which are located under the interconnect line 30 are shifted by a uniform amount.

As so far described, in the semiconductor device according to the fourth preferred embodiment, the edge of the first field plate 55b on the side of the p impurity region 3 in the area under the interconnect line 30 is shifted toward the p impurity region 3. Thus, under the interconnect line 30, there is a smaller space between the first field plates 55a and 55b. Consequently, the upper surface of the n⁻ semiconductor layer 2 under the space between the first field plates 55a and 55b becomes liable to be influenced by the low potential of the first field plate 55b, which reduces the influence of the high potential of the interconnect line 30 and facilitates the extension of a depletion layer in the n⁻ semiconductor layer. Accordingly, it becomes possible to reduce electric field concentration caused by the provision of the cut portion 69a of the second field plate 60a and, as a result, to easily achieve a semiconductor device with desired breakdown voltage.

Figure 28:
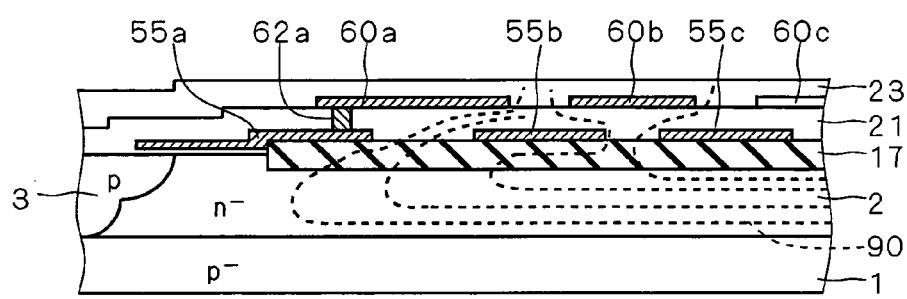
FIGS. 28 and 29 are diagrams illustrating potential distribution in the semiconductor device according to the fourth preferred embodiment of the present invention.
Figure 29:
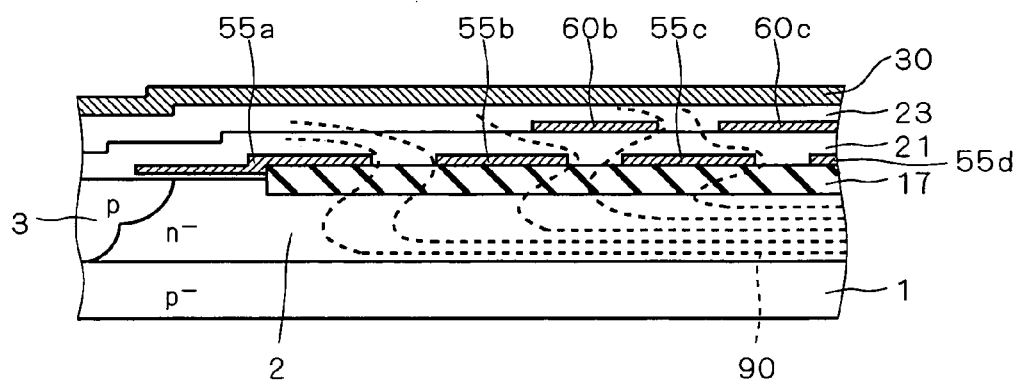

FIGS. 28 and 29 are diagrams illustrating the potential distribution in the semiconductor device according to the fourth preferred embodiment. FIG. 28 shows the potential distribution in the area where the second field plate 60a is not cut off; and FIG. 29 shows the potential distribution in the area where the second field plate 60a is cut off. As shown in FIG. 29, in the semiconductor device according to the fourth preferred embodiment, there is no electric-field concentration area formed in the vicinity of the upper surface of the n⁻ semiconductor layer 2 near the edge of the first field plate 55a on the side of the first field plate 55b, and therefore, the breakdown voltage is improved.

Further in the fourth preferred embodiment, the edge of the first field plate 15b on the side of the gate electrode 15a is shifted toward the gate electrode 15a in the area under the interconnect line 30. Thus, under the interconnect line 30, there is a smaller space between the gate electrode 15a and the first field plate 15b. Consequently, the upper surface of the n⁻ semiconductor layer 2 under the space between the gate electrode 15a and the first field plate 15b becomes liable to be influenced by the low potential of the first field plate 15b, which reduces the influence of the high potential of the interconnect line 30 and facilitates the extension of a depletion layer in the n⁻ semiconductor layer 2. Accordingly, it becomes possible to reduce electric field concentration caused by the provision of the cut portion 29 of the second field plate 20a and, as a result, to easily achieve a semiconductor device with desired breakdown voltage.

Also, in the semiconductor device according to the fourth preferred embodiment, both edges of the portions of the first and second field plates 55b-55d, 60b, and 60c which are located under the interconnect line 30 are shifted closer to the p impurity region 3 than those edges of the other portions. Thus, it is possible, under the interconnect line 30, to bring the edge of the first field plate 55b on the side of the p impurity region 3 closer to the first field plate 55a while reducing variations in the plate widths and the relative positions of the first and second field plates 55b-55d, 60b, and 60c. The potential of the interconnect line 30 not only exerts an influence on the upper surface of the n⁻ semiconductor layer 2 under the space between the first field plates 55a and 55b, but also has no small influence on the upper surface of the n⁻ semiconductor layer 2 under the spaces between the first field plates 55b and 55c and between the first field plates 55c and 55d. From this, the occurrence of electric field concentration in the vicinity of the upper surface of the n⁻ semiconductor layer 2 under the above spaces can be reduced by reducing variations in the plate widths and the relative positions of the first and second field plates 55b-55d, 60b, and 60c.

Similarly, in the semiconductor device according to the fourth preferred embodiment, both edges of the portions of the first and second field plates 15b-15d, 20b, and 20c which are located under the interconnect line 30 are shifted closer to the gate electrode 15a than those edges of the other portions. This reduces variations in the plate widths and the relative positions of the first and second field plates 15b-15d, 20b, and 20c and thereby reduces the occurrence of electric field concentration in the upper surface of the n⁻ semiconductor layer 2 under the spaces between the first field plates 15b and 15c and between the first field plates 15c and 15d.

Figure 30A:
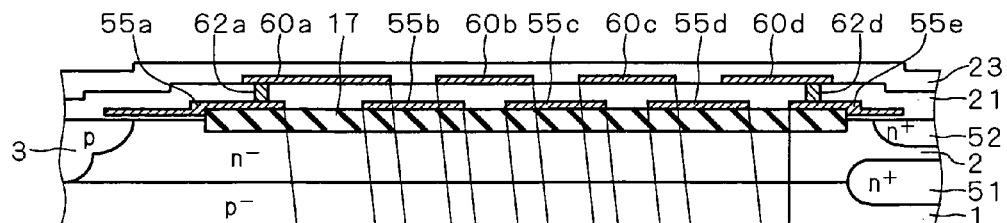
FIGS. 30A, 30B, 31A, and 31B are cross-sectional views illustrating another configuration of the semiconductor device according to the fourth preferred embodiment of the present invention.
Figure 30B:
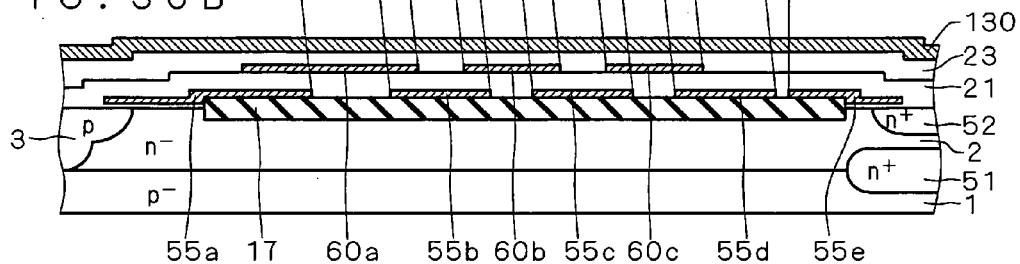

As shown in FIGS. 30A and 30B, also in the semiconductor device according to the aforementioned third preferred embodiment, both edges of the portions of the first field plates 55b-55d, 60b, and 60c which are located under the interconnect line 130 may be shifted closer to the n⁺ impurity region 52 than those edges of the other portions. Also, the edges of the portions of the first and second field plates 55a and 60a on the side of the n⁺ impurity region 52 which are located under the interconnect line 130 may be shifted closer to the n⁺ impurity region 52 than those edges of the other portions.

By, in this way, shifting the edge of the first field plate 55d on the side of the n⁺ impurity region 52 toward the n⁺ impurity region 52 in the area under the interconnect line 130, the space between the first field plates 55d and 55e under the interconnect line 130 is reduced in the semiconductor device according to the aforementioned third preferred embodiment. Consequently, the upper surface of the n⁻ semiconductor layer 2 under the space between the first field plates 55d and 55e becomes liable to be influenced by the high potential of the first field plate 55d, which reduces the influence of the low potential of the interconnect line 130 and controls the extension of a depletion layer in the n⁻ semiconductor layer 2. Accordingly, it becomes possible to reduce electric field concentration caused by the provision of the cut portion 69d of the second field plate 60d and, as a result, to easily achieve a semiconductor device with desired breakdown voltage.

Since both edges of the portions of the first and second field plates 55b-55d, 60b, and 60c which are located under the interconnect line 130 are shifted closer to the n⁺ impurity region 52 than those edges of the other portions, it is possible to reduce variations in the plate widths and the relative positions of the first and second field plates 55b-55d, 60b, and 60c and thereby to reduce the occurrence of electric field concentration in the upper surface of the n⁻ semiconductor layer 2 under the spaces between the first field plates 55b and 55c and between the first field plates 55c and 55d, due to the potential of the interconnect line 130.

Figure 31A:
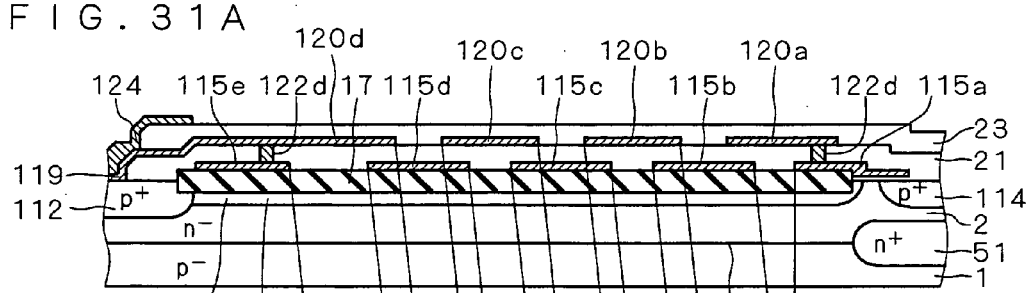
Figure 31B:
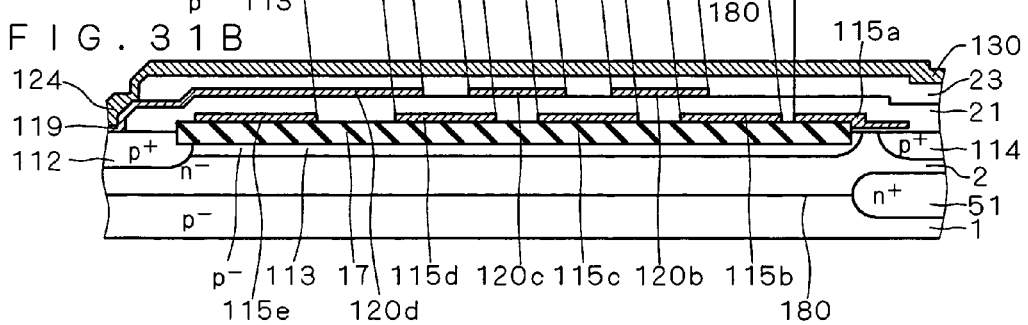

Further, as shown in FIGS. 31A and 31B, in the semiconductor device according to the aforementioned third preferred embodiment, both edges of the portions of the first and second field plates 115b-115d, 120b, and 120c which are located under the interconnect line 130 may be shifted closer to the gate electrode 115a than those edges of the other portions. Also, the edges of the portions of the first and second field plate 115e and 120d which are located under the interconnect line 130, on the side of the gate electrode 115a, may be shifted closer to the gate electrode 115a than those edges of the other portions.

By, in this way, shifting the edge of the first field plate 115b on the side of the gate electrode 115a toward the gate electrode 115a in the area under the interconnect line 130, the space between the gate electrode 115a and the first field plate 115b under the interconnect line 130 is reduced in the semiconductor device according to the aforementioned third preferred embodiment. Consequently, the upper surface of the n⁻ semiconductor layer 2 under the space between the gate electrode 115a and the first field plate 115b becomes liable to be influenced by the high potential of the first field plate 115b, which reduces the influence of the low potential of the interconnect line 130 and controls the extension of a depletion layer in the n⁻ semiconductor layer 2. Accordingly, it becomes possible to reduce electric field concentration caused by the provision of the cut portion 129 of the second field plate 120a and, as a result, to easily achieve a semiconductor device with desired breakdown voltage.

Since both edges of the portions of the first and second field plates 115b-115d, 120b, and 120c which are located under the interconnect line 130 are shifted closer to the gate electrode 115a than those edges of the other portions, it is possible to reduce variations in the plate widths and the relative positions of the first and second field plates 115b-115d, 120b, and 120c and thereby to reduce the occurrence of electric field concentration in the upper surface of the n⁻ semiconductor layer 2 under the spaces between the first field plates 115b and 115c and between the first field plates 115c and 115d, due to the potential of the interconnect line 130.

FIG. 30A shows a cross-sectional view at the location corresponding to the arrowed line I-I of FIG. 17; and FIG. 30B shows approximately the left half of the structure in cross section at the location corresponding to the arrowed line G-G of FIG. 17. FIG. 31A shows approximately the right half of the structure in cross section at the location corresponding to the arrowed line H-H of FIG. 17; and FIG. 31B shows the cross-sectional structure of the pMOS region 205 at the location corresponding to but viewed from the opposite direction from the arrowed line G-G of FIG. 17.

Fifth Preferred Embodiment

FIGS. 32 and 33 are cross-sectional views illustrating a configuration of a semiconductor device according to a fifth preferred embodiment of the present invention. The configuration of the semiconductor device according to the fifth preferred embodiment is such that, in the semiconductor device according to the aforementioned fourth preferred embodiment, there are variations in shift amounts of the edges of the portions of the first and second field plates 15b-15e, 55b-55e, 20b-20d, and 60b-60d which are located under the interconnect line 30.

FIGS. 32A and 32B are cross-sectional views at the locations corresponding respectively to the arrowed lines J-J and K-K of FIG. 25. FIG. 33A, like FIG. 27A, shows approximately the left half of the structure in cross section at the location corresponding to the arrowed line B-B of FIG. 2; and FIG. 33B, like FIG. 27B, shows the cross-sectional structure of the nMOS region 202 at the location corresponding to but viewed from the opposite direction from the arrowed line A-A of FIG. 2.

When the cross-sectional structures of FIGS. 32A and 32B are vertically drawn on the same scale with one edge of the first field plate 55a on the side of the n⁺ impurity region 52 vertically aligned in both the figures, the angle a1 of FIGS. 32A and 32B is an angle formed between a viewing direction s1 when looking down one edge of the second field plate 60c on the side of the n⁺ impurity region 52 in the cross-sectional structure of FIG. 32B from that edge in the cross-sectional structure of FIG. 32A, and a viewing direction s2 when looking straight down from one edge of the second field plate 60c on the side of the n⁺ impurity region 52 in the cross-sectional structure of FIG. 32A. Similarly, the angles a2, a4, a6, a8, and a9 are angles formed between the viewing directions s1 and s2 from one edges of the first field plate 55d, the second field plate 60c, the first field plate 55c, the second field plate 60b, and the first field plate 55b, respectively, on the side of the p impurity region 3 in FIG. 32A. The angles a3, a5, and a7 are angles formed between the viewing directions s1 and s2 from one edges of the first field plate 55c, the second field plate 60b, and the first field plate 55b, respectively, on the side of the n⁺ impurity region 52 in FIG. 32A.

When the cross-sectional structures of FIGS. 33A and 33B are vertically drawn on the same scale with one edge of the gate electrode 15a on the side of the n⁺ impurity region 12 vertically aligned in both the figures, the angle b1 of FIGS. 33A and 33B is an angle formed between the viewing direction s1 when looking down one edge of the second field plate 20c on the side of the n⁺ impurity region 12 in the cross-sectional structure of FIG. 33B from that edge in the cross-sectional structure of FIG. 33A; and the viewing direction s2 when looking straight down from one edge of the second field plate 20c on the side of the n⁺ impurity region 12 in the cross-sectional structure of FIG. 33A. Similarly, the angles b2, b4, b6, b8, and b9 are angles formed between the viewing directions s1 and s2 from one edges of the first field plate 15d, the second field plate 20c, the first field plate 15c, the second field plate 20b, and the first field plate 15b, respectively, on the side of the gate electrode 15a in FIG. 33A. The angles b3, b5, and b7 are angles formed between the viewing directions s1 and s2 from one edges of the first field plate 15c, the second field plate 20c, and the first field plate 15b, respectively, on the side of the n⁺ impurity region 12 in FIG. 33A.

As can be understood from the above description, the angles a1-a9 and b1-b9 each are a measure of the shift amount that one edge of the field plate, which is a reference point of the angle, is shifted under the interconnect line 30. For example, the angle a1 indicates the shift amount of the edge of the second field plate 60c on the side of the n⁺ impurity region 52 in the area under the interconnect line 30.

As shown in FIGS. 32A and 32B, in the semiconductor device according to the fifth preferred embodiment, the angles a1-a9 are set to increase in this order. Thus, the shift amounts of the edges of the field plates under the interconnect line 30 will increase in the following order: the edge of the second field plate 60c on the side of the n⁺ impurity region 52; the edge of the first field plate 55d on the side of the p impurity region 3; the edge of the first field plate 55c on the side of the n⁺ impurity region 52; the edge of the second field plate 60c on the side of the p impurity region 3; the edge of the second field plate 60b on the side of the n⁺ impurity region 52; the edge of the first field plate 55c on the side of the p impurity region 3; the edge of the first field plate 55b on the side of the n⁺ impurity region 52; the edge of the second field plate 60b on the side of the p impurity region 3; and the edge of the first field plate 55b on the side of the p impurity region 3. In the aforementioned fourth preferred embodiment, the edges of the first field plate 55e and the second field plate 60d on the side of the p impurity region 3 are shifted under the interconnect line 30; however, in the fifth preferred embodiment, the shift amounts thereof are set to zero, so that those edges are not shifted. Further, while the first field plate 55d according to the fourth preferred embodiment has both edges shifted, the first field plate 55d according to the fifth preferred embodiment has only one edge on the side of the p impurity region 3 shifted.

As shown in FIGS. 33A and 33B, in the fifth preferred embodiment, the angles b1-b9 are set to increase in this order. Thus, the shift amounts of the edges of the field plates under the interconnect line 30 will increase in the following order: the edge of the second field plate 20c on the side of the n+ impurity region 12; the edge of the first field plate 15d on the side of the gate electrode 15a; the edge of the first field plate 15c on the side of the n+ impurity region 12; the edge of the second field plate 20c on the side of the gate electrode 15a; the edge of the second field plate 20b on the side of the n+ impurity region 12; the edge of the first field plate 15c on the side of the gate electrode 15a; the edge of the first field plate 15b on the side of the n+ impurity region 12; the edge of the second field plate 20b on the side of the gate electrode 15a; and the edge of the first field plate 15b on the side of the gate electrode 15a. In the aforementioned fourth preferred embodiment, the edges of the first field plate 15e and the second field plate 20d on the side of the gate electrode 15a are shifted under the interconnect line 30; however, in the fifth preferred embodiment, the shift amounts thereof are set to zero, so that those edges are not shifted. Further, while the first field plate 15d according to the fourth preferred embodiment has both edges shifted, the first field plate 15d according to the fifth preferred embodiment has only one edge on the side of the gate electrode 15a shifted.

As above described, in the fifth preferred embodiment, the shift amounts of the edges of the portions of the first and second field plates 55b-55d, 60b, and 60c which are located under the interconnect line 30 increase as those edges are closer to the p impurity region 3. That is, the shift amounts that the edges of the first and second field plates 55b-55d, 60b, and 60c under the interconnect line 30 are shifted toward the p impurity region 3 will increase in order of sequence from the edge of the second field plate 60c on the side of the n+ impurity region 52, which edge is closest to the n+ impurity region 52, toward the edge of the first field plate 55b on the side of the p impurity region 3, which edge is closest to the p impurity region 3. Since the influence that the potential of the interconnect line 30 applied with high potential has on the potential distribution in the vicinity of the upper surface of the n− semiconductor layer 2 between the p impurity region 3 and the n+ impurity region 52 will increase as farther from the n+ impurity region 52 of high potential and closer to the p impurity region 3 of low potential, the aforementioned weighing of the shift amounts of the edges of the field plates allows more effective reduction of electric field concentration in the n− semiconductor layer 2 between the p impurity region 3 and the n+ impurity region 52.

Further in the fifth preferred embodiment, the shift amounts of the edges of the portions of the first and second field plates 15b-15d, 20b, and 20c which are located under the interconnect line 30 will increase as those edges are closer to the gate electrode 15a. This, for the aforementioned reason, allows more effective reduction of electric field concentration in the n− semiconductor layer 2 between the p impurity region 3 and the n+ impurity region 52.

In the modification of the semiconductor device according to the third preferred embodiment, which has been described in the above fourth preferred embodiment, the electric field concentration in the n− semiconductor layer 2 between the p impurity region 3 and the n+ impurity region 52 can more effectively be reduced by increasing the shift amounts of the edges of the first and second field plates 55b-55d, 60b, and 60c in the area under the interconnect line 130 as those edges are closer to the n+ impurity region 52 of high potential. Also, the electric field concentration in the n− semiconductor layer 2 between the p+ impurity region 112 and the n+ impurity region 52 can more effectively be reduced by increasing the shift amounts of the edges of the first and second field plates 115b-115d, 120b, and 120c in the area under the interconnect line 130 as those edges are closer to the gate electrode 115a of high potential.

FIGS. 34A, 34B, 35A, and 35B are cross-sectional views illustrating the configuration of the semiconductor device in this case according to the third preferred embodiment. FIG. 34A, like FIG. 30A, shows a cross-sectional view at the location corresponding to the arrowed line I-I of FIG. 17; and FIG. 34B, like FIG. 30B, shows approximately the left half of the structure in cross section at the location corresponding to the arrowed line G-G of FIG. 17. FIG. 35A, like FIG. 31A, shows approximately the right half of the structure in cross section at the location corresponding to the arrowed line H-H of FIG. 17; and FIG. 35B, like FIG. 31B, shows the cross-sectional structure of the pMOS region 205 at the location corresponding to but viewed from the opposite direction from the arrowed-line G-G of FIG. 17.

When the cross-sectional structures of FIGS. 34A and 34B are vertically drawn on the same scale with one edge of the first field plate 55e on the side of the p impurity region 3 vertically aligned in both the figures, the angle c1 of FIGS. 34A and 34B is an angle formed between the viewing direction s1 when looking down one edge of the second field plate 60b on the side of the p impurity region 3 in the cross-sectional structure of FIG. 34B from that edge in the cross-sectional structure of FIG. 34A; and the viewing direction s2 when looking straight down from one edge of the second field plate 60b on the side of the p impurity region 3 in the cross-sectional structure of FIG. 34A. Similarly, the angles c2, c4, c6, c8, and c9 are angles formed between the viewing directions s1 and s2 from one edges of the first field plate 55b, the second field plate 60b, the first field plate 55c, the second field plate 60c, and the first field plate 55d, respectively, on the side of the n+ impurity region 52 in FIG. 34A. The angles c3, c5, and c7 are angles formed between the viewing directions s1 and s2 from one edges of the first field plate 55c, the second field plate 60c, and the first field plate 55d, respectively, on the side of the p impurity region 3 in FIG. 34A.

When the cross-sectional structures of FIGS. 35A and 35B are vertically drawn on the same scale with one edge of the gate electrode 115a on the side of the p+ impurity region 112 vertically aligned in both the figures, the angle d1 of FIGS. 35A and 35B is an angle formed between the viewing direction s1 when looking down one edge of the second field plate 120c on the side of the p+ impurity region 112 in the cross-sectional structure of FIG. 35B from that edge in the cross-sectional structure of FIG. 35A; and the viewing direction s2 when looking straight down from one edge of the second field plate 120c on the side of the p+ impurity region 112 in the cross-sectional structure of FIG. 35A. Similarly, the angles d2, d4, d6, d8, and d9 are angles formed between the viewing directions s1 and s2 from one edges of the first field plate 115d, the second field plate 120c, the first field plate 115c, the second field plate 120b, and the first field plate 115b, respectively, on the side of the gate electrode 115a in FIG. 35A. The angles d3, d5, and d7 are angles formed between the viewing directions s1 and s2 from one edges of the first field plate 115c, the second field plate 120b, and the first field plate 115b, respectively, on the side of the p+ impurity region 112 in FIG. 35A.

As can be understood from the above description, the angles c1-c9 and d1-d9 each are a measure of the shift amount that one edge of the field plate, which is a reference point of the angle, is shifted under the interconnect line 130. For example, the angle c1 indicates the shift amount of the edge of the second field plate 60*b* on the side of the p impurity region 3 in the area under the interconnect line 130.

As shown in FIGS. 34A, 34B, 35A, and 35B, in the modification of the semiconductor device according to the third preferred embodiment, the angles c1-c9 and the angles d1-d9 respectively are set to increase in this order. Thus, the shift amounts of the edges of the first and second field plates 55*b*-55*d*, 60*b*, and 60*c* in the area under the interconnect line 130 will increase as those edges are closer to the n$^+$ impurity region 52. That is, the shift amounts that the edges of the portions of the first and second field plates 55*b*-55*d*, 60*b*, and 60*c* which are located under the interconnect line 130 are shifted toward the n$^+$ impurity region 52 will increase in order of sequence from the edge of the second field plate 60*b* on the side of the p impurity region 3, which edge is closest to the p impurity region 3, toward the edge of the first field plate 55*d* on the side of the n$^+$ impurity region 52, which edge is closest to the n$^+$ impurity region 52. Since the influence that the potential of the interconnect line 130 applied with low potential has on the potential distribution in the vicinity of the upper surface of the n$^-$ semiconductor layer 2 between the p impurity region 3 and the n$^+$ impurity region 52 will increase as farther from the p impurity region 3 of low potential and closer to the n$^+$ impurity region 52 of high potential, the aforementioned weighing of the shift amounts of the field plate edges allows more effective reduction of electric field concentration in the n$^-$ semiconductor layer 2 between the p impurity region 3 and the n$^+$ impurity region 52.

Further, since the angles d1-d9 are set to increase in this order, the shift amounts of the edges of the portions of the first and second field plates 115*b*-115*d*, 120*b*, and 120*c* which are located under the interconnect line 130 will increase as those edges are closer to the gate electrode 115*a*. This, for the aforementioned reason, allows more effective reduction of electric field concentration in the n$^-$ semiconductor layer 2 between the p$^+$ impurity region 112 of low potential and the n$^+$ impurity region 52 of high potential.

Sixth Preferred Embodiment

FIG. 36 is a cross-sectional view illustrating a configuration of a semiconductor device according to a sixth preferred embodiment of the present invention. The configuration of the semiconductor device according to the sixth preferred embodiment is such that, in the semiconductor device according to the aforementioned first preferred embodiment, an n diffusion region 70 is formed in the upper surface of the n$^-$ semiconductor layer 2 which is an epitaxial layer, without formation of the electrodes 16 and 56. FIG. 36 shows a cross-sectional view at the location corresponding to the arrowed line A-A of FIG. 2.

As shown in FIG. 36, in the upper surface of the n$^-$ semiconductor layer 2 within both the high-potential island region 201 and the nMOS region 202, the n diffusion region 70 having a higher impurity concentration than the n$^-$ semiconductor layer 2 is formed in contact with the p impurity region 3. The n diffusion region 70 according to the sixth preferred embodiment, when viewed in plan, is formed throughout the n$^-$ semiconductor layer 2 within both the high-potential island region 201 and the nMOS region 202.

In the sixth preferred embodiment, the n$^+$ impurity regions 12 and 52 and the p$^+$ impurity region 13 are formed in the upper surface of the n diffusion region 70. Also, the high-potential logic circuit 101 is formed in the n diffusion region 70, and the isolation insulating film 17 is formed on the n diffusion region 70. The semiconductor device according to the sixth preferred embodiment does not include the electrodes 16 and 56, unlike in the first preferred embodiment.

The n diffusion region 70 is also formed in the upper surface of the n$^-$ semiconductor layer 2 outside the high-potential island region 201 and the nMOS region 202 where the low-potential logic circuit 100 and the like are formed. Thus, the low-potential logic circuit 100 and the like are formed in the n diffusion region 70. The other part of the structure is identical to that of the semiconductor device according to the first preferred embodiment and thus not described here.

As described, since, in the semiconductor device according to the sixth preferred embodiment, the n diffusion region 70 is formed in the upper surface of the n$^-$ semiconductor layer 2, it is easier to satisfy the RESURF condition in the previously described RESURF isolation regions 300 and 301.

In the semiconductor devices according to the aforementioned first through fifth preferred embodiments, in order to achieve high breakdown voltage, the n$^-$ semiconductor layer 2 is designed so that the impurity concentration Nd and the thickness t of the n$^-$ semiconductor layer 2 satisfy the RESURF condition expressed by the following equation (1):

$$Nd(\text{cm}^{-3}) \times t(\text{cm}) \approx 1.0 \times 10^{12}(\text{cm}^{-2}) \qquad (1)$$

Since the epitaxial layer usually has an error of approximately ±10% in its impurity concentration Nd and its thickness t, the margin of error in the product of the impurity concentration Nd and the thickness t is approximately plus or minus 20 percent, from which it is not easy to satisfy the RESURF condition. Therefore, it can be difficult to achieve a semiconductor device with desired breakdown voltage.

On the other hand, the diffusion layer which is formed for example by the introduction of impurities using ion implantation and a subsequent heat treatment process enables precise control of impurity concentration and thickness (depth of diffusion); therefore, the margin of error in the product of the impurity concentration and the thickness can be reduced to 1% or less. Accordingly, in the semiconductor device according to the sixth preferred embodiment, the provision of the n diffusion region 70 in the upper surface of the n$^-$ semiconductor layer 2 makes it easier to satisfy the RESURF condition, and the RESURF isolation regions 300 and 301 allow reliable formation of a depletion layer. As a result, a semiconductor device with desired breakdown voltage can easily be achieved.

For example, if the tolerance of the RESURF condition is t 20%, the n$^-$ semiconductor layer 2 should desirably be formed so that the product of the impurity concentration and the thickness of the n$^-$ semiconductor layer 2 is less than $0.2 \times 10^{12}(\text{cm}^{-2})$.

Figure 37:
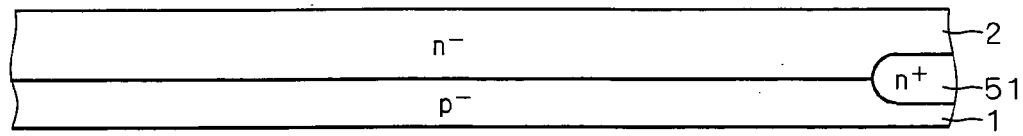
Figure 38:
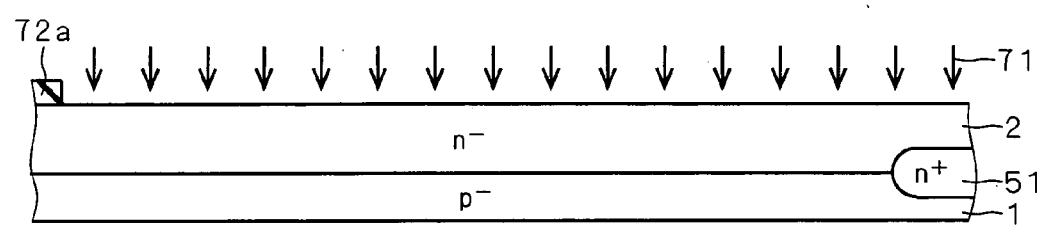

Next, a method of forming the n diffusion region 70 in the upper surface of the n$^-$ semiconductor layer 2 will be described by way of example. FIGS. 37 through 42 are cross-sectional views illustrating a sequence of process steps in the method of forming the n diffusion region 70. As shown in FIG. 37, the n$^-$ semiconductor layer 2 which is an epitaxial layer is formed on the p$^-$ semiconductor substrate 1, and the n$^+$ buried impurity region 51 is further formed. Then, as shown in FIG. 38, a resist 72*a* having a predetermined opening pattern is formed on the n$^-$ semiconductor layer 2, and using the resist 72a as a mask, phosphorus (P) ions 71 which are n-type impurities are ion-implanted. The resist 72a is then removed.

Figure 39:
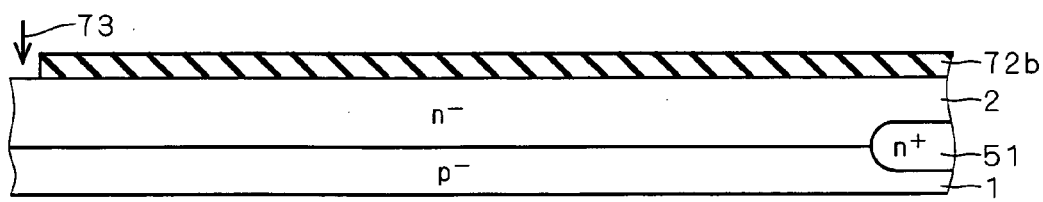
Figure 40:
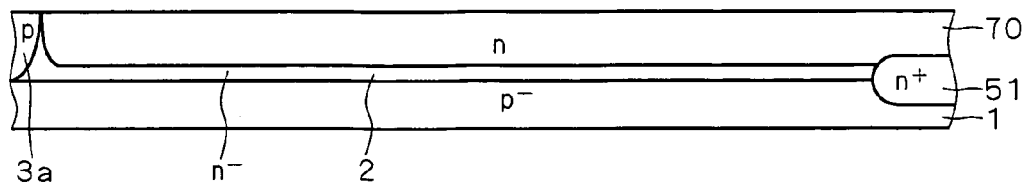

Then, as shown in FIG. 39, a resist 72b having a predetermined opening pattern is formed on the n⁻ semiconductor layer 2, and boron (B) ions 73 which are p-type impurities are ion-implanted using the resist 72b as a mask, and then the resist 72b is removed. This is followed by more than an hour of heat treatment at a temperature of approximately 1,000° C. Thereby, as shown in FIG. 40, the n diffusion region 70 is formed in the upper surface of the n⁻ semiconductor layer 2, and a p impurity region 3a which is part of the p impurity region 3 is formed in the n⁻ semiconductor layer 2, extending from the upper surface of the n⁻ semiconductor layer 2 to the interface with the p⁻ semiconductor substrate 1. Thereafter, the isolation insulating film 17, the n⁺ impurity region 52, and the like are formed as shown in FIG. 41, and a p impurity region 3b which is part of the p impurity region 3 and the first field plates 55a-55e are formed as shown in FIG. 42. This completes the semiconductor device according to the sixth preferred embodiment.

While, in the sixth preferred embodiment, the n diffusion region 70 is formed throughout the upper surface of the n⁻ semiconductor layer 2 within both the high-potential island region 201 and the nMOS region 202, a similar effect can also be achieved by forming the n diffusion region 70 at least in the RESURF isolation regions 300 and 301 which are covered with a depletion layer. That is, a semiconductor device with desired breakdown voltage can easily be achieved by forming the n diffusion region 70, at least in the upper surface of the n⁻ semiconductor layer 2 between the p impurity region 3 and the n⁺ impurity region 52 within the high-potential island region 201, and at least in the upper surface of the n⁻ semiconductor layer 2 between the p impurity region 3 and the n⁺ impurity region 12 within the nMOS region 202.

Figure 43:
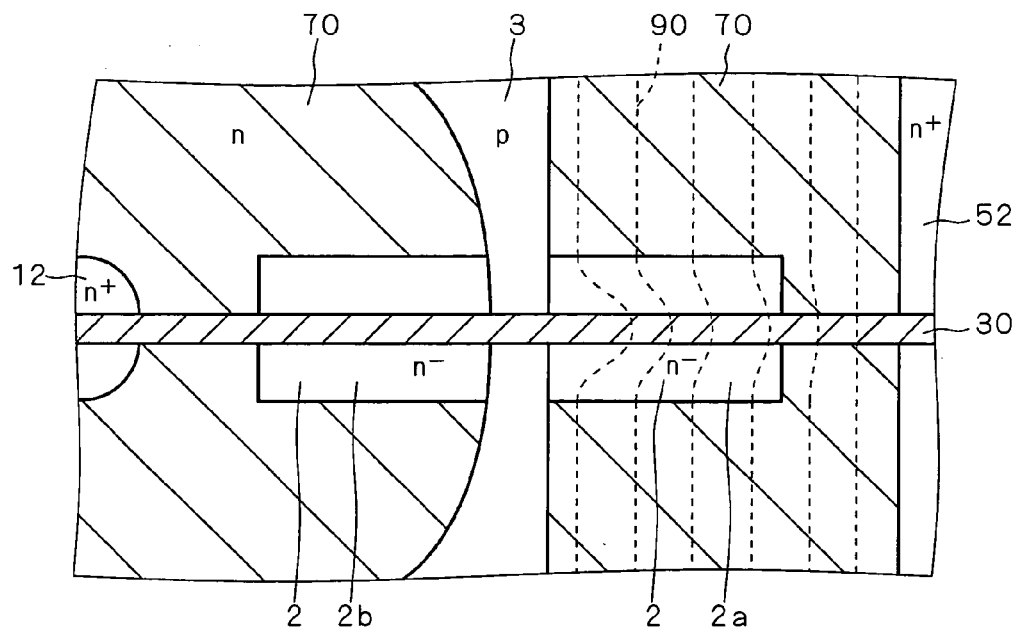
FIG. 43 is a plan view illustrating a configuration of a semiconductor device according to a seventh preferred embodiment of the present invention.

Seventh Preferred Embodiment FIG. 43 is a plan view illustrating a configuration of a semiconductor device according to a seventh preferred embodiment of the present invention. The configuration of the semiconductor device according to the seventh preferred embodiment is such that, in the semiconductor device according to the aforementioned sixth preferred embodiment, the n⁻ semiconductor layer 2 under the interconnect line 30 is exposed from the n diffusion region 70. FIG. 43 shows, in enlarged scale, an area around the boundary between the n⁻ semiconductor layer 2 within the high-potential island region 201 and the n⁻ semiconductor layer 2 within the nMOS region 202. For convenience of description, it does not show the structure above the n⁻ semiconductor layer 2, except the interconnect line 30, and also not show the p⁺ impurity region 13 and the source region 14. This is the same in FIGS. 44 and 45 which will be described later.

As shown in FIG. 43, in the high-potential island region 201 according to the seventh preferred embodiment, the n diffusion region 70 is not formed in part of the n⁻ semiconductor layer 2 between the p impurity region 3 and the n⁺ impurity region 52 under the interconnect line 30; thus, the n⁻ semiconductor layer 2 has an exposed portion 2a which is exposed from the n diffusion region 70. The exposed portion 2a of the n⁻ semiconductor layer 2 extends in a direction from one edge of the n⁻ semiconductor layer 2 between the p impurity region 3 and the n⁺ impurity region 52, on the side of the p impurity region 3, to the n⁺ impurity region 52.

Further, in the nMOS region 202 according to the seventh preferred embodiment, the n diffusion region 70 is not formed in part of the n⁻ semiconductor layer 2 between the p impurity region 3 and the n⁺ impurity region 12 under the interconnect line 30; thus, the n⁻ semiconductor layer 2 has an exposed portion 2b which is exposed from the n diffusion region 70. The exposed portion 2b of the n⁻ semiconductor layer 2 extends in a direction from one edge of the n⁻ semiconductor layer 2 between the p impurity region 3 and the n⁺ impurity region 12, on the side of the p impurity region 3, to the n⁺ impurity region 12. The other part of the structure is identical to that of the semiconductor device according to the sixth preferred embodiment and thus not described here.

As above described, in the n⁻ semiconductor layer 2 under the interconnect line 30 applied with a potential as high as several hundred volts, the extension of a depletion layer is controlled by the influence of the potential of the interconnect line 30. Thus, there is a possibility of electric field concentration occurring in the vicinity of the upper surface of the n⁻ semiconductor layer 2.

In the seventh preferred embodiment, however, since the n⁻ semiconductor layer 2 has under the interconnect line 30 the exposed portions 2a and 2b which are exposed from the n diffusion region 70, those exposed portions 2a and 2b will facilitate the extension of a depletion layer. This is because the n⁻ semiconductor layer 2 has a lower impurity concentration than the n diffusion region 70. Accordingly, electric field concentration due to the potential of the interconnect line 30 can be reduced, which improves the breakdown voltage.

Eighth Preferred Embodiment

Figure 44:
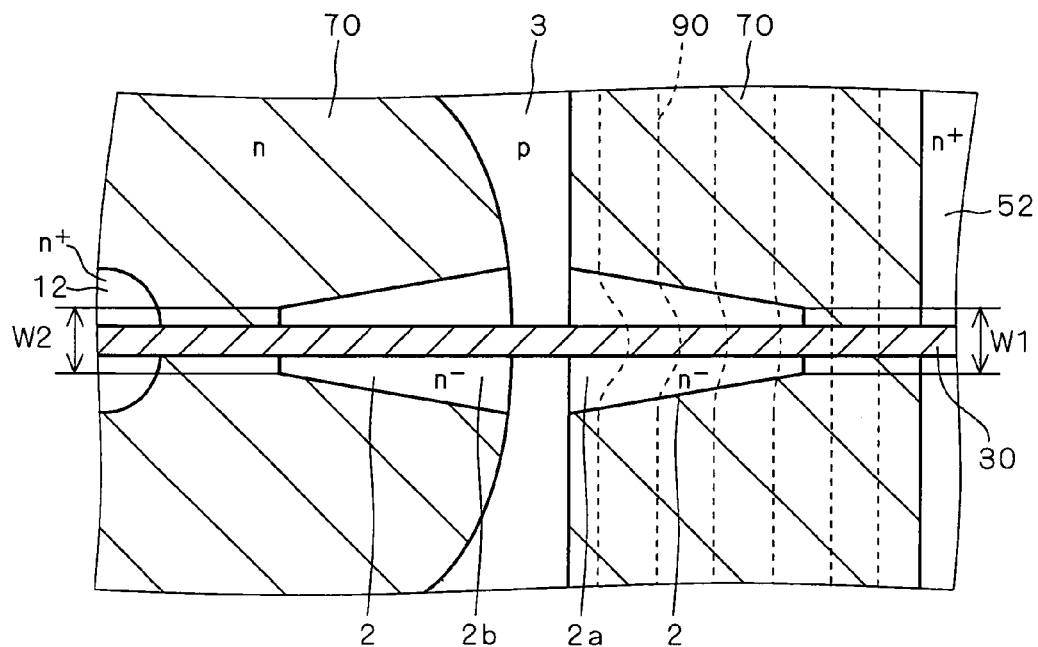
FIG. 44 is a plan view illustrating a configuration of a semiconductor device according to an eighth preferred embodiment of the present invention.

FIG. 44 is a plan view illustrating a configuration of a semiconductor device according to an eighth preferred embodiment of the present invention. The configuration of the semiconductor device according to the eighth preferred embodiment is such that, in the semiconductor device according to the aforementioned seventh preferred embodiment, the shapes of the exposed portions 2a and 2b of the n⁻ semiconductor layer 2 are modified.

As shown in FIG. 44, the exposed portion 2a of the n⁻ semiconductor layer 2 according to the eighth preferred embodiment is shaped like a trapezoid in plan view, the width W1 of which in a direction perpendicular to a direction from the p impurity region 3 to the n⁺ impurity region 52 in plan view tapers down along the direction from the p impurity region 3 to the n⁺ impurity region 52. The exposed portion 2b according to the eighth preferred embodiment is shaped like a trapezoid in plan view, the width W2 of which in a direction perpendicular to a direction from the p impurity region 3 to the n⁺ impurity region 12 tapers down along the direction from the p impurity region 3 to the n⁺ impurity region 12. The other part of the structure is identical to that of the semiconductor device according to the seventh preferred embodiment and thus not described here.

In the n⁻ semiconductor layer 2 between the p impurity region 3 and the n⁺ impurity region 52, a depletion layer can extend more easily along the direction from the p impurity region 3 of low potential to the n⁺ impurity region 52 of high potential. Also, in the n⁻ semiconductor layer 2 between the p impurity region 3 and the n⁺ impurity region 12, a depletion layer can extend more easily along the direction from the p impurity region 3 of low potential to the n⁺ impurity region 12 of high potential. Thus, if the widths W1 and W2 of the exposed portions 2a and 2b respectively were set to be uniform as in the semiconductor device according to the aforementioned seventh preferred embodiment, there would be some parts of the exposed portions 2a and 2b where electric field concentration would occur.

In the eighth preferred embodiment, since the width W1 of the exposed portion 2a tapers down toward the n+ impurity region 52, the extension of a depletion layer in the exposed portion 2a can be controlled in the direction toward the n+ impurity region 52 by interference of the n diffusion region 70 having a high impurity concentration. Thus, as can be seen from the comparison of the equipotential lines 90 between FIGS. 43 and 44, the equipotential lines 90 become sparse in the exposed portion 2a and electric field concentration in the exposed portion 2a can be reduced.

Further, in the eighth preferred embodiment, since the width W2 of the exposed portion 2b tapers down toward the n+ impurity region 12, the extension of a depletion layer in the exposed portion 2b can be controlled in the direction toward the n+ impurity region 12 by interference of the n diffusion region 70. Accordingly, electric field concentration in the exposed portion 2b can be reduced.

Ninth Preferred Embodiment

Figure 45:
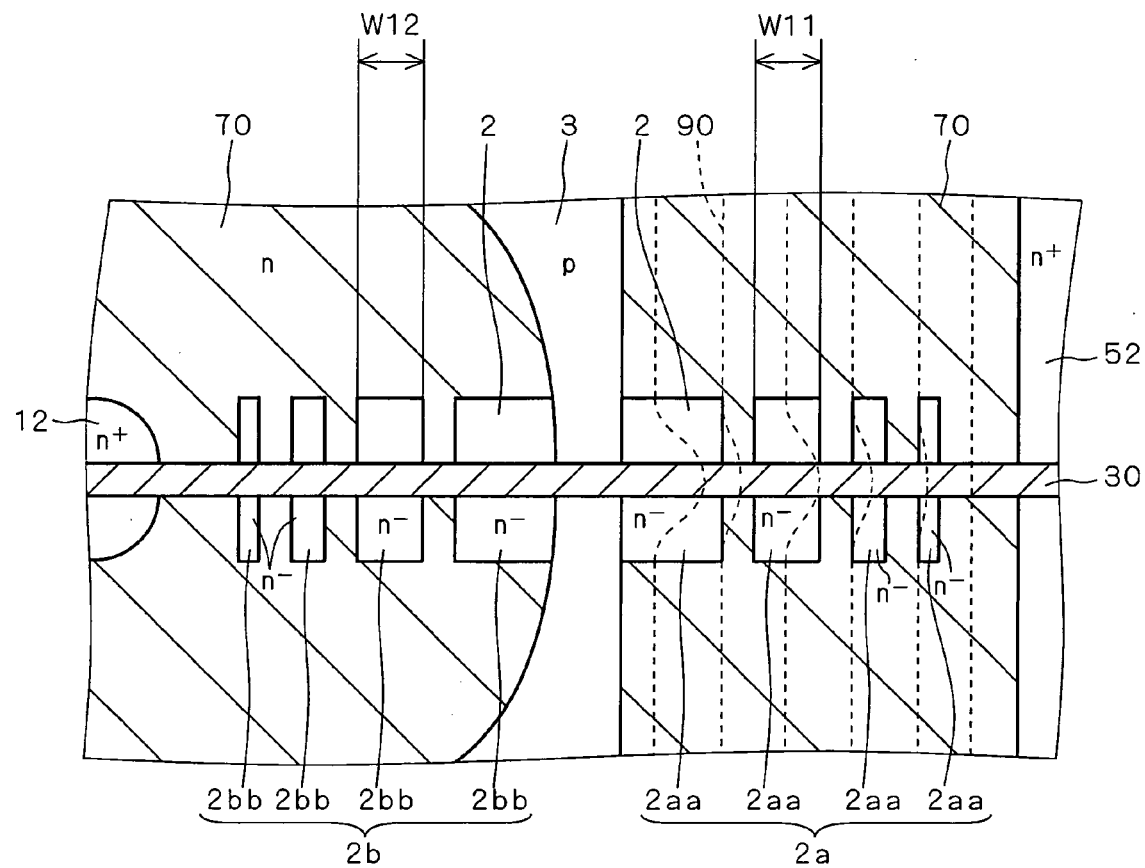
FIG. 45 is a plan view illustrating a configuration of a semiconductor device according to a ninth preferred embodiment of the present invention.

FIG. 45 is a plan view illustrating a configuration of a semiconductor device according to a ninth preferred embodiment of the present invention. The configuration of the semiconductor device according to the ninth preferred embodiment is such that, in the semiconductor device according to the aforementioned seventh preferred embodiment, the exposed portions 2a and 2b of the n− semiconductor layer 2 each are divided into a plurality of portions.

As shown in FIG. 45, the exposed portion 2a of the n− semiconductor layer 2 according to the ninth preferred embodiment is divided into a plurality of portions, i.e., includes a plurality of divided portions 2aa. The plurality of divided portions 2aa are spaced from one another along a direction from the p impurity region 3 to the n+ impurity region 52, under the interconnect line 30. When viewed in plan, widths W11 of the plurality of divided portions 2aa in the direction from the p impurity region 3 to the n+ impurity region 52 decrease as they are farther from the p impurity region 3 and closer to the n+ impurity region 52.

Further, the exposed portion 2b according to the ninth preferred embodiment is divided into a plurality of portions, i.e., includes a plurality of divided portions 2bb. The plurality of divided portions 2bb are spaced from one another along a direction from the p impurity region 3 to the n+ impurity region 12, under the interconnect line 30. When viewed in plan, widths W12 of the plurality of divided portions 2bb in the direction from the p impurity region 3 to the n+ impurity region 12 decrease as they are farther from the p impurity region 3 and closer to the n+ impurity region 12. The other part of the structure is identical to that of the semiconductor device according to the seventh preferred embodiment and thus not described here.

As described, since in the semiconductor device according to the ninth preferred embodiment, the widths W11 of the plurality of divided portions 2aa, which are exposed portions of the n− semiconductor layer 2 from the n diffusion region 70, decrease as they are closer to the n+ impurity region 52, the extension of a depletion layer in the plurality of divided portions 2aa can be controlled in the direction toward the n+ impurity region 52. This reduces electric field concentration between the p impurity region 3 and the n+ impurity region 52.

Also, since the widths W12 of the plurality of divided portions 2bb, which are exposed portions of the n− semiconductor layer 2 from the n diffusion region 70, decrease as they are closer to the n+ impurity region 12, the extension of a depletion layer in the plurality of divided portions 2bb can be controlled in the direction toward the n+ impurity region 12. This reduces electric field concentration between the p impurity region 3 and the n+ impurity region 12.

Tenth Preferred Embodiment

FIG. 46 is a cross-sectional view illustrating a configuration of a semiconductor device according to a tenth preferred embodiment of the present invention. The configuration of the semiconductor device according to the tenth preferred embodiment is such that, in the semiconductor device according to the aforementioned ninth preferred embodiment, the plurality of divided portions 2aa of the exposed portion 2a are located under the spaces between the first field plates 55a-55e; and the plurality of divided portions 2bb of the exposed portion 2b are located under the spaces between the first field plates 15a-15e. FIG. 46 shows a cross-sectional view at the location corresponding to the arrowed line A-A of FIG. 2.

As shown in FIG. 46, in the tenth preferred embodiment, the divided portions 2aa are provided under the spaces between the first field plates 55a and 55b, between the first field plates 55b and 55c, between the first field plates 55c and 55d, and between the first field plates 55d and 55e.

Also in the tenth preferred embodiment, the divided portions 2bb are provided under the spaces between the first field plates 15a and 15b, between the first field plates 15b and 15c, between the first field plates 15c and 15d, and between the first field plates 15d and 15e.

While, in the aforementioned ninth preferred embodiment, the widths W11 and W12 of the divided portions 2aa and 2bb respectively are set to decrease as they are farther from the p impurity region 3 and closer to the n+ impurity region 52 and 12, they each in the tenth preferred embodiment are set to be approximately equal to a distance of space between corresponding first field plates.

In this way, in the semiconductor device according to the tenth preferred embodiment, the plurality of divided portions 2aa, which are exposed portions of the n− semiconductor layer 2 from the n diffusion region 70, are located under the spaces between the first field plates 55a-55e. In the area between the p impurity region 3 and the n+ impurity region 52, the parts which are relatively strongly influenced by the potential of the interconnect line 30 are under the spaces between the first field plates 55a-55e; therefore, the provision of the divided portions 2aa where the extension of a depletion layer is facilitated, in those parts will reduce electric field concentration. This results in improved breakdown voltage.

Also in the tenth preferred embodiment, the plurality of divided portions 2bb, which are exposed portions of the n− semiconductor layer 2 from the n diffusion region 70, are located under the spaces between the first field plates 15a-15e. In the area between the p impurity region 3 and the n+ impurity region 12, the parts which are relatively strongly influenced by the potential of the interconnect line 30 are under the spaces between the first field plates 15a-15e; therefore, the provision of the divided portions 2bb where the extension of a depletion layer is facilitated, in those parts will reduce electric field concentration. This results in improved breakdown voltage.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate of a first conductivity type;
a semiconductor layer of a second conductivity type provided on said semiconductor substrate;
a first impurity region of said first conductivity type provided in said semiconductor layer, extending from an upper surface of said semiconductor layer to an interface with said semiconductor substrate, to define a predetermined region in said semiconductor layer;
a semiconductor element provided in said semiconductor layer outside said predetermined region; and
a MOS transistor provided in said semiconductor layer within said predetermined region,
said MOS transistor including:
a second impurity region of said second conductivity type provided in the upper surface of said semiconductor layer within said predetermined region and having a higher impurity concentration than said semiconductor layer; and
a drain electrode electrically connected to said second impurity region,
said semiconductor device further comprising:
a first insulation film provided on said semiconductor layer between said first impurity region and said second impurity region;
a plurality of first field plates spaced from one another on said first insulation film along a direction from said first impurity region to said second impurity region;
a second insulation film provided on said first insulation film to cover said plurality of first field plates;
a plurality of second field plates spaced from one another on said second insulation film along a direction from said first impurity region to said second impurity region;
a third insulation film provided on said second insulation film to cover said plurality of second field plates; and
an interconnect line provided on said third insulation film, passing over said plurality of first field plates and said plurality of second field plates, to provide electrical connection between said drain electrode and said semiconductor element, wherein
one of said plurality of first field plates which is closest to said first impurity region is a gate electrode of said MOS transistor;
said plurality of second field plates respectively are provided above spaces between said plurality of first field plates;
one of said plurality of second field plates which is closest to said gate electrode has a cut portion under said interconnect line; and
in one of the spaces between said plurality of first field plates which is located under said cut portion, an electrode is provided apart from said plurality of first field plates.

2. The semiconductor device according to claim 1, further comprising:
a first contact plug provided through said second insulation film to provide electrical connection between said gate electrode and one of said plurality of second field plates which is closest to said gate electrode; and
a second contact plug provided through said second insulation film to provide electrical connection between said electrode and one of said plurality of second field plates which is closest to said gate electrode.

3. A semiconductor device comprising:
a semiconductor substrate of a first conductivity type;
a semiconductor layer of a second conductivity type provided on said semiconductor substrate;
a first impurity region of said first conductivity type provided in said semiconductor layer, extending from an upper surface of said semiconductor layer to an interface with said semiconductor substrate, to define a predetermined region in said semiconductor layer;
a first semiconductor element provided in said semiconductor layer within said predetermined region;
a second impurity region of said second conductivity type provided in the upper surface of said semiconductor layer between said first semiconductor element and said first impurity region, within said predetermined region, and having a higher impurity concentration than said semiconductor layer;
a second semiconductor element provided in said semiconductor layer outside said predetermined region;
a first insulation film provided on said semiconductor layer between said first impurity region and said second impurity region;
a plurality of first field plates spaced from one another on said first insulation film along a direction from said first impurity region to said second impurity region;
a second insulation film provided on said first insulation film to cover said plurality of first field plates;
a plurality of second field plates spaced from one another on said second insulation film along a direction from said first impurity region to said second impurity region;
a third insulation film provided on said second insulation film to cover said plurality of second field plates; and
an interconnect line provided on said third insulation film, passing over said plurality of first field plates and said plurality of second field plates, to provide electrical connection between said first semiconductor element and said second semiconductor element, wherein
said plurality of second field plates respectively are provided above spaces between said plurality of first field plates;
one of said plurality of second field plates which is closest to said first impurity region has a cut portion under said interconnect line; and
in one of the spaces between said plurality of first field plates which is located under said cut portion, an electrode is provided apart from said plurality of first field plates.

4. A semiconductor device comprising:
a semiconductor substrate of a first conductivity type;
a semiconductor layer of a second conductivity type provided on said semiconductor substrate;
a first impurity region of said second conductivity type provided in an upper surface of said semiconductor layer to define a predetermined region in said semiconductor layer and having a higher impurity concentration than said semiconductor layer;
a second impurity region of said first conductivity type provided in said semiconductor layer, extending from the upper surface of said semiconductor layer to an interface with said semiconductor substrate, within said predetermined region;
a semiconductor element provided in said semiconductor layer outside said predetermined region; and
a MOS transistor provided in said semiconductor layer within said predetermined region, said MOS transistor including:
a third impurity region of said first conductivity type provided in the upper surface of said semiconductor layer between said first impurity region and said second impurity region, within said predetermined region; and
a drain electrode electrically connected to said third impurity region,
said semiconductor device further comprising:
a first insulation film provided on said semiconductor layer between said first impurity region and said third impurity region;
a plurality of first field plates spaced from one another on said first insulation film along a direction from said first impurity region to said third impurity region;
a second insulation film provided on said first insulation film to cover said plurality of first field plates;
a plurality of second field plates spaced from one another on said second insulation film along a direction from said first impurity region to said third impurity region;
a third insulation film provided on said second insulation film to cover said plurality of second field plates; and
an interconnect line provided on said third insulation film, passing over said plurality of first field plates and said plurality of second field plates, to provide electrical connection between said drain electrode and said semiconductor element, wherein
one of said plurality of first field plates which is closest to said first impurity region is a gate electrode of said MOS transistor;
said plurality of second field plates respectively are provided above spaces between said plurality of first field plates;
one of said plurality of second field plates which is closest to said gate electrode has a cut portion under said interconnect line; and
in one of the spaces between said plurality of first field plates which is located under said cut portion, an electrode is provided apart from said plurality of first field plates.

5. The semiconductor device according to claim 4, further comprising:
a first contact plug provided through said second insulation film to provide electrical connection between said gate electrode and one of said plurality of second field plates which is closest to said gate electrode; and
a second contact plug provided through said second insulation film to provide electrical connection between said electrode and one of said plurality of second field plates which is closest to said gate electrode.

6. A semiconductor device comprising:
a semiconductor substrate of a first conductivity type;
a semiconductor layer of a second conductivity type provided on said semiconductor substrate;
a first impurity region of said first conductivity type provided in said semiconductor layer, extending from an upper surface of said semiconductor layer to an interface with said semiconductor substrate, to define a predetermined region in said semiconductor layer;
a first semiconductor element provided in said semiconductor layer within said predetermined region;
a second impurity region of said second conductivity type provided in the upper surface of said semiconductor layer between said first semiconductor element and said first impurity region, within said predetermined region, and having a higher impurity concentration than said semiconductor layer;
a second semiconductor element provided in said semiconductor layer outside said predetermined region;
a first insulation film provided on said semiconductor layer between said first impurity region and said second impurity region;
a plurality of first field plates spaced from one another on said first insulation film along a direction from said first impurity region to said second impurity region;
a second insulation film provided on said first insulation film to cover said plurality of first field plates;
a plurality of second field plates spaced from one another on said second insulation film along a direction from said first impurity region to said second impurity region;
a third insulation film provided on said second insulation film to cover said plurality of second field plates; and
an interconnect line provided on said third insulation film, passing over said plurality of first field plates and said plurality of second field plates, to provide electrical connection between said first semiconductor element and said second semiconductor element, wherein
said plurality of second field plates respectively are provided above spaces between said plurality of first field plates;
one of said plurality of second field plates which is closest to said second impurity region has a cut portion under said interconnect line; and
in one of the spaces between said plurality of first field plates which is located under said cut portion, an electrode is provided apart from said plurality of first field plates.

7. A semiconductor device comprising:
a semiconductor substrate of a first conductivity type;
a semiconductor layer of a second conductivity type provided on said semiconductor substrate;
a first impurity region of said first conductivity type provided in said semiconductor layer, extending from an upper surface of said semiconductor layer to an interface with said semiconductor substrate, to define a predetermined region in said semiconductor layer;
a semiconductor element provided in said semiconductor layer outside said predetermined region; and
a MOS transistor provided in said semiconductor layer within said predetermined region,
said MOS transistor including:
a second impurity region of said second conductivity type provided in the upper surface of said semiconductor layer within said predetermined region and having a higher impurity concentration than said semiconductor layer; and
a drain electrode electrically connected to said second impurity region,
said semiconductor device further comprising:
a first insulation film provided on said semiconductor layer between said first impurity region and said second impurity region;
a plurality of first field plates spaced from one another on said first insulation film along a direction from said first impurity region to said second impurity region;
a second insulation film provided on said first insulation film to cover said plurality of first field plates;
a plurality of second field plates spaced from one another on said second insulation film along a direction from said first impurity region to said second impurity region;
a third insulation film provided on said second insulation film to cover said plurality of second field plates; and an interconnect line provided on said third insulation film, passing over said plurality of first field plates and said plurality of second field plates, to provide electrical connection between said drain electrode and said semiconductor element, wherein one of said plurality of first field plates which is closest to said first impurity region is a gate electrode of said MOS transistor;

said plurality of second field plates respectively are provided above spaces between said plurality of first field plates;

one of said plurality of second field plates which is closest to said gate electrode has a cut portion under said interconnect line; and out of said plurality of first field plates and said plurality of second field plates, except said gate electrode and one second field plate which is closest to said gate electrode, at least one first field plate which is located adjacent to said gate electrode has a portion under said interconnect line, at least one edge of which portion on the side of said gate electrode is shifted closer to said gate electrode than that edge of the other portion.

8. The semiconductor device according to claim 7, wherein said plurality of first field plates, except said gate electrode, include a plurality of third field plates each having a portion under said interconnect line, both edges of which portion are shifted closer to said gate electrode than those edges of the other portion; and said plurality of second field plates, except one second field plate which is closest to said gate electrode, include a plurality of fourth field plates each having a portion under said interconnect line, both edges of which portion are shifted closer to said gate electrode than those edges of the other portion.

9. A semiconductor device comprising:

a semiconductor substrate of a first conductivity type;

a semiconductor layer of a second conductivity type provided on said semiconductor substrate;

a first impurity region of said first conductivity type provided in said semiconductor layer, extending from an upper surface of said semiconductor layer to an interface with said semiconductor substrate, to define a predetermined region in said semiconductor layer;

a first semiconductor element provided in said semiconductor layer within said predetermined region;

a second impurity region of said second conductivity type provided in the upper surface of said semiconductor layer between said first semiconductor element and said first impurity region, within said predetermined region, and having a higher impurity concentration than said semiconductor layer;

a second semiconductor element provided in said semiconductor layer outside said predetermined region;

a first insulation film provided on said semiconductor layer between said first impurity region and said second impurity region;

a plurality of first field plates spaced from one another on said first insulation film along a direction from said first impurity region to said second impurity region;

a second insulation film provided on said first insulation film to cover said plurality of first field plates;

a plurality of second field plates spaced from one another on said second insulation film along a direction from said first impurity region to said second impurity region;

a third insulation film provided on said second insulation film to cover said plurality of second field plates; and an interconnect line provided on said third insulation film, passing over said plurality of first field plates and said plurality of second field plates, to provide electrical connection between said first semiconductor element and said second semiconductor element, wherein said plurality of second field plates respectively are provided above spaces between said plurality of first field plates;

one of said plurality of second field plates which is closest to said first impurity region has a cut portion under said interconnect line; and out of said plurality of first field plates and said plurality of second field plates, except one first field plate and one second field plate which are respectively closest to said first impurity region, at least one first field plate which is second-closest to said first impurity region has a portion under said interconnect line, at least one edge of which portion on the side of said first impurity region is shifted closer to said first impurity region than that edge of the other portion.

10. The semiconductor device according to claim 9, wherein said plurality of first field plates, except one first field plate which is closest to said first impurity region, include a plurality of third field plates each having a portion under said interconnect line, both edges of which portion are shifted closer to said first impurity region than those edges of the other portion; and said plurality of second field plates, except one second field plate which is closest to said first impurity region, include a plurality of fourth field plates each having a portion under said interconnect line, both edges of which portion are shifted closer to said first impurity region than those edges of the other portion.

11. A semiconductor device comprising:

a semiconductor substrate of a first conductivity type;

a semiconductor layer of a second conductivity type provided on said semiconductor substrate;

a first impurity region of said second conductivity type provided in an upper surface of said semiconductor layer to define a predetermined region in said semiconductor layer and having a higher impurity concentration than said semiconductor layer;

a second impurity region of said first conductivity type provided in said semiconductor layer, extending from the upper surface of said semiconductor layer to an interface with said semiconductor substrate, within said predetermined region;

a semiconductor element provided in said semiconductor layer outside said predetermined region; and a MOS transistor provided in said semiconductor layer within said predetermined region, said MOS transistor including:

a third impurity region of said first conductivity type provided in the upper surface of said semiconductor layer between said first impurity region and said second impurity region, within said predetermined region; and a drain electrode electrically connected to said third impurity region, said semiconductor device further comprising:

a first insulation film provided on said semiconductor layer between said first impurity region and said third impurity region;

a plurality of first field plates spaced from one another on said first insulation film along a direction from said first impurity region to said third impurity region;

a second insulation film provided on said first insulation film to cover said plurality of first field plates;

a plurality of second field plates spaced from one another on said second insulation film along a direction from said first impurity region to said third impurity region;

a third insulation film provided on said second insulation film to cover said plurality of second field plates; and an interconnect line provided on said third insulation film, passing over said plurality of first field plates and said plurality of second field plates, to provide electrical connection between said drain electrode and said semiconductor element, wherein one of said plurality of first field plates which is closest to said first impurity region is a gate electrode of said MOS transistor;

said plurality of second field plates respectively are provided above spaces between said plurality of first field plates;

one of said plurality of second field plates which is closest to said gate electrode has a cut portion under said interconnect line; and out of said plurality of first field plates and said plurality of second field plates, except said gate electrode and one second field plate which is closest to said gate electrode, at least one first field plate which is located adjacent to said gate electrode has a portion under said interconnect line, at least one edge of which portion on the side of said gate electrode is shifted closer to said gate electrode than that edge of the other portion.

12. The semiconductor device according to claim 11, wherein said plurality of first field plates, except said gate electrode, include a plurality of third field plates each having a portion under said interconnect line, both edges of which portion are shifted closer to said gate electrode than those edges of the other portion; and said plurality of second field plates, except one second field plate which is closest to said gate electrode, include a plurality of fourth field plates each having a portion under said interconnect line, both edges of which portion are shifted closer to said gate electrode than those edges of the other portions.

13. A semiconductor device comprising:

a semiconductor substrate of a first conductivity type;

a semiconductor layer of a second conductivity type provided on said semiconductor substrate;

a first impurity region of said first conductivity type provided in said semiconductor layer, extending from an upper surface of said semiconductor layer to an interface with said semiconductor substrate, to define a predetermined region in said semiconductor layer;

a first semiconductor element provided in said semiconductor layer within said predetermined region;

a second impurity region of said second conductivity type provided in the upper surface of said semiconductor layer between said first semiconductor element and said first impurity region, within said predetermined region, and having a higher impurity concentration than said semiconductor layer;

a second semiconductor element provided in said semiconductor layer outside said predetermined region;

a first insulation film provided on said semiconductor layer between said first impurity region and said second impurity region;

a plurality of first field plates spaced from one another on said first insulation film along a direction from said first impurity region to said second impurity region;

a second insulation film provided on said first insulation film to cover said plurality of first field plates;

a plurality of second field plates spaced from one another on said second insulation film along a direction from said first impurity region to said second impurity region;

a third insulation film provided on said second insulation film to cover said plurality of second field plates; and an interconnect line provided on said third insulation film, passing over said plurality of first field plates and said plurality of second field plates, to provide electrical connection between said first semiconductor element and said second semiconductor element, wherein said plurality of second field plates respectively are provided above spaces between said plurality of first field plates;

one of said plurality of second field plates which is closest to said second impurity region has a cut portion under said interconnect line; and out of said plurality of first field plates and said plurality of second field plates, except one first field plate and one second field plate which are respectively closest to said second impurity region, at least one first field plate which is second-closest to said second impurity region has a portion under said interconnect line, at least one edge of which portion on the side of said second impurity region is shifted closer to said second impurity region than that edge of the other portion.

14. The semiconductor device according to claim 13, wherein said plurality of first field plates, except one first field plate which is closest to said second impurity region, include a plurality of third field plates each having a portion under said interconnect line, both edges of which portion are shifted closer to the side of said second impurity region than those edges of the other portion; and said plurality of second field plates, except one second field plate which is closest to said second impurity region, include a plurality of fourth field plates each having a portion under said interconnect line, both edges of which portion are shifted closer to the side of said second impurity region than those edges of the other portion.

15. A semiconductor device comprising:

a semiconductor substrate of a first conductivity type;

an epitaxial layer of a second conductivity type provided on said semiconductor substrate;

a first impurity region of said first conductivity type provided in said epitaxial layer, extending from an upper surface of said epitaxial layer to an interface with said semiconductor substrate, to define a predetermined region in said epitaxial layer; and a MOS transistor provided in said epitaxial layer within said predetermined region, said MOS transistor including:

a second impurity region of said second conductivity type provided in the upper surface of said epitaxial layer within said predetermined region and having a higher impurity concentration than said epitaxial layer; and a drain electrode electrically connected to said second impurity region, said semiconductor device further comprising:
a diffusion region of said second conductivity type provided in the upper surface of said epitaxial layer at least between said first impurity region and said second impurity region and having a higher impurity concentration than said epitaxial layer.

16. A semiconductor device comprising:
a semiconductor substrate of a first conductivity type;
an epitaxial layer of a second conductivity type provided on said semiconductor substrate;
a first impurity region of said first conductivity type provided in said epitaxial layer, extending from an upper surface of said epitaxial layer to an interface with said semiconductor substrate, to define a predetermined region in said epitaxial layer;
a first semiconductor element provided in said epitaxial layer within said predetermined region;
a second impurity region of said second conductivity type provided in the upper surface of said epitaxial layer between said first semiconductor element and said first impurity region, within said predetermined region, and having a higher impurity concentration than said epitaxial layer; and
a diffusion region of said second conductivity type provided in the upper surface of said epitaxial layer at least between said first impurity region and said second impurity region and having a higher impurity concentration than said epitaxial layer.

17. The semiconductor device according to claim 15, further comprising:
a semiconductor element provided in said epitaxial layer outside said predetermined region; and
an interconnect line passing over said first impurity region to provide electrical connection between said drain electrode and said semiconductor element,
wherein said epitaxial layer between said first impurity region and said second impurity region has an exposed portion which is exposed from said diffusion region under said interconnect line.

18. The semiconductor device according to claim 16, further comprising:
a second semiconductor element provided in said epitaxial layer outside said predetermined region; and
an interconnect line passing over said first impurity region to provide electrical connection between said first semiconductor element and said second semiconductor element,
wherein said epitaxial layer between said first impurity region and said second impurity region has an exposed portion which is exposed from said diffusion region under said interconnect line.

* * * * *